United States Patent

(12) United States Patent
Maejima et al.

(10) Patent No.: US 11,264,106 B2
(45) Date of Patent: Mar. 1, 2022

(54) SEMICONDUCTOR MEMORY DEVICE INCLUDING MEMORY CELLS AT OPPOSING SIDES OF SEMICONDUCTOR

(71) Applicant: Kioxia Corporation, Tokyo (JP)

(72) Inventors: Hiroshi Maejima, Tokyo (JP); Hidehiro Shiga, Yokohama Kanagawa (JP); Masaki Kondo, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/016,580

(22) Filed: Sep. 10, 2020

(65) Prior Publication Data

US 2021/0158876 A1 May 27, 2021

(30) Foreign Application Priority Data

Nov. 26, 2019 (JP) .............................. JP2019-213262

(51) Int. Cl.
| | |
|---|---|
| *G11C 16/06* | (2006.01) |
| *G11C 16/26* | (2006.01) |
| *H01L 27/11556* | (2017.01) |
| *G11C 16/04* | (2006.01) |
| *G11C 16/34* | (2006.01) |
| *H01L 27/11582* | (2017.01) |
| *G11C 16/10* | (2006.01) |

(52) U.S. Cl.
CPC .......... *G11C 16/26* (2013.01); *G11C 16/0483* (2013.01); *G11C 16/34* (2013.01); *H01L 27/11556* (2013.01); *H01L 27/11582* (2013.01); *G11C 16/10* (2013.01)

(58) Field of Classification Search
CPC ..... G11C 16/26; G11C 16/0483; G11C 16/34; G11C 16/10; G11C 16/32; G11C 11/5642; G11C 16/08; H01L 27/11556; H01L 27/11582; H01L 27/11565
USPC ..................................................... 365/185.21
See application file for complete search history.

(56) References Cited

U.S. PATENT DOCUMENTS

| | | |
|---|---|---|
| 9,202,750 B2 | 12/2015 | Chen |
| 2016/0268277 A1 | 9/2016 | Nagashima |
| 2018/0090220 A1* | 3/2018 | Minagawa ......... G11C 16/3459 |
| 2018/0277226 A1* | 9/2018 | Tokutomi .............. G11C 16/26 |
| 2020/0005878 A1* | 1/2020 | Lu ....................... G11C 11/5671 |
| 2020/0091175 A1 | 3/2020 | Maejima |
| 2020/0303400 A1* | 9/2020 | Arai .................. G11C 16/0483 |

(Continued)

FOREIGN PATENT DOCUMENTS

JP 2020047320 A 3/2020

*Primary Examiner* — Tha-O H Bui
(74) *Attorney, Agent, or Firm* — Holtz, Holtz & Volek PC

(57) ABSTRACT

A semiconductor memory device includes separate first and second word lines respectively facing first and second portions of a semiconductor and sandwiching the semiconductor; and first and second cell transistors respectively located in the first and second portions and respectively coupled to the first and second word lines. In a first operation, a first read is executed on the second cell transistor while a first voltage and a higher second voltage are being respectively applied to the first and second word lines. In a second operation, a second read is executed on the first cell transistor while a third voltage between the first and second voltages is being applied to the second word line.

20 Claims, 67 Drawing Sheets

(56) References Cited

U.S. PATENT DOCUMENTS

2020/0335513 A1 10/2020 Morozumi et al.
2020/0357469 A1* 11/2020 Joe .......................... H01L 24/83

* cited by examiner

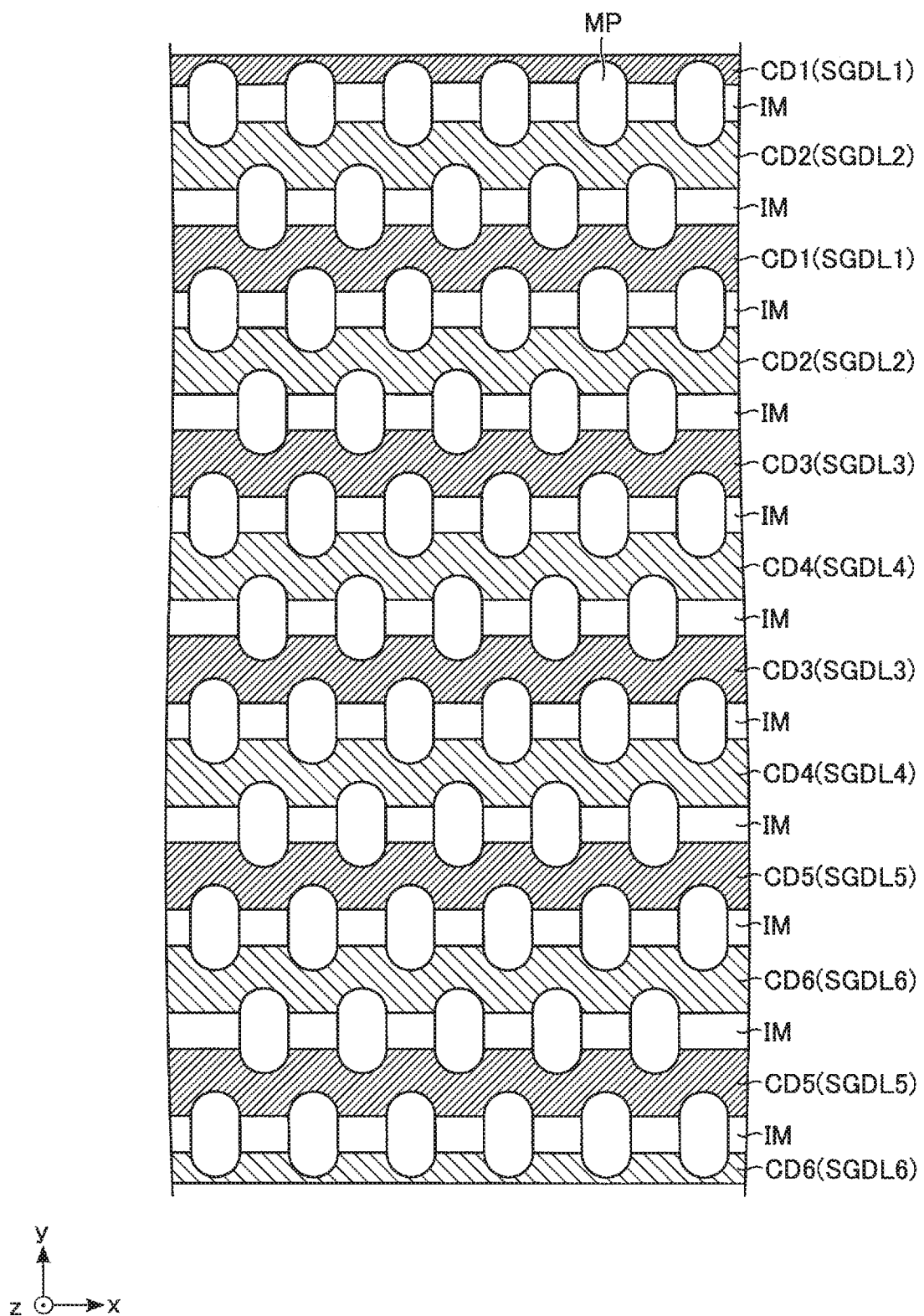
F I G. 3

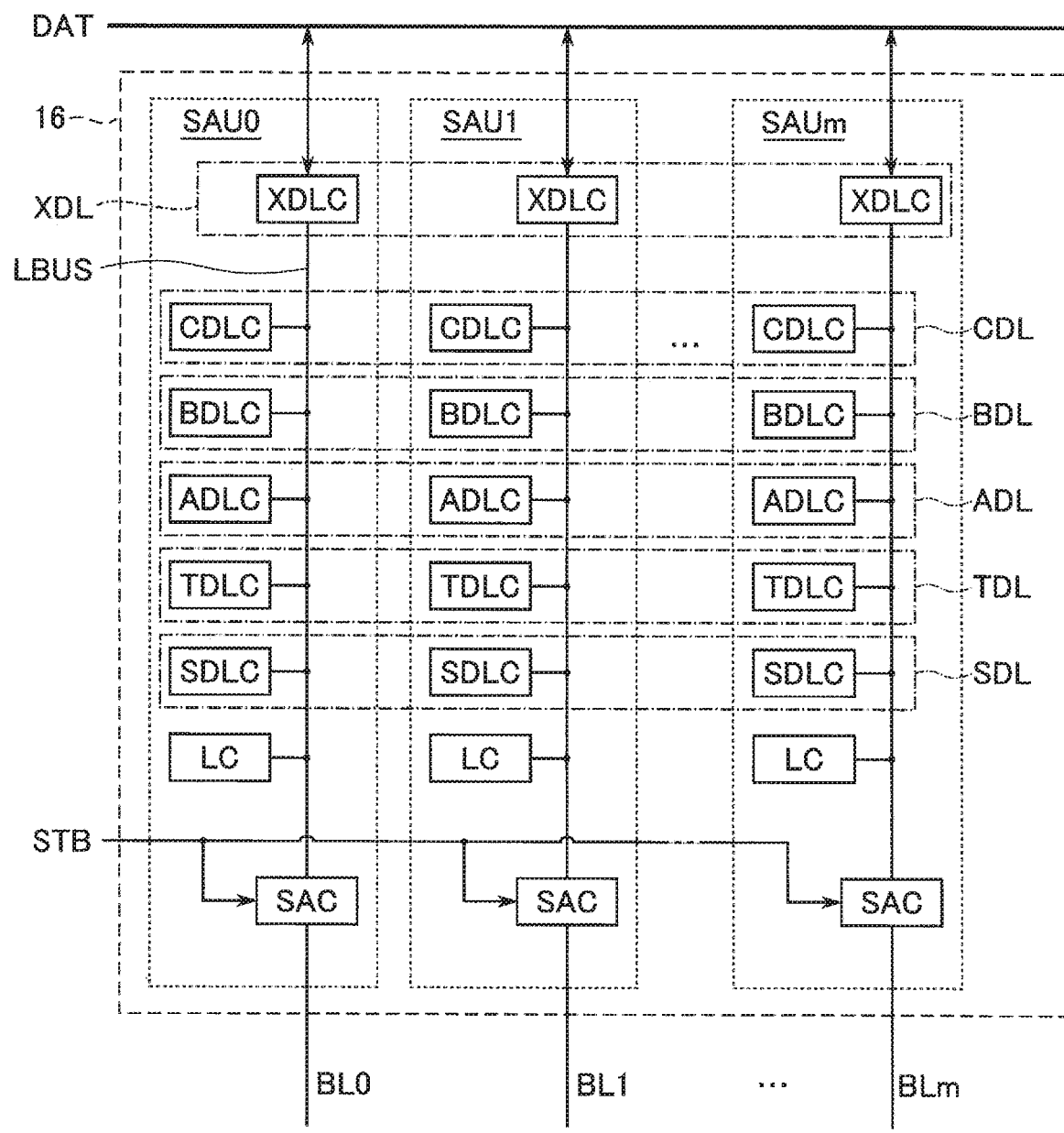
F I G. 8

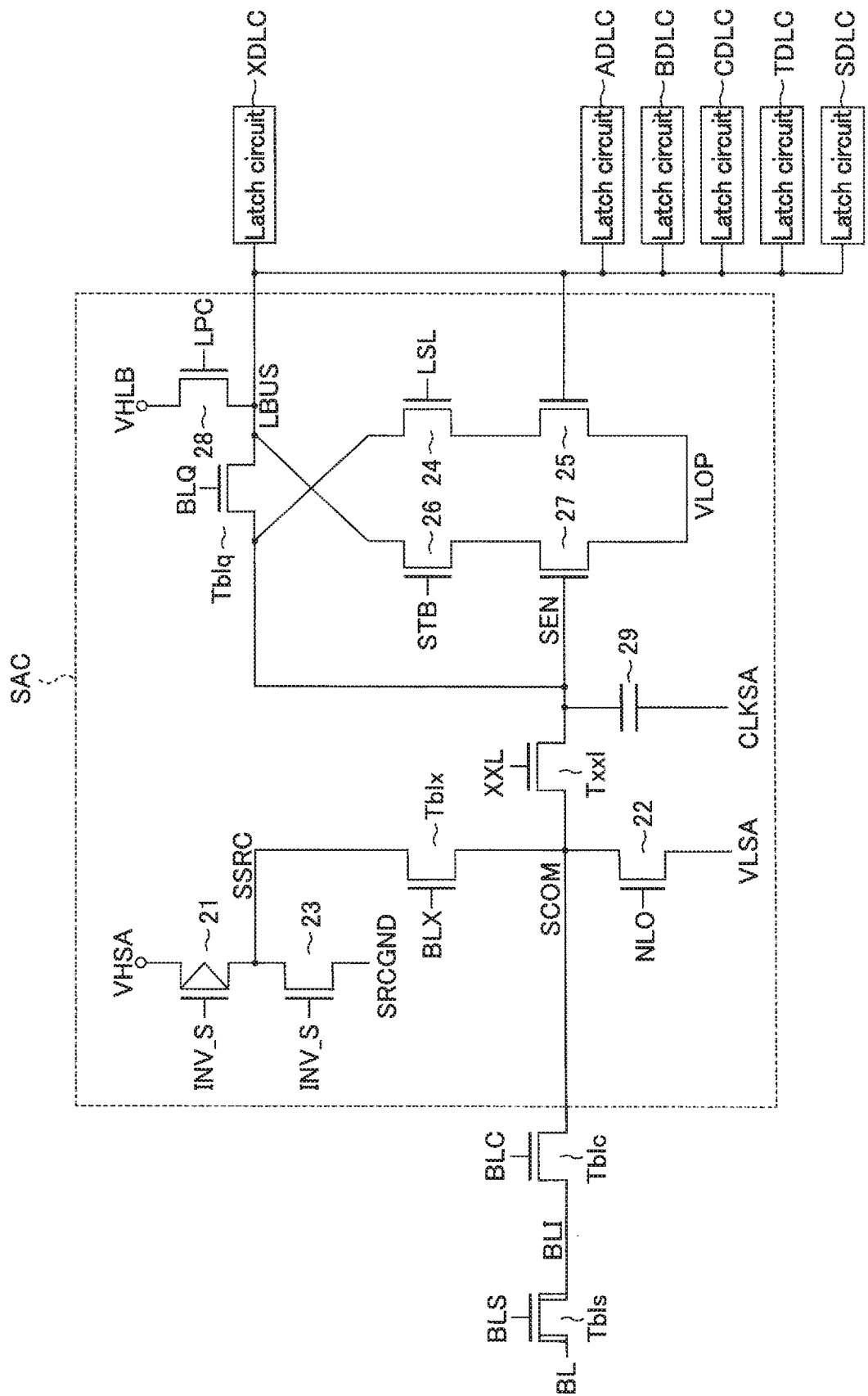
F I G. 9

¯SDL=SEN

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 1 | 0 | 1 | 1 | 0 | 0 | 1 | 1 | 0 | 0 | 1 | 1 | 0 | 0 |
| ADL | 0 | 0 | 0 | 0 | 0 | 0 | 0 | 0 | 0 | 0 | 0 | 0 | 0 | 0 | 0 | 0 |
| TDL | 0 | 0 | 0 | 0 | 0 | 0 | 0 | 0 | 0 | 0 | 0 | 0 | 0 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 1 | 1 | 1 | 1 | 1 | 1 | 1 | 1 | 1 | 1 | 1 | 1 | 1 | 1 | 1 | 1 |

F I G. 13

Execution of BR
WLbs voltage = VCL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 0 | 0 | 0 | 1 |
| BDL | 1 | 1 | 1 | 0 | 1 | 1 | 1 | 0 | 1 | 1 | 0 | 0 | 1 | 1 | 0 | 0 |
| ADL | 0 | 0 | 0 | 0 | 0 | 1 | 0 | 0 | 0 | 1 | 0 | 0 | 0 | 1 | 0 | 0 |
| TDL | 0 | 0 | 0 | 0 | 0 | 0 | 0 | 0 | 0 | 0 | 0 | 0 | 0 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0 | 0 | 0 | 0 | 0 | 0 | 1/0 | 1/0 | 1/0 | 1 | 1/0 | 1/0 | 1/0 | 1 |

FIG. 14

SEN==¯TDL
CDL&(¯BDL)&(¯TDL)==ADL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 0 | 0 | 0 | 0 | 0 | 0 | 0 | 0 | 0 | 0 | 0 | 0 |
| TDL | 1 | 1 | 1 | 1 | 1 | 1 | 1 | 1 | 0/1 | 0/1 | 0/1 | 0 | 0/1 | 0/1 | 0/1 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0 | 0 | 0 | 0 | 0 | 0 | 1/0 | 1/0 | 1/0 | 1 | 1/0 | 1/0 | 1/0 | 1 |

F I G. 15

SDL=SEN

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 0 | 1 | 0 | 0 | 0 | 0 | 1 | 0 | 0 | 0 | 0 | 1 |
| TDL | 1 | 1 | 1 | 1 | 0 | 1 | 1 | 1 | 0/1 | 0/1 | 0/1 | 0 | 0/1 | 0/1 | 0/1 | 0 |
| SDL | 0 | 0 | 0 | 0 | 0 | 0 | 0 | 0 | 0 | 0 | 0 | 0 | 0 | 0 | 0 | 0 |
| SEN | 1 | 1 | 1 | 1 | 1 | 1 | 1 | 1 | 1 | 1 | 1 | 1 | 1 | 1 | 1 | 1 |

F I G. 16

Execution of BR
WLbs voltage = VBL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 1 | 0 | 0 | 0 | 1 | 0 | 0 | 0 | 1 | 0 | 0 | 0 | 1 |
| TDL | 1 | 1 | 1 | 1 | 1 | 1 | 1 | 1 | 0/1 | 0/1 | 0/1 | 0 | 0/1 | 0/1 | 0/1 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0 | 0/1 | 0 | 0 | 0 | 0/1 | 1/0 | 1/0 | 1/0 | 1 | 1/0 | 1/0 | 1 | 1 |

FIG. 17

SEN = ¬TDL
((¬CDL) & (¬BDL) & (¬TDL)) | ADL = ADL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 0 | 0 | 0 | 1 | 0 | 0 | 1 | 0 | 0 | 1 | 0 | 1 |
| BDL | 1 | 1 | 0 | 0 | 1 | 0 | 0 | 0 | 1 | 1 | 0 | 0 | 1 | 0 | 0 | 0 |
| ADL | 0 | 0 | 0 | 0 | 0 | 1 | 1 | 0 | 0 | 0 | 1 | 1 | 0 | 0 | 1 | 1 |
| TDL | 1 | 1 | 1 | 1/0 | 1 | 1 | 0 | 1/0 | 0/1 | 0/1 | 0 | 0 | 0 | 0/1 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0 | 0/1 | 0 | 0 | 0 | 0/1 | 1/0 | 1/0 | 1 | 1 | 1/0 | 1/0 | 0 | 1 |

F I G. 18

−SDL=SEN

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 0 | 0 | 0 | 1 | 0 | 0 | 1 | 1 | 0 | 0 | 1 | 1 |
| TDL | 1 | 1 | 1 | 1/0 | 1 | 1 | 1 | 1/0 | 0/1 | 0/1 | 0 | 0 | 0/1 | 0/1 | 0 | 0 |
| SDL | 0 | 0 | 0 | 0 | 0 | 0 | 0 | 0 | 0 | 0 | 0 | 0 | 0 | 0 | 0 | 0 |
| SEN | 1 | 1 | 1 | 1 | 1 | 1 | 1 | 1 | 1 | 1 | 1 | 1 | 1 | 1 | 1 | 1 |

F I G. 19

Execution of BR
WLbs voltage = VAL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 1 | 0 | 1 | 1 | 1 | 0 | 1 | 1 | 1 | 0 | 1 | 1 | 1 | 0 | 1 |
| BDL | 1 | 0 | 0 | 0 | 1 | 0 | 0 | 0 | 1 | 0 | 0 | 0 | 1 | 0 | 0 | 0 |
| ADL | 0 | 0 | 0 | 0 | 0 | 1 | 0 | 0 | 0 | 1 | 0 | 0 | 0 | 1 | 0 | 0 |
| TDL | 1 | 1 | 1 | 1/0 | 1 | 1 | 1 | 1/0 | 1 | 0/1 | 0/1 | 0 | 0 | 0/1 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0/1 | 0/1 | 0/1 | 0 | 0/1 | 0/1 | 1/0 | 1/0 | 1 | 1 | 1 | 1/0 | 1 | 1 | 1 |

F I G. 20

SEN==⁻TDL
((⁻CDL)&(BDL)&(⁻TDL))|ADL==ADL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 1 | 0 | 1 | 1 | 1 | 0 | 1 | 1 | 1 | 0 | 1 | 1 | 1 | 0 |
| ADL | 0 | 0 | 0 | 0 | 0 | 0 | 0 | 0 | 0 | 0 | 0 | 0 | 0 | 0 | 0 | 0 |
| TDL | 1 | 1 | 1/0 | 1/0 | 1 | 1 | 1/0 | 1/0 | 0 | 0 | 0/1 | 0/1 | 0 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0/1 | 0/1 | 0 | 0 | 0/1 | 0/1 | 1 | 1 | 1/0 | 1/0 | 1 | 1 | 1 | 1 |

F I G. 21

‾SDL=SEN

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 1 | 0 | 0 | 0 | 1 | 0 | 0 | 1 | 1 | 1 | 0 | 1 | 1 | 0 |
| TDL | 1 | 1 | 1/0 | 1/0 | 1 | 1/0 | 1/0 | 1/0 | 1 | 0 | 1 | 0 | 0/1 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 1 | 1 | 1 | 1 | 1 | 1 | 1 | 1 | 1 | 1 | 1 | 1 | 1 | 1 | 1 | 1 |

F I G. 22

Execution of BR
WLbs voltage = VBBL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| GDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 0 | 0 | 0 | 0 | 0 | 0 | 0 | 0 | 0 | 0 | 0 | 0 |
| TDL | 1 | 1 | 1/0 | 1/0 | 1 | 1 | 1/0 | 1/0 | 1 | 1 | 0/1 | 0/1 | 0 | 0/1 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0/1 | 0/1 | 0/1 | 0 | 0/1 | 0/1 | 0/1 | 1 | 1 | 1 | 1 | 1 | 1 | 1 | 1 |

FIG. 23

SEN==~TDL
((CDL)&(BDL)&(~TDL))|ADL==ADL

| Selected memory cell transistor | Er | Er | Er | Er | A | A | A | A | B | B | B | B | C | C | C | C |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 0 | 0 | 0 | 0 | 1 | 1 | 1 | 1 | 1 | 1 | 1 | 1 |
| TDL | 1 | 1/0 | 1/0 | 1/0 | 1 | 1/0 | 1/0 | 1/0 | 0 | 0 | 0 | 0 | 0 | 0 | 0 | 0 |
| SDL | 0 | 0 | 0 | 0 | 0 | 0 | 0 | 0 | 1 | 1 | 1 | 1 | 1 | 1 | 1 | 1 |
| SEN | 0 | 0/1 | 0/1 | 0/1 | 0 | 0/1 | 0/1 | 0/1 | 1 | 1 | 0 | 0 | 1 | 1 | 0 | 1 |

F I G. 24

*ADL=XDL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 1 | 1 | 1 | 1 | 1 | 1 | 1 | 1 | 0 | 0 | 0 | 0 | 0 | 0 | 0 | 0 |
| CDL | 1 | 0 | 1 | 1 | 1 | 0 | 1 | 1 | 1 | 0 | 1 | 1 | 1 | 0 | 1 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 1 | 1 | 1 | 1 | 0 | 0 | 0 | 0 | 1 | 1 | 1 | 1 |
| TDL | 1 | 1/0 | 1/0 | 1/0 | 1 | 1/0 | 1/0 | 1/0 | 0 | 0 | 0 | 0 | 0 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0/1 | 0/1 | 0/1 | 0 | 0/1 | 0/1 | 0/1 | 1 | 1 | 1 | 1 | 1 | 1 | 1 | 1 |

F I G. 25

Execution of AR
WLbs voltage = VCL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 0 | 0 | 0 | 0 | 0 | 0 | 0 | 0 | 0 | 0 | 0 | 0 |
| TDL | 0 | 0 | 0 | 0 | 0 | 0 | 0 | 0 | 0 | 0 | 0 | 0 | 0 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0 | 0 | 1/0 | 1/0 | 1/0 | 1 | 1/0 | 1/0 | 1/0 | 1 | 1/0 | 1/0 | 1/0 | 1 |

F I G. 26

SEN=¯TDL
CDL&(¯BDL)&(¯TDL)=ADL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 0 | 0 | 0 | 1 | 1 | 0 | 0 | 1 | 0 | 1 | 0 | 0 |
| TDL | 1 | 1 | 1 | 1 | 0/1 | 0/1 | 0/1 | 0 | 0/1 | 0/1 | 0/1 | 0 | 0/1 | 0/1 | 0/1 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0 | 0 | 1/0 | 1/0 | 1/0 | 1 | 1/0 | 1/0 | 1/0 | 1 | 1/0 | 1/0 | 1/0 | 1 |

F I G. 27

¬SDL==SEN

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 1 | 0 | 0 | 0 | 1 | 0 | 0 | 0 | 1 | 0 | 0 | 0 | 1 |
| TDL | 1 | 1 | 1 | 1 | 0/1 | 0/1 | 0/1 | 0 | 0/1 | 0/1 | 0/1 | 0 | 0/1 | 0/1 | 0/1 | 0 |
| SDL | 0 | 0 | 0 | 0 | 0 | 0 | 0 | 0 | 0 | 0 | 0 | 0 | 0 | 0 | 0 | 0 |
| SEN | 1 | 1 | 1 | 1 | 1 | 1 | 1 | 1 | 1 | 1 | 1 | 1 | 1 | 1 | 1 | 1 |

FIG. 28

Execution of AR
WLbs voltage = VBL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 1 | 0 | 1 | 1 | 1 | 0 | 1 | 1 | 1 | 0 | 1 | 1 | 1 | 0 |
| ADL | 0 | 0 | 0 | 0 | 0 | 0 | 0 | 0 | 0 | 0 | 0 | 0 | 0 | 0 | 0 | 0 |
| TDL | 1 | 1 | 1 | 1 | 0/1 | 0/1 | 0/1 | 0 | 0/1 | 0/1 | 0/1 | 0 | 0/1 | 0/1 | 0/1 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0 | 0/1 | 1/0 | 1/0 | 1 | 1 | 1/0 | 1/0 | 1 | 1 | 1/0 | 1/0 | 1 | 1 |

F I G. 29

SEN = ~TDL
((~CDL)&(~BDL)&(~TDL))|ADL==ADL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 1 | 0 | 0 | 0/1 | 1 | 1 | 1 | 0/1 | 1 | 1 | 0 | 0/1 | 0 | 0 |
| TDL | 1 | 1 | 1 | 1/0 | 0/1 | 0/1 | 0 | 0 | 0/1 | 0/1 | 0 | 0 | 0/1 | 0/1 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0 | 0/1 | 1/0 | 1/0 | 1 | 1 | 1/0 | 1/0 | 1 | 1 | 1/0 | 1/0 | 1 | 1 |

FIG. 30

SDL=SEN

| Selected memory cell transistor | Er | | | | | | A | | | | | | B | | | | | | C | | | | | |
|---|---|---|---|---|---|---|---|---|---|---|---|---|---|---|---|---|---|---|---|---|---|---|---|---|
| Back side memory cell transistor | Er | A | B | C | Er | A | B | C | Er | A | B | C | Er | A | B | C | Er | A | B | C | | | | |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 0 | 0 | 1 | 0 | 0 | 0 | 1 | 0 | 0 | 0 | 1 | 0 |
| TDL | 1 | 1 | 1 | 1/0 | 0/1 | 0/1 | 0 | 0 | 0/1 | 0/1 | 0 | 0 | 0/1 | 0/1 | 0 | 0 |
| SDL | 0 | 0 | 0 | 0 | 0 | 0 | 0 | 0 | 0 | 0 | 0 | 0 | 0 | 0 | 0 | 0 |
| SEN | 1 | 1 | 1 | 1 | 1 | 1 | 1 | 1 | 1 | 1 | 1 | 1 | 1 | 1 | 1 | 1 |

F I G. 31

Execution of AR
WLbs voltage = VAL

| Selected memory cell transistor | Er | Er | | | | A | | | | B | | | | C | | | |
|---|---|---|---|---|---|---|---|---|---|---|---|---|---|---|---|---|---|
| Back side memory cell transistor | Er | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 | 0 |
| CDL | 1 | 1 | 0 | 0 | 0 | 1 | 0 | 0 | 0 | 1 | 0 | 0 | 0 | 1 | 0 | 0 | 0 |
| BDL | 1 | 1 | 1 | 0 | 0 | 1 | 1 | 0 | 0 | 1 | 1 | 0 | 0 | 1 | 1 | 0 | 0 |
| ADL | 0 | 0 | 0 | 1 | 0 | 0 | 1 | 1 | 1 | 0 | 1 | 1 | 1 | 0 | 1 | 1 | 1 |
| TDL | 1 | 0/1 | 1 | 0 | 1/0 | 0/1 | 0/1 | 0 | 0 | 0/1 | 0 | 1 | 0 | 0/1 | 0 | 1 | 0 |
| SDL | 0 | 0 | 0 | 0 | 0 | 0 | 0 | 0 | 0 | 0 | 0 | 0 | 0 | 0 | 0 | 0 | 0 |
| SEN | 0 | 0/1 | 0 | 1 | 0/1 | 1/0 | 1 | 1 | 1 | 1/0 | 1 | 1 | 1 | 1/0 | 1 | 1 | 1 |

F I G. 32

SEN=~TDL
((~CDL)&(BDL)&(~TDL))|ADL==ADL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 1 | 1 | 0 | 0 | 1 | 1 | 0 | 0 | 1 | 1 | 0 | 0 | 1 | 1 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 1 | 1 | 1 | 1 | 1 | 1 | 1 | 1 | 1 | 1 | 1 | 1 |
| TDL | 1 | 1 | 1/0 | 0/1 | 0/1 | 0 | 0 | 0 | 0/1 | 0 | 0 | 0 | 0/1 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0/1 | 1/0 | 1/0 | 0 | 0 | 1 | 1/0 | 0 | 0 | 1 | 1/0 | 0 | 0 | 1 |

FIG. 33

‾SDL==SEN

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 0 | 1 | 0 | 0 | 1 | 1 | 0 | 0 | 1 | 1 | 0 | 0 |
| ADL | 0 | 0 | 0 | 1 | 0 | 1 | 1 | 1 | 0 | 1 | 1 | 1 | 0 | 1 | 1 | 0 |
| TDL | 1 | 1 | 1/0 | 1/0 | 0/1 | 0 | 0 | 0 | 0/1 | 0 | 0 | 0 | 0/1 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 1 | 1 | 1 | 1 | 1 | 1 | 1 | 1 | 1 | 1 | 1 | 1 | 1 | 1 | 1 | 1 |

F I G. 34

Execution of AR
WLbs voltage = VBBL

| Selected memory cell transistor | | Er | | | | A | | | | B | | | | C | | | |
|---|---|---|---|---|---|---|---|---|---|---|---|---|---|---|---|---|---|
| Back side memory cell transistor | | Er | A | B | C | Er | A | B | C | Er | A | B | C | Er | A | B | C |
| XDL | | 0 | 0 | 0 | 0 | 0 | 0 | 0 | 0 | 0 | 0 | 0 | 0 | 0 | 0 | 0 | 0 |
| CDL | | 1 | 0 | 0 | 1 | 1 | 0 | 0 | 1 | 1 | 0 | 0 | 1 | 1 | 0 | 0 | 1 |
| BDL | | 1 | 1 | 0 | 0 | 1 | 1 | 0 | 0 | 1 | 1 | 0 | 0 | 1 | 1 | 0 | 0 |
| ADL | | 0 | 0 | 0 | 0 | 0 | 1 | 1 | 1 | 0 | 1 | 1 | 1 | 0 | 1 | 1 | 1 |
| TDL | | 1 | 1 | 1/0 | 1/0 | 0/1 | 0 | 0 | 0 | 0 | 0/1 | 0 | 0 | 0 | 0 | 0/1 | 0 |
| SDL | | 0 | 0 | 0 | 0 | 0 | 0 | 0 | 0 | 0 | 0 | 0 | 0 | 0 | 0 | 0 | 0 |
| SEN | | 0 | 0/1 | 0/1 | 0/1 | 1 | 1 | 1 | 1 | 1 | 1 | 1 | 1 | 1 | 1 | 1 | 1 |

F I G. 35

SEN=¬TDL
((CDL)&(BDL)&(¬TDL))|ADL==ADL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 0 | 0 | 0 | 0 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 1 | 1 | 1 | 1 | 0 | 0 | 0 | 0 | 1 | 1 | 1 | 1 |
| TDL | 1 | 1/0 | 1/0 | 1/0 | 0 | 0 | 0 | 0 | 1 | 0 | 0 | 0 | 0 | 0 | 0 | 0 |
| SDL | 0 | 0 | 0 | 0 | 1 | 1 | 1 | 1 | 0 | 0 | 0 | 0 | 1 | 1 | 1 | 1 |
| SEN | 0 | 0/1 | 0/1 | 0/1 | 1 | 1 | 1 | 1 | 0 | 1 | 1 | 1 | 1 | 1 | 1 | 1 |

FIG. 36

¯ADL=XDL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 1 | 1 | 1 | 1 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 1 | 1 | 1 | 1 | 1 | 1 | 1 | 1 | 1 | 1 | 1 | 1 |
| TDL | 1 | 1/0 | 1/0 | 1/0 | 0 | 0 | 0 | 0 | 0 | 0 | 0 | 0 | 1 | 1 | 1 | 1 |
| SDL | 0 | 0 | 0 | 0 | 0 | 0 | 0 | 0 | 0 | 0 | 0 | 0 | 0 | 0 | 0 | 0 |
| SEN | 0 | 0/1 | 0/1 | 0/1 | 1 | 0 | 0 | 1 | 0 | 0 | 0 | 1 | 1 | 1 | 1 | 1 |

F I G. 37

$\overline{O}$=TDL
$\overline{O}$=ADL
$\overline{SDL}$=SEN

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 1 | 1 | 1 | 1 | 0 | 0 | 1 | 0 | 0 | 0 | 1 | 0 | 0 | 0 | 1 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 0 | 0 | 0 | 0 | 0 | 0 | 0 | 0 | 0 | 0 | 0 | 0 |
| TDL | 0 | 0 | 0 | 0 | 0 | 0 | 0 | 0 | 0 | 0 | 0 | 0 | 0 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 1 | 1 | 1 | 1 | 1 | 1 | 1 | 1 | 1 | 1 | 1 | 1 | 1 | 1 | 1 | 1 |

F I G. 38

Execution of CR
WLbs voltage = VCL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 1 | 1 | 1 | 1 | 0 | 0 | 0 | 0 | 0 | 0 | 0 | 0 | 0 | 0 | 0 | 0 |
| CDL | 1 | 0 | 0 | 1 | 1 | 1 | 0 | 1 | 1 | 1 | 0 | 1 | 1 | 1 | 0 | 1 |
| BDL | 1 | 1 | 0 | 0 | 1 | 1 | 0 | 0 | 0 | 0 | 0 | 0 | 0 | 0 | 0 | 0 |
| ADL | 0 | 0 | 0 | 0 | 0 | 0 | 0 | 0 | 0 | 0 | 0 | 0 | 0 | 0 | 0 | 0 |
| TDL | 0 | 0 | 0 | 0 | 0 | 0 | 0 | 0 | 0 | 0 | 0 | 0 | 0 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0 | 0 | 0 | 0 | 0 | 0 | 0 | 0 | 0 | 0 | 1/0 | 1/0 | 1/0 | 1 |

F I G. 39

SEN=¯TDL
CDL&(¯BDL)&(¯TDL)=ADL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 1 | 1 | 1 | 1 | 0 | 0 | 0 | 0 | 0 | 0 | 0 | 0 | 0 | 0 | 0 | 0 |
| CDL | 1 | 0 | 0 | 1 | 1 | 1 | 0 | 1 | 1 | 1 | 0 | 1 | 0 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 0 | 0 | 0 | 0 | 0 | 0 | 0 | 0 | 0 | 0 | 0 | 0 |
| TDL | 1 | 1 | 1 | 1 | 1 | 1 | 1 | 1 | 1 | 1 | 1 | 1 | 0/1 | 0/1 | 0/1 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0 | 0 | 0 | 0 | 0 | 0 | 0 | 0 | 0 | 0 | 1/0 | 1/0 | 1/0 | 1 |

F I G. 40

~SDL==SEN

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 1 | 1 | 1 | 1 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 0 | 1 | 0 | 0 | 0 | 0 | 1 | 0 | 0 | 0 | 0 | 1 |
| TDL | 1 | 1 | 1 | 1 | 1 | 1 | 1 | 1 | 1 | 1 | 1 | 1 | 0/1 | 0/1 | 0/1 | 0/1 |
| SDL | 0 | 0 | 0 | 0 | 0 | 0 | 0 | 0 | 0 | 0 | 0 | 0 | 0 | 0 | 0 | 0 |
| SEN | 1 | 1 | 1 | 1 | 1 | 1 | 1 | 1 | 1 | 1 | 1 | 1 | 1 | 1 | 1 | 1 |

F I G. 41

Execution of CR
WLbs voltage = VBL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 1 | 1 | 1 | 1 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 0 | 1 | 0 | 0 | 0 | 1 | 0 | 0 | 0 | 1 | 0 | 0 |
| TDL | 1 | 0 | 1 | 1 | 0 | 1 | 1 | 1 | 1 | 0 | 1 | 0 | 0/1 | 0 | 0 | 1 |
| SDL | 0 | 0 | 0 | 0 | 0 | 0 | 0 | 0 | 0 | 0 | 0 | 1 | 0 | 0 | 0 | 0 |
| SEN | 0 | 0 | 0 | 0/1 | 0 | 0 | 0 | 0/1 | 0 | 0 | 0 | 0/1 | 1/0 | 1/0 | 1 | 1 |

FIG. 42

SEN=¯TDL
((¯CDL)&(¯BDL)&(¯TDL))|ADL==ADL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 1 | 1 | 1 | 1 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 0 | 0 | 0 | 0 | 0 | 0 | 0 | 0 | 0 | 0 | 0 | 0 |
| TDL | 1 | 1 | 1 | 1/0 | 1 | 1 | 1 | 1/0 | 1 | 1 | 1 | 1/0 | 0/1 | 0/1 | 0 | 0/1 |
| SDL | 0 | 0 | 0 | 0 | 0 | 0 | 0 | 0 | 0 | 0 | 0 | 0 | 0 | 0 | 0 | 0 |
| SEN | 0 | 0 | 0 | 0/1 | 0 | 0 | 0 | 0/1 | 0 | 0 | 0 | 0/1 | 1/0 | 1/0 | 1 | 1/0 |

FIG. 43

$\overline{SDL}$ = SEN

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 1 | 1 | 1 | 1 | 0 | 0 | 0 | 0 | 0 | 0 | 0 | 0 | 0 | 0 | 0 | 0 |
| CDL | 1 | 0 | 1 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 0 | 0 | 0 |
| ADL | 0 | 0 | 0 | 0 | 0 | 0 | 1 | 0 | 0 | 1 | 0 | 0 | 1 | 1 | 0 | 0 |
| TDL | 1 | 1 | 1 | 1/0 | 1 | 1 | 1 | 1/0 | 1 | 1 | 1 | 1/0 | 0/1 | 0/1 | 0 | 0 |
| SDL | 0 | 0 | 0 | 0 | 0 | 0 | 0 | 0 | 0 | 0 | 0 | 0 | 0 | 0 | 0 | 0 |
| SEN | 1 | 1 | 1 | 1 | 1 | 1 | 1 | 1 | 1 | 1 | 1 | 1 | 1 | 1 | 1 | 1 |

F I G. 44

Execution of CR
WLbs voltage = VAL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 1 | 1 | 1 | 1 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 0 | 0 | 1 | 0 | 0 | 0 | 1 | 0 | 0 | 0 | 1 | 0 |
| TDL | 1 | 1 | 1 | 1/0 | 1 | 1 | 1 | 1/0 | 1 | 1 | 1 | 1/0 | 1 | 0/1 | 0/1 | 0/1 |
| SDL | 0 | 0 | 0 | 0 | 0 | 0 | 0 | 0 | 0 | 0 | 0 | 0 | 0 | 0 | 0 | 0 |
| SEN | 0 | 0 | 0/1 | 0/1 | 0 | 0 | 0/1 | 0/1 | 0 | 0/1 | 0/1 | 0/1 | 1/0 | 1 | 1 | 1 |

F I G. 45

SEN=~TDL
((~CDL)&(BDL)&(~TDL))|ADL==ADL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 1 | 1 | 1 | 1 | 0 | 0 | 0 | 0 | 0 | 0 | 0 | 0 | 0 | 0 | 0 | 0 |
| CDL | 1 | 0 | 0 | 1 | 0 | 0 | 0 | 1 | 0 | 0 | 0 | 1 | 0 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 0 | 0 | 0 | 0 | 0 | 0 | 0 | 0 | 0 | 0 | 0 | 0 |
| TDL | 1 | 1 | 1/0 | 1/0 | 1 | 1 | 1/0 | 1/0 | 1 | 1 | 1/0 | 1/0 | 0 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0 | 0/1 | 0/1 | 0 | 0 | 0/1 | 0/1 | 0 | 0 | 0/1 | 0/1 | 1 | 1 | 1 | 1 |

FIG. 46

⎺SDL==SEN

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 1 | 1 | 1 | 1 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 1 | 1 | 1 | 1 | 0 | 0 | 0 | 0 | 1 | 1 | 1 | 1 |
| TDL | 1 | 1 | 1/0 | 1/0 | 1 | 1 | 1/0 | 1/0 | 1 | 1 | 1/0 | 1/0 | 1 | 1 | 0 | 0/1 |
| SDL | 0 | 0 | 0 | 0 | 0 | 0 | 0 | 0 | 0 | 0 | 0 | 0 | 0 | 0 | 0 | 0 |
| SEN | 1 | 1 | 1 | 1 | 1 | 1 | 1 | 1 | 1 | 1 | 1 | 1 | 1 | 1 | 1 | 1 |

F I G. 47

Execution of CR
WLbs voltage = VBBL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 1 | 1 | 1 | 1 | 0 | 0 | 0 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 1 | 1 | 1 | 1 | 0 | 0 | 0 | 0 | 1 | 1 | 1 | 1 |
| TDL | 1 | 1 | 1/0 | 1/0 | 1 | 1 | 1/0 | 1/0 | 1 | 1 | 1/0 | 1/0 | 0/1 | 0/1 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0/1 | 0/1 | 0/1 | 0 | 0/1 | 0/1 | 0/1 | 0 | 0/1 | 0/1 | 0/1 | 1 | 1 | 1 | 1 |

FIG. 48

SEN=~TDL
((CDL)&(BDL)&(~TDL))|ADL==ADL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 1 | 1 | 1 | 1 | 0 | 0 | 1 | 0 | 0 | 0 | 0 | 0 | 0 | 0 | 0 | 0 |
| CDL | 1 | 0 | 0 | 1 | 1 | 0 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 0 | 0 | 0 | 0 | 1 | 1 | 1 | 1 | 1 | 1 | 1 | 1 |
| TDL | 1 | 1/0 | 1/0 | 1/0 | 1 | 1/0 | 1/0 | 1/0 | 0 | 1/0 | 1/0 | 1/0 | 0 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0/1 | 0/1 | 0/1 | 0 | 0/1 | 0/1 | 0/1 | 1 | 0/1 | 0/1 | 0/1 | 1 | 1 | 1 | 1 |

F I G. 49

ADL|XDL=XDL

| Selected memory cell transistor | Er | | | | A | | | | B | | | | C | | | |
|---|---|---|---|---|---|---|---|---|---|---|---|---|---|---|---|---|
| Back side memory cell transistor | Er | A | B | C | Er | A | B | C | Er | A | B | C | Er | A | B | C |
| XDL | 1 | 1 | 1 | 1 | 0 | 0 | 0 | 0 | 0 | 0 | 0 | 0 | 1 | 1 | 1 | 1 |
| CDL | 1 | 0 | 0 | 1 | 1 | 1 | 0 | 1 | 1 | 0 | 0 | 1 | 1 | 0 | 0 | 1 |
| BDL | 1 | 1 | 0 | 0 | 1 | 1 | 0 | 0 | 1 | 1 | 0 | 0 | 1 | 1 | 0 | 0 |
| ADL | 0 | 0 | 0 | 0 | 1 | 1 | 1 | 1 | 0 | 0 | 0 | 0 | 1 | 1 | 1 | 1 |
| TDL | 1 | 1/0 | 1/0 | 1/0 | 1 | 1/0 | 1/0 | 1/0 | 1 | 1/0 | 1/0 | 1/0 | 0 | 0 | 0 | 0 |
| SDL | 0 | 0 | 0 | 0 | 0 | 0 | 0 | 0 | 0 | 0 | 0 | 0 | 0 | 0 | 0 | 0 |
| SEN | 0 | 0/1 | 0/1 | 0/1 | 0 | 0/1 | 0/1 | 0/1 | 0 | 0/1 | 0/1 | 0/1 | 1 | 1 | 1 | 1 |

F I G. 50

SEMICONDUCTOR MEMORY DEVICE INCLUDING MEMORY CELLS AT OPPOSING SIDES OF SEMICONDUCTOR

CROSS-REFERENCE TO RELATED APPLICATIONS

This application is based upon and claims the benefit of priority from Japanese Patent Application No. 2019-213262, filed Nov. 26, 2019, the entire contents of which are incorporated herein by reference.

FIELD

Embodiments described herein relate generally to a semiconductor memory device

BACKGROUND

There is known a semiconductor memory device having memory cells arranged in three dimensions.

BRIEF DESCRIPTION OF THE DRAWINGS

FIG. 3 shows how a structure of one layer of part of a memory cell array of the first embodiment is in an xy plane.

FIG. 8 shows components and connections in a sense amplifier of the first embodiment, FIG. 9 is an exemplary circuit diagram of a sense amplifier circuit of the first embodiment.

FIG. 13 to FIG. 25 sequentially show how data latch states are during a certain operation of the semiconductor memory device of the first embodiment.

FIG. 26 to FIG. 50 sequentially show how data latch states are during a certain operation of the semiconductor memory device of the first embodiment.

DETAILED DESCRIPTION

Figure 1:
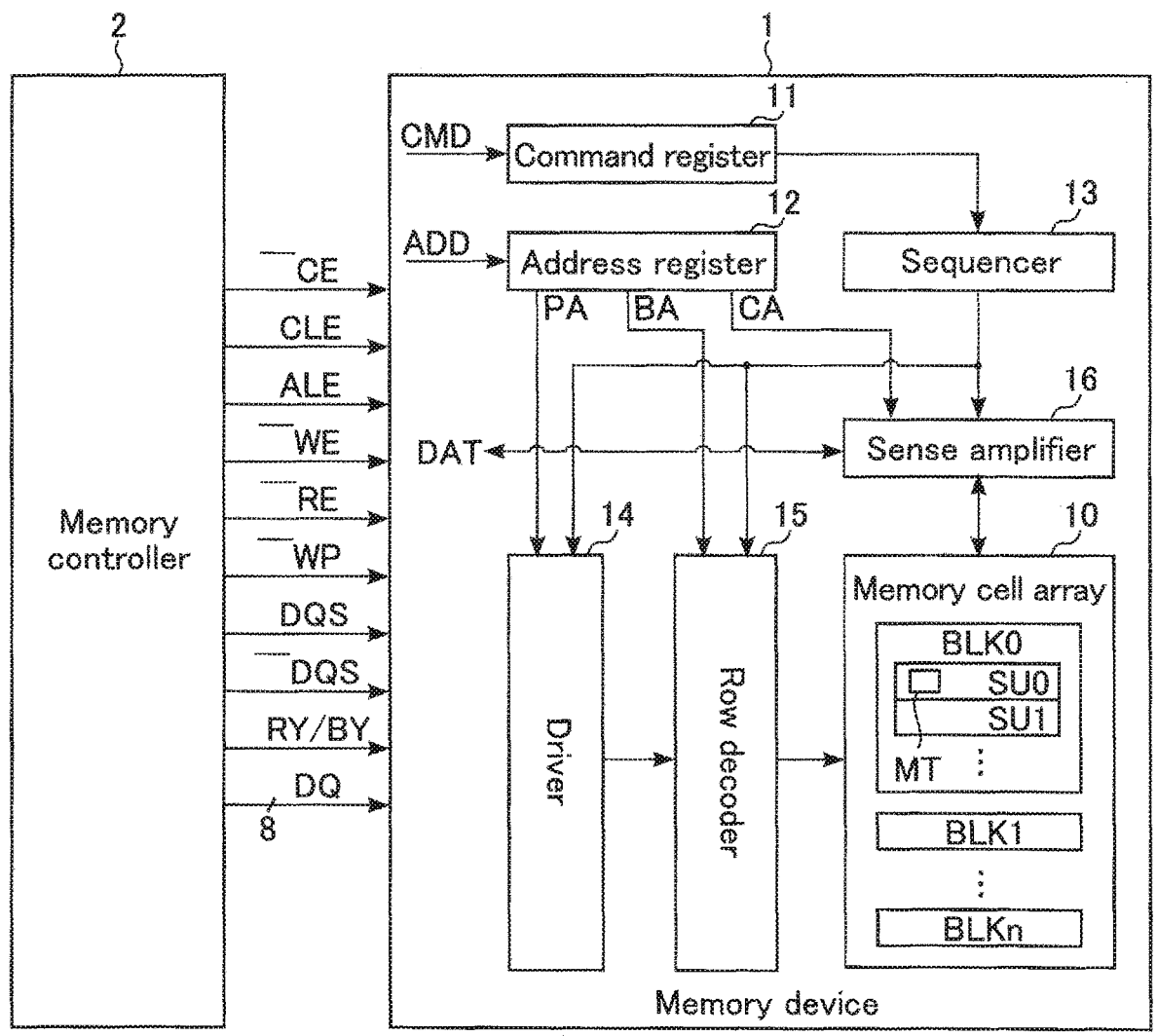
FIG. 1 shows components and connections in a semiconductor memory device of the first embodiment along with shows related components.

In general, according to one embodiment, a semiconductor memory device includes: a semiconductor including a first portion and a second portion; a first word line facing the first portion of the semiconductor; a second word line facing the second portion of the semiconductor; a first cell transistor; and a second cell transistor. The second word line sandwiches the semiconductor with the first word line, and is separate from the first word line. The first cell transistor is located in the first portion of the semiconductor and coupled to the first word line. The second cell transistor is located in the second portion of the semiconductor and coupled to the second word line. In a first operation, a first read is executed in which data based on a threshold voltage of the second cell transistor is acquired while a first voltage is being applied to the first word line and a second voltage higher than the first voltage is being applied to the second word line. In a second operation, a second read is executed in which data, based on a threshold voltage of the first cell transistor is acquired while a third voltage higher than the first voltage and lower than the second voltage is being applied to the second word line.

Embodiments will now be described with reference to the Figures. In the description below, components with substantially the same functions and configurations will be referred to with the same reference numerals. In order to distinguish components having substantially the same function and configuration from each other, an additional numeral or letter may be added to the end of each, reference numerals.

The Figures are schematic, and the relations between the thickness and the area of a plane of a layer and ratios of thicknesses of layers may differ from actual products. The Figures may include components which differ in relations and/or ratios of dimensions in different Figures. Moreover, the entire description for a particular embodiment also applies to other embodiments unless explicitly mentioned otherwise or obviously eliminated.

In the specification and the claims, a phrase of a particular first component being "coupled" to another second component includes the first component being coupled to the second component either directly or via one or more components which are always or selectively conductive.

In the description below, the term "below" as well as terms derived therefrom and terms related thereto refer to a position having a smaller coordinate on the z-axis, and the term "above" as well as terms derived therefrom and terms related thereto refer to a position having a larger coordinate on the z-axis.

First Embodiment 1.1. Structure (Configuration)

FIG. 1 shows components and connections in a semiconductor memory device 1 of the first embodiment along with related components. As shown in FIG. 1, the semiconductor memory device 1 is controlled by a memory controller 2. The memory controller 2 receives an instruction from a host device (not shown) and controls the semiconductor memory device 1 based on the received instruction.

The semiconductor memory device 1 is coupled to the memory controller 2 via a NAND bus. The NAND bus transmits a plurality of control signals and an input/output signal DQ having a width of 8 bits. The control signals include signals ⁻CE, CLE, BLE, ⁻WE, ⁻RE and ⁻WP, data strobe signals DQS and ⁻DQS and a ready/busy signal RY/BY. The symbol "⁻" indicates inversion logic. The semiconductor memory device 1 receives and transmits the input/output signal DQ. The input/output signal DQ includes a command (CMD), write data or read data (DAT), address information (BDD) and a status (STB).

Signal ⁻CE is a signal for enabling the semiconductor memory device 1. Signal CLE notifies the semiconductor memory device 1 that a command is transmitted by the input/output signal DQ. Signal ALE notifies the semiconductor memory device 1 that an address signal is transmitted by the input/output signal DQ. Signal WE instructs the semiconductor memory device 1 to receive the input/output signal DQ. Signal ⁻RE instructs the semiconductor memory device 1 to output the input/output signal DQ. The ready/busy signal RY/BY indicates whether the semiconductor memory device 1 is in a ready state or a busy state, and indicates a busy state when it is at a low level. The semiconductor memory device 1 accepts a command when it is in the ready state, and does not accept the command when it is in the busy state.

The semiconductor memory device 1 includes such components as a memory cell array 10, a command register 11, an address register 12, a sequencer 13, a driver 14, a row decoder 15 and a sense amplifier 16.

The memory cell array 10 includes a plurality of memory blocks BLK (BLK0, BLK1, . . . ). Each block BLK is a set of a plurality of string units SU (SU0, SU1, . . . ). Each string unit SU is a set of HAND strings NS (not shown). Each NAND string NS includes a plurality of memory cell transistors MT.

The command register 11 holds command GMD received by the memory controller 2. The command CMD instructs the sequencer 13 to perform various operations including data read, data write and data erase.

The address register 12 holds address information ADD received by the memory controller 2. The address information ADD includes, for example, a block address BA, a page address PA and a column address CA. The block address BA, the page address PA and the column address CA are used to select a block BLK, a word line WL and a bit line BL, respectively.

The sequencer 13 controls the overall operation, of the semiconductor memory device 1. The sequencer 13 controls the driver 14, the row decoder 15 and the sense amplifier 16 based on the command CMD received from the command register 11 to perform various operations including data read, data write and data erase.

The driver 14 generates various potentials necessary for the operation of the semiconductor memory device 1 and supplies selected ones of the generated potentials to the row decoder 15.

The row decoder 15 transfers potentials from the driver 14 to one block BLK that is selected based on the block address BA received from the address register 12.

The sense amplifier 16 senses the states of the memory cell transistors MT, generates read data based on the sensed state, or transfers write data to the memory cell transistors MT.

<1.1.2. Memory Cell Array>

Figure 2:
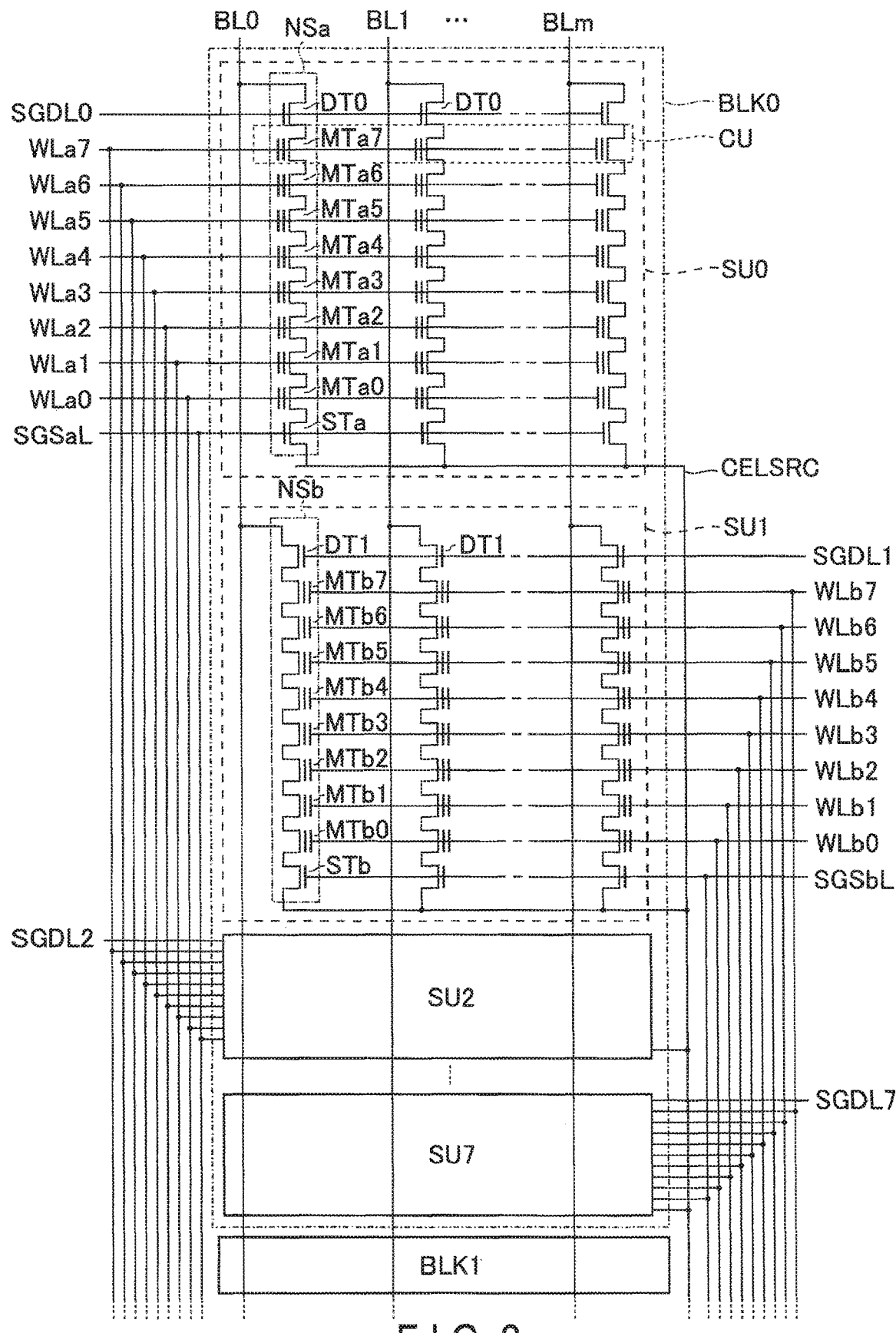
FIG. 2 shows an example of some components and connections in one block of the first embodiment.

FIG. 2 is a circuit diagram of part of the memory cell array 10 of the first embodiment, and shows components and connections in one block BLK0 along with related components. A plurality of (e.g., all) blocks BLK each include the components and connections shown in FIG. 2.

One block BLK includes a plurality of (for example, eight) string units SU (SU0 to SU7).

In each block BLK, each of m+1 (m: a natural number) bit lines BL0 to BLm is coupled to one NAND string NS of each of the string units SU0 to SU7. The plurality of NAND strings NS respectively coupled to the different bit lines BL constitute one string unit SU.

In each case of value α (α is an even number), the NAND string NSa in string unit SUα includes one select gate transistor STa, a plurality of (for example, eight) memory cell transistors MTa (MTa0 to MTa7) and one select gate transistor DTa (DTa0 to DTa7 (not shown in part)). Select gate transistor STa, memory cell transistors MTa0 to MTa7 and select gate transistor DTa are coupled in series in this order between the source line CELSRC and one bit line BL, and constitute a NAND string NSa. Memory cell transistor MT includes a control gate electrode (word line WL) and a charge storage layer insulated from the surroundings, and can store data in a nonvolatile manner based on the amount of charges in the charge storage layer.

In each case of value α, the control gate electrodes of the memory cell transistors MTa0 to MTa7 in the string unit SUα are coupled to the word lines WLa0 to WLa7, respectively. A set of memory cell transistors MT sharing a word line WL in one string unit SU is referred to as a cell unit CU.

In each case of value α, select gate transistor DTa belongs to string unit SUα. In each case of value α, the gates of select gate transistors DTa of the NAND strings NSa in the string unit SUα are coupled to select gate line SCDLα.

In each case of value β (β is an odd number), the NAND string NSβ in string unit SUβ includes one select gate transistor STb, a plurality (for example, eight) memory cell transistors MTb (MTb0 to MTb7) and one select gate transistor DTb (DTb0 to DTb7 (not shown in part)). Select gate transistor STb, memory cell transistors MTb and select gate transistor DTb are coupled in series in this order between the source line CELSRC and one bit line BL, and constitutes a NAND string NSb.

In each case of value β, the control gate electrodes of the memory cell transistors MTb0 to MTb7 in the string unit SUβ are coupled to word lines WLb0 to WLb7, respectively.

In each case of value β, select gate transistor DTβ belongs to string unit SUβ. In each case of value β, the gates of select gate transistors DTβ of the NAND strings NSb in the string unit SUβ are coupled to select gate line SGDLβ.

FIG. 3 shows how a structure of one layer of part of the memory cell array of the first embodiment is in the xy plane. As shown in FIG. 3, a plurality of conductors CD (CD1 to CD6) are provided. Each of the conductors CD1 to CD6 includes two portions. In each case of value γ (γ is a natural number), the two portions of conductor CDγ are coupled to each other in a region different from the region shown in FIG. 3. In each case of value γ, each of the two portions of conductor CDγ may be referred to as conductor portion CDγ.

Conductor portions CD1 to CD7 extend along the x-axis. In each case of value γ, one of conductor portions CDγ, one of conductor portions CD(γ+1), the other one of conductor portions CDγ, and the other one of the conductor portions CD(γ+1) are arranged in this order along the y axis. In each case of value γ, conductor CDγ functions as select gate line SGDLγ.

Each pair of two conductor portions CD arranged along the y-axis sandwich isolation insulator IM therebetween. The isolation insulator IM spreads in the xz plane.

In the same row as each isolation insulator IM, a plurality of memory pillars MP are arranged along the x axis. Each memory pillar MP has a columnar shape extending along the z axis. Each memory pillar MP extends over the two conductor portions CD on both sides along the y-axis of the memory pillar MP and partially in contact with the two conductor portions CD. The respective coordinates on the x-axis of the plurality of memory pillars MP in a certain first row of the isolation insulator IM are different from the respective coordinates on the x-axis of the memory pillars MP in the adjacent second row of the isolation insulator IM. For example, the coordinates on the x-axis (x-axis coordinates) of each memory pillar MP in the first row of the isolation insulator IM are intermediate between x-axis coordinates of two adjacent memory pillars MP in the second row of the isolation insulator IM.

Figure 4:
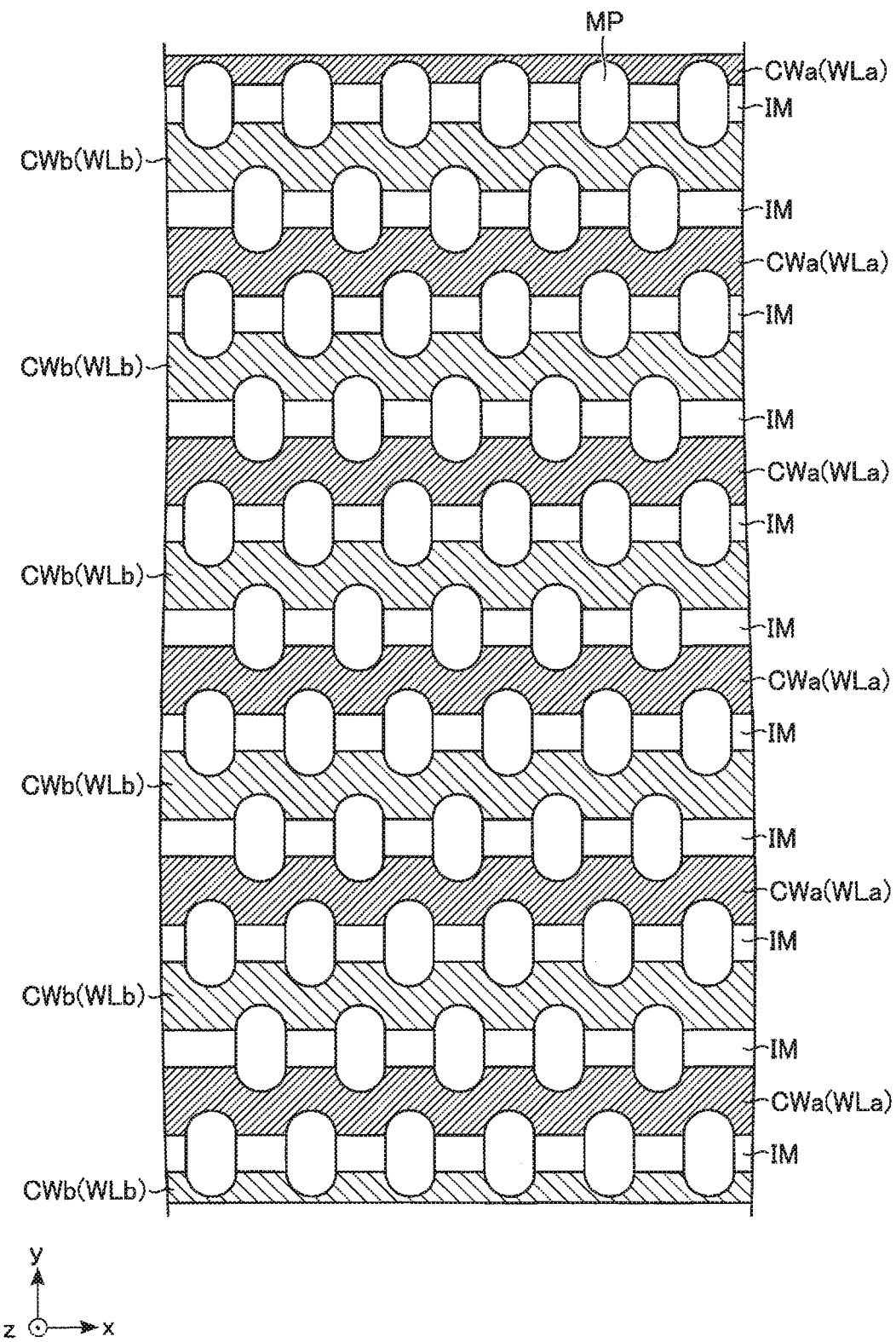
FIG. 4 shows how a structure of one layer of part of the memory cell array of the first embodiment is in the xy plane.

FIG. 4 shows how a structure of one layer of part of the memory cell array of the first embodiment is in the xy plane. FIG. 4 shows the same region as that shown in FIG. 3 and shows how the structure is in the layer below the layer shown in FIG. 3. The same structure as that shown in FIG. 4 is provided in a layer located at each of different coordinates on the z axis.

As shown in FIG. 4, a plurality of conductors CW (CWa and CWb) are provided. The conductor CWa includes a plurality of portions each extending along the x-axis. Each of the portions of conductor CWa may be referred to as conductor portion CWa. All conductor portions CWa are coupled to each other in a region other than the region shown in FIG. 4.

The conductor CWb includes a plurality of portions each extending along the x-axis. In the description below, each of the portions of conductor CWb may be referred to as conductor portion CWb. All conductor portions CWb are coupled to each other in a region other than the region shown in FIG. 4.

Conductor portion CWa and conductor portion CWb are alternately arranged along the y-axis. Each of conductor portions CWa and CWb is located along the z-axis below one of conductor portions CD1 to CD7 shown in FIG. 3. Isolation insulator IM and a plurality of memory pillars MP extend along the z-axis between two of conductor portions CWa and conductor portions CWb which are arranged along the y-axis. Each memory pillar MP extends over the two conductor portions CWa and CWb on both sides along the y-axis of the memory pillar MP and partially in contact with the two conductor portions CWa and CWb.

Conductor CWa functions as one of word lines WLa0 to WLa7. Conductor CWb functions as one of word lines WLb0 to WLb7. Conductors CWa and CWb located in the same layer have the same value in n of word lines WLan and WLbn (n is a natural number). Specifically, for example, conductors CWa and CWb located, in a certain first layer function as word lines WLa1 and WLb1, respectively.

Figure 5:
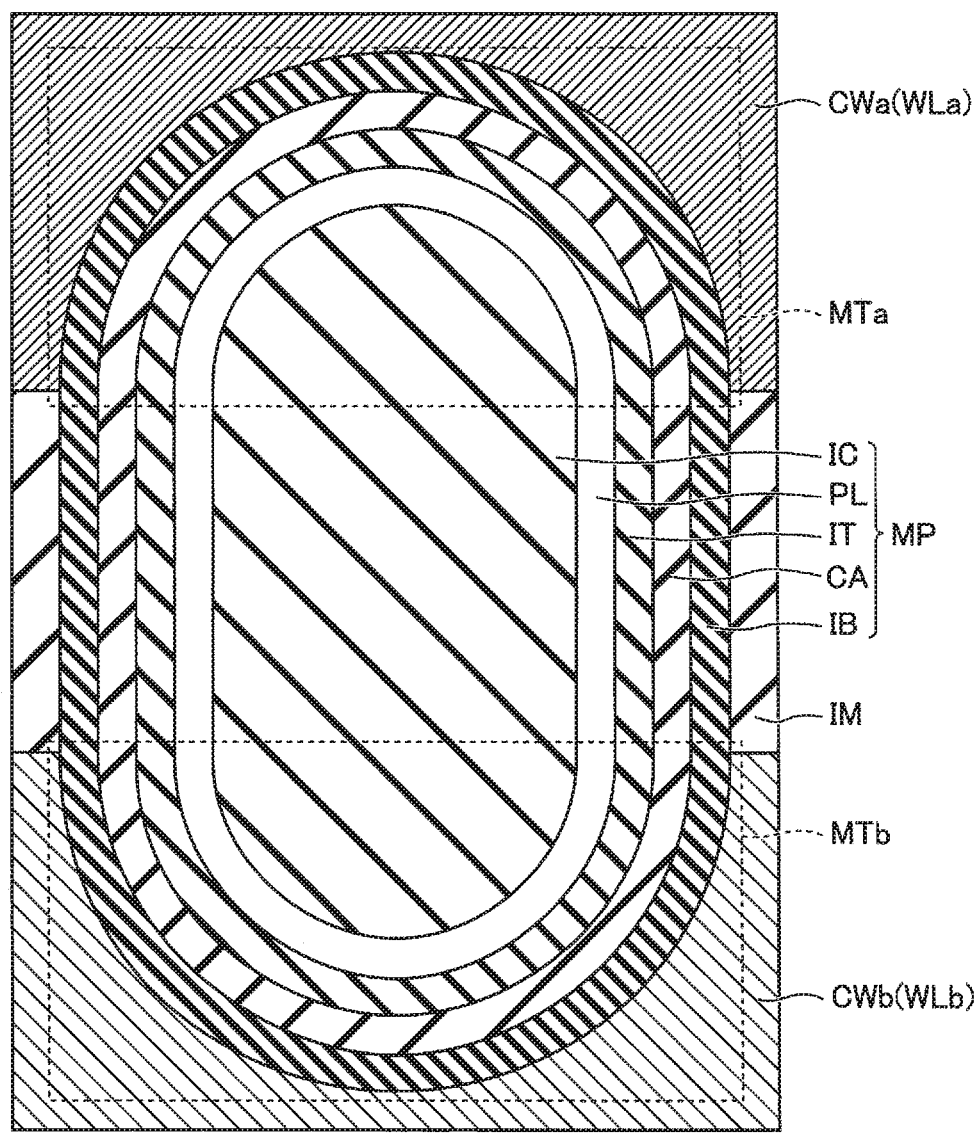
FIG. 5 shows a sectional structure taken along the xy plane and showing one memory pillar of the first embodiment.

FIG. 5 shows a sectional structure taken along the xy plane of one memory pillar MP of the first embodiment and shows how the structure is in a layer where conductors CWa and CWb are located. For example, each memory pillar MP has the structure shown in FIG. 5.

As shown in FIG. 5 and as described above, memory pillar MP is located between conductor CWa and conductor CWb. By way of example, FIG. 5 shows memory pillar MP that is in contact with conductor portion CWa on the upper side and is in contact with conductor portion CWb on the lower side.

As shown in FIG. 5, the memory pillar MP includes a core insulator IC, a semiconductor pillar PL, a tunnel insulator IT, a charge storage layer CA and a block insulator IB. The memory pillar MP may include an additional conductor or insulator.

The core insulator IC is located in the center of the memory pillar MP. The semiconductor pillar PL covers the side surface of the core insulator IC. The semiconductor pillar PL functions as a channel region in which the channels of memory cell transistor MT and select gate transistors DT and ST are formed. The tunnel insulator IT covers the side surface of the semiconductor pillar PL.

The block insulator IB is located on the outermost side of the memory pillar MP and constitutes a side surface of the memory pillar MP. The block insulator IB is in contact with conductor portion CWa, conductor portion CWb and isolation insulator IM.

Charge storage layer CA is located between the tunnel insulator IT and the block, insulator IB and covers, for example, the side surface of the tunnel insulator IT. Charge storage layer CA may be an insulator or a conductor.

Of the portions of the memory pillar MP, the conductor portion CWb or the portion facing the conductor portion CWa or CWb functions as one memory cell transistor MT.

Figure 6:
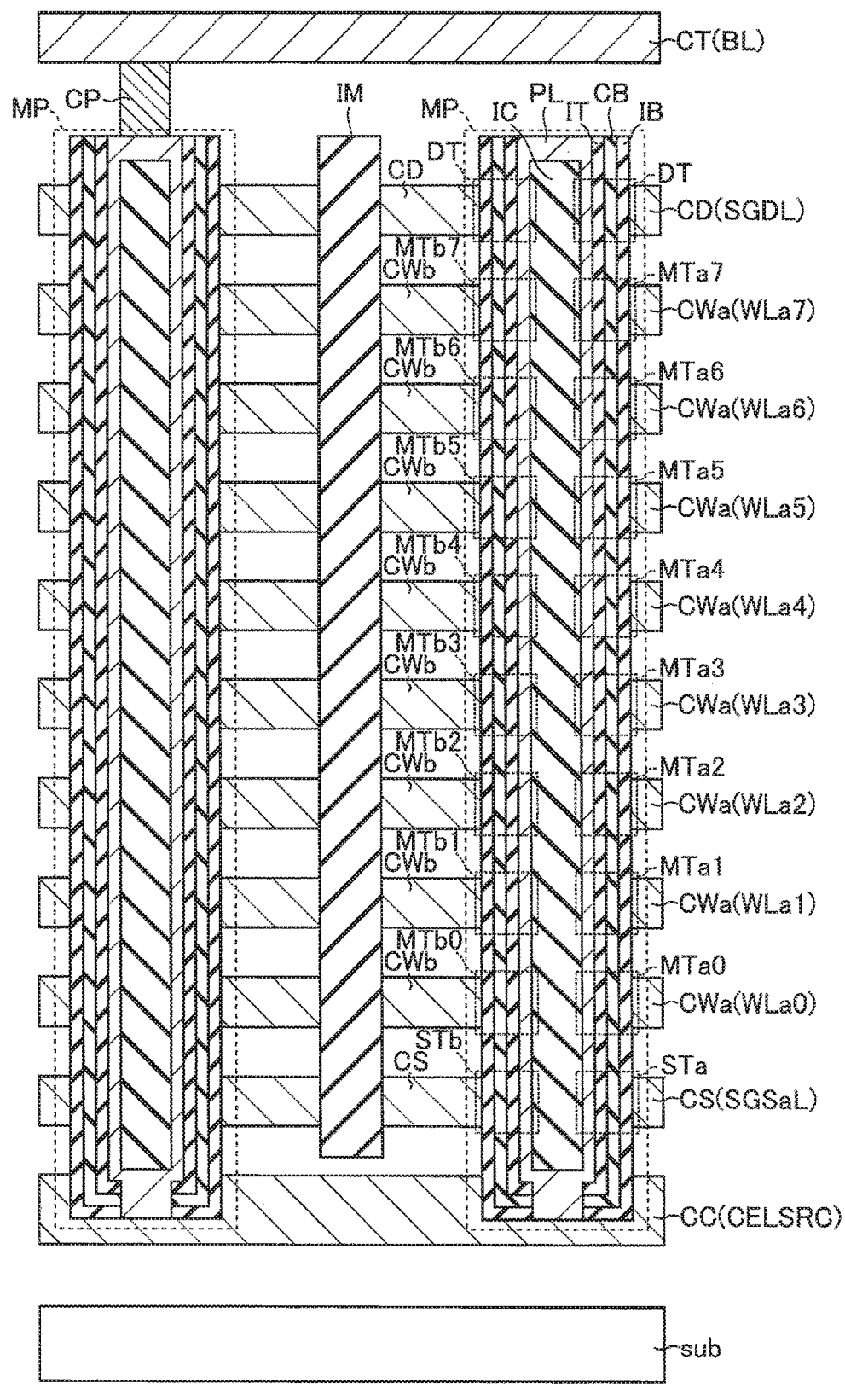
FIG. 6 shows how a sectional structure of part of the memory cell array of the first embodiment is in the xy plane.

By way of example, the memory cell array 10 can have the structure shown in FIG. 6.

FIG. 6 shows how a sectional structure of part of the memory cell array 10 of the first embodiment is in the yz plane, and shows a region in which two memory pillars MP arranged along the y axis are included.

As shewn in FIG. 6, the substrate sub spreads in the xy plane. Conductor CC is provided above the substrate sub. Conductor CC functions as source line CELSRC. Two conductors CS, a plurality of conductor portions CW (for example, eight conductor portions CWa and eight conductor portions CWb) and conductor portion CD are provided above conductor CC. Conductors CS, CW and CD are arranged at intervals in this order along the z-axis and extend along the y-axis. FIG. 6 shows a plurality of portions of conductor CS, and the portions of conductor CS which are shown in FIG. 6 are coupled to each other in a region different from the region shown in FIG. 6. In the description below, the portions of conductor CS which are shown in FIG. 6 may be referred to as conductor portions CS.

As shown in FIG. 6 and as described above with reference to FIGS. 3-5, each conductor portion CD is located between memory pillar MP and isolation insulator IM, and each conductor portion CW is located between memory pillar MP and isolation insulator IM. Likewise, each conductor portion CS and each conductor portion CD are located between memory pillar MP and isolation insulator IM.

Each conductor CS functions as select gate line SGSaL or select gate line SGSbL. Each, conductor portion CD functions as one of select gate lines SGDL0 to SGDL7.

Conductor portions CWa are located in different eight layers. In each case of value $\delta$ ($\delta$ is a natural number), conductor portion CWa in the $\delta$th layer from the substrate sub functions as word line WLa($\delta$−1).

Conductor portions CWb are located in different eight layers. In each case of value $\delta$, conductor portion CWb in the $\delta$th layer from the substrate sub functions as word line WLb($\delta$−1).

Each memory pillars MP extend along the z-axis between a position higher than conductor portions CD and the inside of conductor CC. The semiconductor pillar PL extends along the z-axis and is in contact with conductor CC at the lower end. The upper ends of some of the memory pillars MP are coupled to conductor CT via conductive plugs CP in the portion of semiconductor pillar PL. Conductor CT extends along the x-axis, functions as one bit line BL, and is spaced apart from, conductors CT located at other coordinates on the y-axis.

Isolation insulator IM spreads from conductor portion CD to conductor portion CS in the yz plane.

The portion where semiconductor pillar PL, tunnel insulator IT, charge storage layer CB and block insulator IB intersect conductor portion CS functions as select gate transistor STa or STb. The portions where semiconductor pillar PL, tunnel insulator IT, charge storage layer CB and block insulator IB intersect conductor portions CWa or CWb functions as select gate transistors MTa or MTb. The portion where semiconductor pillar PL, tunnel insulator IT, charge storage layer CB and block insulator IB intersect conductor portion CD functions as select gate transistor DT (one of DT0 to DT7).

In the region over conductor CC, an interlayer insulator is provided for those portions where the components shown in FIG. 6 are not provided.

As can be seen from FIG. 6, two memory cell transistors MTa and MTb sharing a certain memory pillar MP and located in the same layer share the semiconductor pillar PL and are coupled in parallel. One of such two memory cell transistors MTa and MTb will be hereinafter referred to as the back side memory cell transistor MT of the other of the two. For example, one of memory cell transistors MTa0 and MTb0 sharing memory pillar MP is the back side memory cell transistor of the other of the two. Likewise, the set of respective back side memory cell transistors MT of the memory cell transistors MT of the selected cell unit CU will be referred to as a back side cell unit, CU.

<1.1.3. Cell Transistor>

Figure 7:
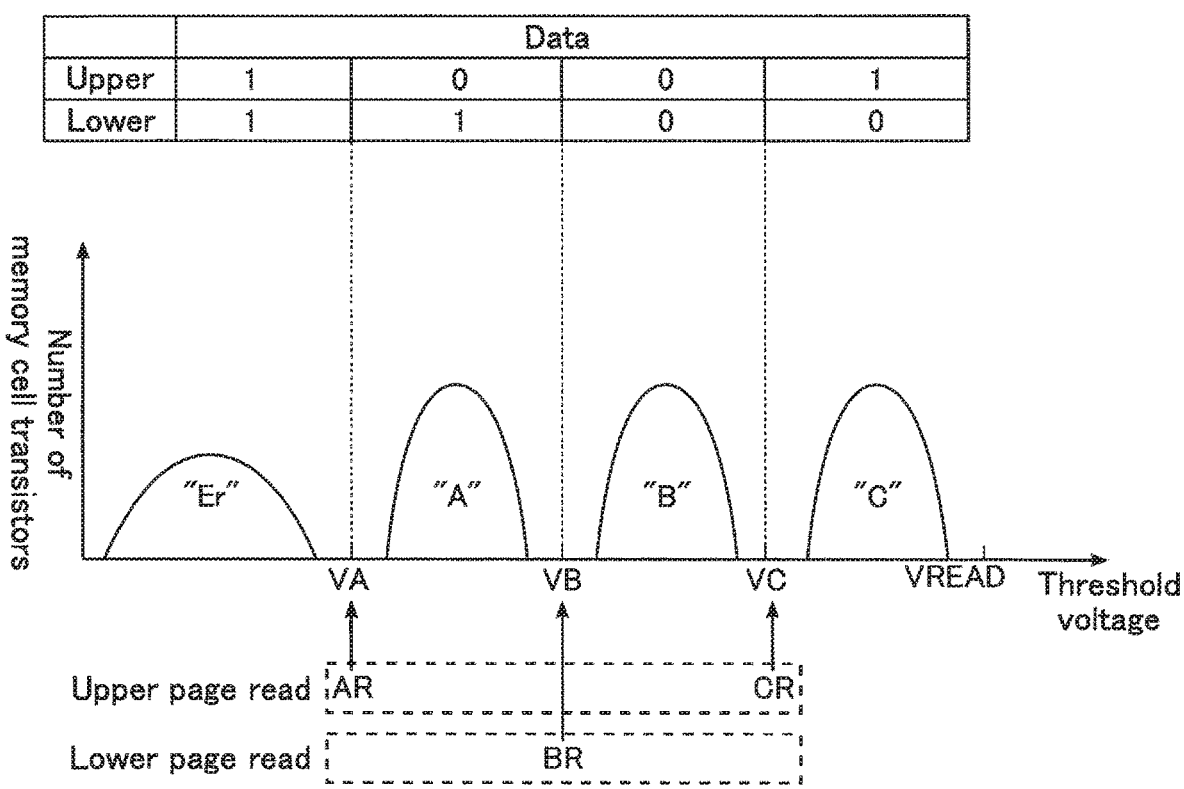
FIG. 7 shows a threshold voltage distribution and data mapping of a memory cell transistor of the first embodiment.

The semiconductor memory device 1 can store data of 2 bits or more in one memory cell transistor MT. By way of example, FIG. 7 shows a threshold voltage distribution and data mapping of memory cell transistors MT each storing 2-bit data. The threshold voltage of each memory cell transistor MT has a value determined in accordance with data that is stored. Where 2-bit data is stored, each memory cell transistor MT can be in one of the four states (or levels) according to the threshold voltage. The four states are referred to as an Er state, an A state, a B state and a C state. The memory cell transistors MT in the Er, A, B, and C states have higher threshold voltages in this order. The Er state corresponds to a state in which data is erased.

By the data write, the memory cell transistor MT for which the data write is to be performed is kept in the Er state or is moved to one of the A state, B state and C state, based on data to be written.

Two-bit data can be assigned to each state in any manner. Each state is treated as having, for example, the 2-bit data described below. In the description below, P and Q of "PQ" indicate an upper bit value and a lower bit value, respectively.

Er state: "11"
A state: "01"
B state: "00"
C state: "10"

Even a plurality of memory cell transistors MT storing the same 2-bit data may have different threshold voltages, due to variation in the characteristics of the memory cell transistors MT.

In order to identify what data is stored by memory cell transistor MT for which data read is to be executed (i.e., selected memory cell transistor), the state of selected memory cell transistor MT is determined. To determine the state of the selected memory cell transistor MT, which range of the threshold voltage to which the selected memory cell transistor MT belongs is used.

Reads for determining whether the selected memory cell transistor MT is in a state above the Er state, in a state above the A state and in a state above the B state will be referred to as AR (read), BR, and CR, respectively.

A set of data of bits at the same position (digit) of the memory cell transistors MT of one cell unit CU constitutes one page. The data set of the upper (first digit) bit of the memory cell transistor MT of each cell unit CU will be called an upper page. The data set of the lower (second digit) bit of the memory cell transistor MT of each cell unit CU will be called a lower page.

The data of each page is determined by reads that use a plurality of read voltages VCGR of different magnitudes. The magnitudes of the read voltages VCGR to be used are determined based on which combination of 2-bit data is mapped to each of the Er state to the C state. The read voltages VCGR include an AR voltage VA, a BR voltage VB and a CR voltage VC. The AR voltage VA, the BR voltage VB and the CR voltage VC are used in AR, BR and CR, respectively. In the example of the mapping shown in FIG. 7, the value of each bit of the lower page is determined by BR. Reading (determining) the data of the lower page of the selected cell unit CU by using one or more read voltages VCGR will be called a lower page read.

The value of the upper bit of each selected memory cell transistor MT can be determined by AR and CR. Reading (determining) the data of the upper page of the selected cell unit CU by using one or more read voltages VCGR will be called an upper page read.

Read pass voltage VREAD has a magnitude that turns on the memory cell transistor MT in any state.

By data erase, the threshold voltage of the memory cell transistor MT from which data is to be erased lowers, and that memory cell transistor MT is set in the Er state.

<1.1.4. Sense Amplifier>

FIG. 8 shows components and connections in the sense amplifier 16 of the first embodiment. The sense amplifier 16 includes m+1 sense amplifier circuits SAC, m+1 operation circuits LC, data latches SDL, TDL, ADL, BDL and ADL, and data latch (cache memory) XDL.

Each sense amplifier circuit SAC senses a potential read to one bit line BL coupled thereto, and transfers data to the bit line BL.

The data latch XDL includes m+1 data latch circuits XDLC. Each data latch circuit XDLC is coupled to one data bus LBUS and can store 1-bit data. Each data bus LBUS is coupled to one bit line BL via one sense amplifier circuit SAC during a data read.

Data latches SDL, TDL, ADL, BDL and CDL respectively include m+1 data latch circuits SDLC, m+1 data latch circuits TDLC, m+1 data latch circuits ADLC, m+1 data latch circuits BDLC and m+1 data latch circuits CDLC. Each of data latch circuits SDLC, TDLC, ADLC, BDLC and CDLC are coupled to one data bus LBUS and can store 1-bit data.

Data latch circuits XDLC, SDLC, TDLC, ADLC, BDLC and CDLC, the operation circuit LC and the sense amplifier circuit SAC coupled to the same bit line BL constitute one sense amplifier unit SAU. Sense amplifier units SAU respectively coupled to bit lines BL0 to BLm will be referred to as sense amplifier units SAU0 to SAUm.

Each sense amplifier circuit SAC is electrically coupled to one selected memory cell transistor MT via one bit line BL coupled to that sense amplifier circuit SAC during a data read. Then, each sense amplifier circuit SAC senses a voltage of a magnitude determined based on the threshold voltage of the selected memory cell transistor MT at a sense node SEN (described later) of the sense amplifier circuit, SAC, and determines in which of the two states the memory cell transistor MT electrically coupled to the sense amplifier circuit SAC is. The two states of the memory cell transistor MT are expressed as "0" data or "1" data, and each sense amplifier circuit SAC determines whether the read data is "0" data or "1" data. The determined data is stored in one of data latch circuits SDLC, TDLC, ADLC, BDLC and CDLC coupled to the sense amplifier circuit SAC.

Each operation circuit LC can perform logical operations for the data stored in the data latch circuits XDLC, SDLC, TDLC, ADLC, BDLC and CDLC coupled to the operation circuit LC and the data at the sense node SEN of the sense amplifier circuit SAC. The logical operations include a negative (NOT) operation, a logical sum (OR) operation, a logical product (AND) operation, an exclusive logical sum (XOR) operation and a negative exclusive logical sum (XNOR) operation.

<1.1.5. Sense Amplifier Circuit>

FIG. 9 is an exemplary circuit diagram of a sense amplifier circuit SAC of the first embodiment. Each sense amplifier circuit SAC includes a p-type metal oxide semiconductor field effect transistor (MOSFET) 21, n-type MOSFETs Tblx, Txxl, Tblq, 22, 23, 24, 25, 26, 27 and 28, and a capacitor 29.

One bit line BL coupled to the sense amplifier circuit SAC shown in FIG. 9 is coupled to node SCOM via n-type MOSFETs Tbls and Tblc.

Node SCOM is coupled to node VLSA via transistor 22. The transistor 22 receives signal NLO at the gate from, for example, the sequencer 13.

Node SCOM is further coupled to node SSRC via transistor Tblx. Transistor Tblx receives signal BLX from the sequencer 13, for example.

Node SSRC is coupled to node VHSA via transistor 21 and is also coupled to node SRCGND via, transistor 23. Node VHSA receives the power supply potential of the sense amplifier 16, and node SRCGND receives the ground potential (common potential). Transistors 21 and 23 are coupled to node INV_S at their gates. Node INV_S is a node in the data latch circuit SDLC coupled to the sense amplifier circuit SAC shown in FIG. 9.

Node SCOM is further coupled to sense node SEN via transistor Txxl. Transistor Txxl receives signal XXL at the gate from, for example, sequencer 13.

Sense node SEN is coupled to data bus LBUS via transistor Tblq. Transistor Tblq receives signal BLQ at the gate from, for example, sequencer 13. The data bus LBUS is coupled to data latch circuits XDLC, ADLC, BDLC, CDLC, TDLC and SDLC that constitute the sense amplifier unit SAU together with the sense amplifier circuit SAC shown in FIG. 4.

The sense node SEN is also coupled to a first end (one of the source and the drain) of the transistor 24. Transistor 24 receives signal LSL at the gate from, for example, the sequencer 13, and is coupled to node VLOP via transistor 25 at a second end (the other one of the source and the drain). The transistor 25 has a gate coupled to the data bus LBUS.

The data bus LBUS is further coupled to a first end of transistor 27 via transistor 26. The transistor 26 receives strobe signal STB at the gate from, for example, the sequencer 13, and is coupled to the first end of transistor 27 at a second end. Transistor 27 has a gate coupled to the sense node SEN, and receives signal CLKSA at a second end from, for example, the sequencer 13.

Transistor 28 is coupled between node VHLB and the data bus LBUS, and receives signal LPC at the gate from, for example, the sequencer 13.

1.2. Operation

Figure 10:
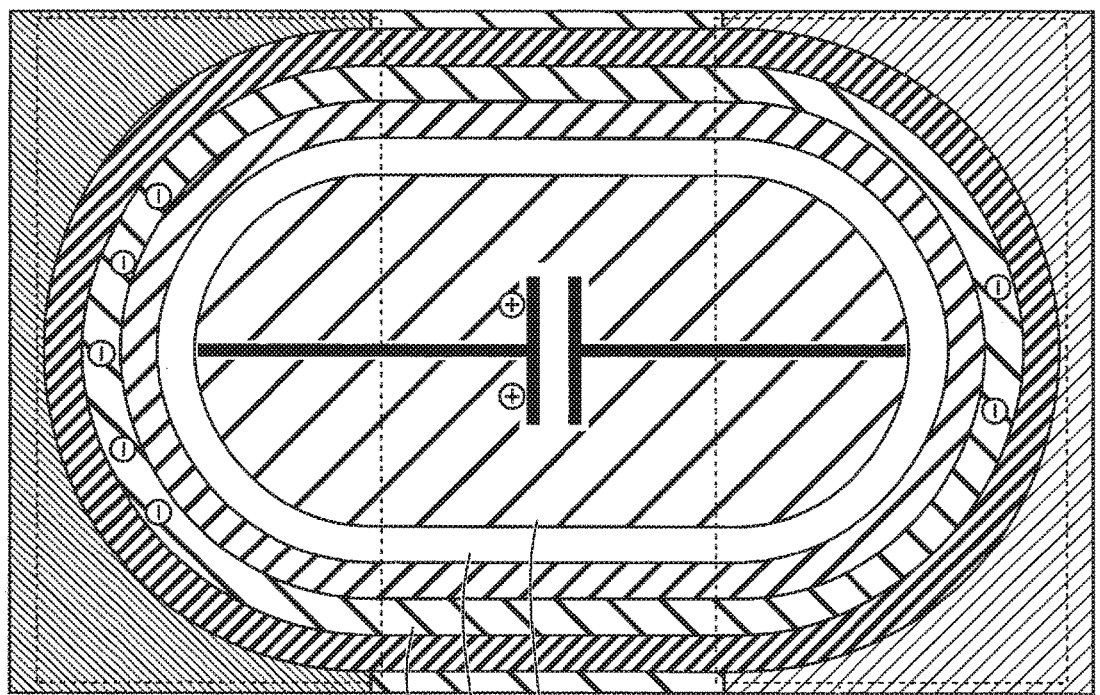
FIG. 10 shows an example of how charges are in part of the semiconductor memory device of the first embodiment.
Figure 10:
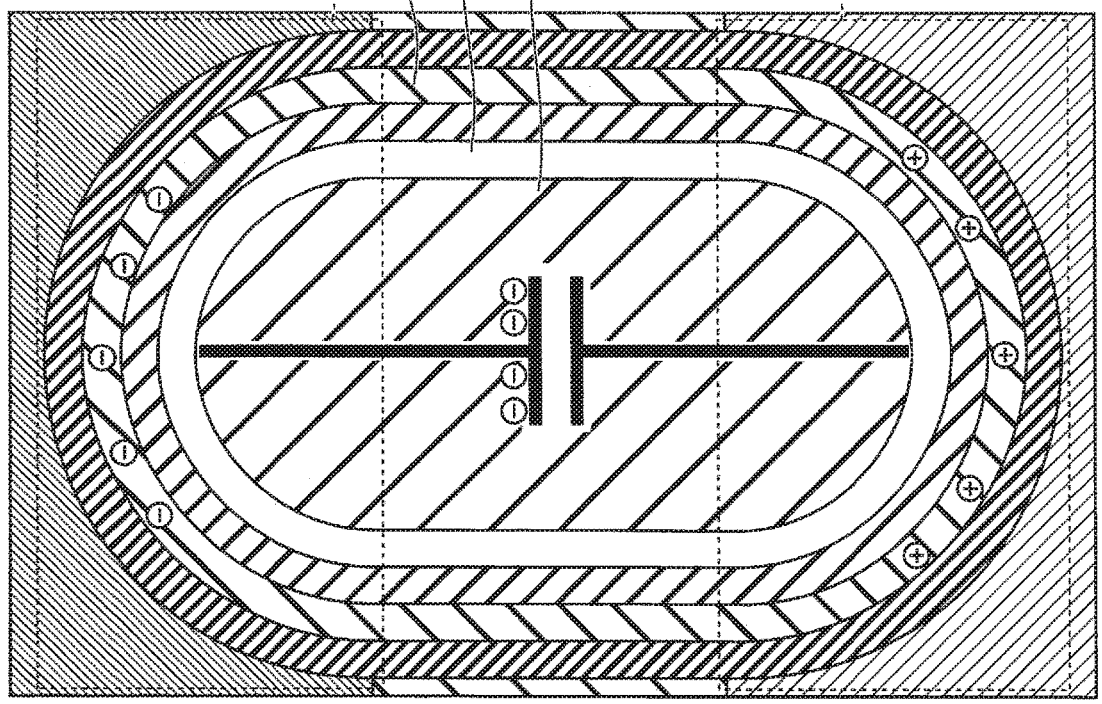

FIG. 10 shows an example of how charges may be generated in part of the semiconductor memory device 1 of the first embodiment. FIG. 10 shows the same region as FIG. 5.

In the left half, FIG. 10 shows a state in which data is written in selected memory cell transistor MTa. The back side memory cell transistor MTb is in the Er state. In the right half, FIG. 10 shows a state in which data is written in the back side memory cell transistor MTb from the state shown in the left half.

In the state shown in the left half, the semiconductor pillar PL of the selected memory cell transistor MTa and the semiconductor pillar PL of the back side memory cell transistor MTb are capacitively coupled by a parasitic capacitance via a core insulator IC, as schematically illustrated. Holes exist in the charge storage layer CB of the back side memory cell transistor MTb, and the holes induce charges in the semiconductor pillar PL of the charge storage layer CB of the back side memory cell transistor MTb. In addition, the charges in the semiconductor pillar PL induce electrons on the selected memory cell transistor MTa side of the parasitic capacitance. In FIG. 10, the charges induced by the charges in the charge storage layer CB of the back side memory cell transistor MTb are shown, and the charges induced by the charges in the charge storage layer CB of the selected memory cell transistor MTa are not shown. Data is written in the selected memory cell transistor MTa in a state where electrons are induced by the holes in the back side memory cell transistor MTb. Therefore, in the state where electrons are induced by the holes in the back side memory cell transistor MTb, the selected memory cell transistor MTa is determined to have the threshold voltage which the memory cell transistor MT in, the state corresponding to the data to be written should have, and the data write to the selected memory cell transistor MTa is completed.

When the state is shifted to the state shown in the right half, electrons are taken in the charge storage layer CB of the back side memory cell transistor MTb. The electrons induces holes on the selected memory cell transistor MTa side of the parasitic capacitance. Since electrons are lost and holes are induced on the selected memory cell transistor MTa side of the parasitic capacitance, the threshold voltage of the selected memory cell transistor MTa becomes lower than that of the back side memory cell transistor MTb in the Er state (the state shown in the left half). This may cause an erroneous read, of data in the selected memory cell transistor MTa. This phenomenon is conspicuous where the back side memory cell transistor MTb is electrically floating.

<1.2.1. Voltages During Lower Page Read>

Figure 11:
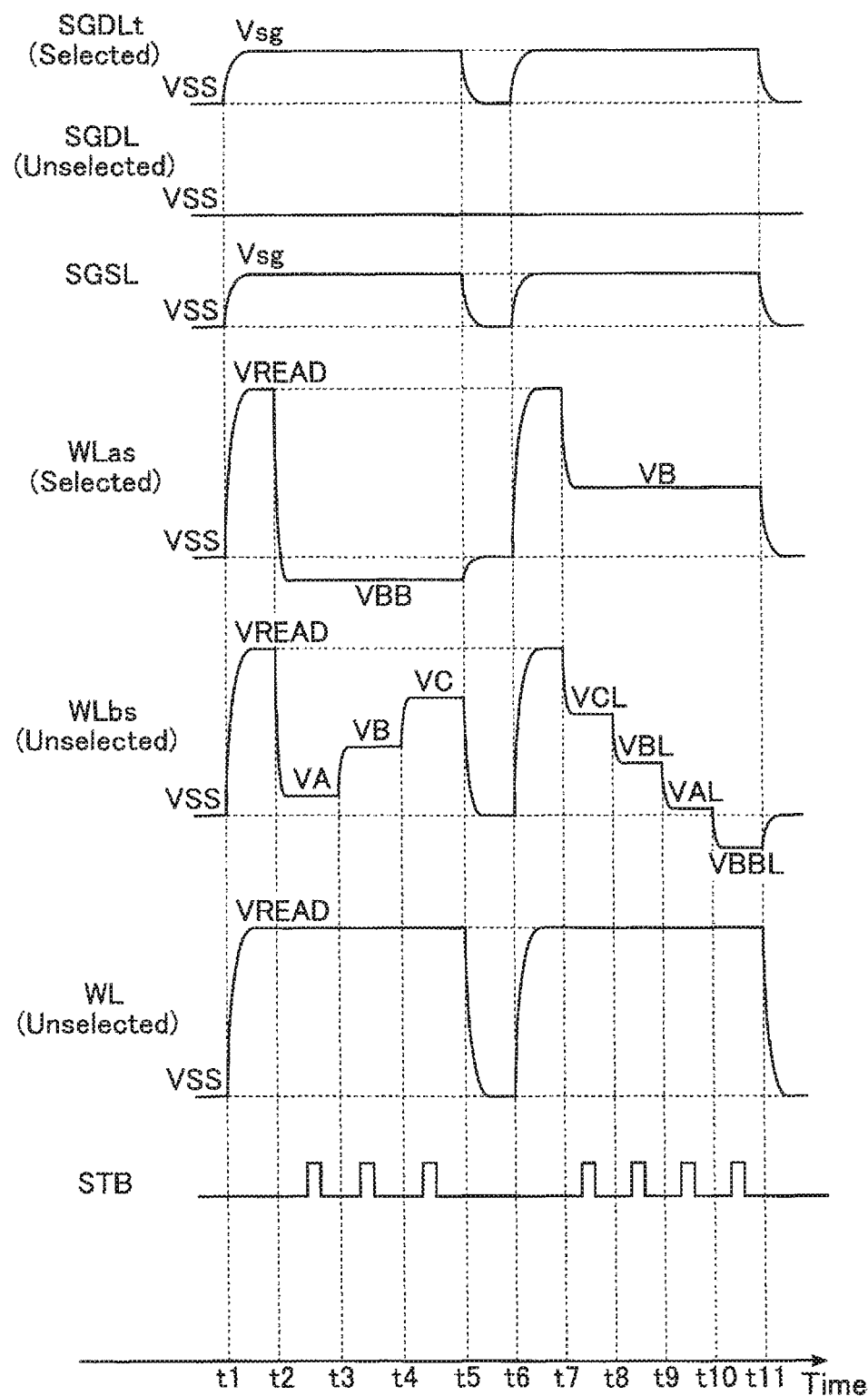
FIG. 11 shows how voltages are applied to some components with time during a certain operation of the semiconductor memory device of the first embodiment.

FIG. 11 shows how voltages are applied to some components with time during a certain operation of the semiconductor memory device 1 of the first embodiment. Specifically, FIG. 11 shows voltages that are applied during read of lower page data of selected cell unit CU of selected block BLK. FIG. 11 shows an example in which data is read from the memory cell transistor MTa coupled to word line WLa and in which the memory cell transistor MTb coupled to word line WLb is a back side memory cell transistor. In the case where data is read from the memory cell transistor MTb, a description in which the reference numerals "a" and "b" are interchanged in the description below holds true.

FIG. 11 shows select gate line SGDLt of selected string unit SUt (t is 0 or a natural number) including the selected cell unit CU, remaining select gate lines SGDL (unselected select gate lines) of the select gate lines SGDL except for selected gate line SGDLt, and select gate line SGSL. FIG. 11 also shows a word line (selected word line) WLas (s is 0 or a natural number) coupled to the selected cell unit CU, a word line (back side word line) WLbs coupled to the back side cell unit CU, and the remaining unselected word lines WL of word lines WL except for the selected word line WLas and back side word line WLbs.

At time t1, the sequencer 13 applies voltage Vsg to select gate lines SGDLt and SGSL. Voltage Vsg has a magnitude that keeps on select gate transistors DT and ST. The application of voltage Vsg continues until time t5 described later. On the other hand, voltage VSS is kept applied to unselected select gate lines SGDL during the data read.

Also, the sequencer 13 applies read pass voltage VREAD to the selected word line WLas, back side word line WLbs and unselected word lines WL at time t1. The application of read pass voltage VREAD to the selected word line WLas and back side word line WLbs continues until time t2. On the other hand, the application of read pass voltage VREAD to unselected word lines WL continues until time t5 described later.

The sequencer 13 reads data from the lower page and the upper page of back side cell unit CU from time t2 to time t5. To this end, the sequencer 13 applies a cutoff voltage VBB to the selected word line WLas from time t2 to time t5. The cutoff voltage VBB has a magnitude that keeps off the memory cell transistors MT in the Er state, and is lower than voltage VSS, for example.

The sequencer 13 executes AR, BR and CR from time t2 to time t5. To this end, the sequencer 13 applies an AR voltage VA, a BR voltage VB and a CR voltage VC to the back side word line WLbs in an optional order between time t2 and time t5. For example, the sequencer 13 applies the AR voltage VA to the back side word line WLbs from time t2 to time t3. Also, the sequencer 13 temporarily enables strobe signal STB (makes strobe signal STB high level) between time t2 and time t3. As a result, "0" data or "1" data is obtained based on the voltage at the sense node SEN of each sense amplifier circuit SAC. In the description below, the operation of enabling strobe signal STB and acquiring "0" data or "1" data based on the voltage at the sense node SEN will be referred to as strobe.

Likewise, the sequencer 13 applies the BR voltage VB to the back side word line WLbs from time t3 to time t4 and performs strobe between time t3 and time t4 to execute BR. Further, the sequencer 13 applies the CR voltage VC to the back side word line WLbs from time t4 to time t5 and performs strobe from time t4 to time t5 to execute CR.

At time t5, the sequencer 13 changes the voltages applied to the select gate lines SGDLt and SGSL, selected word line WLas, back side word line WLbs and unselected word lines WL back to VSS.

The sequencer 13 again applies voltage Vsg to select gate lines SGDLt and SGSL from time t6. The application of voltage Vsg continues until time t11.

Also, the sequencer 13 applies read pass voltage VREAD to the selected word line WLas, back side word line WLbs and unselected word lines WL from time t6. The application of read pass voltage VREAD to the selected word line WLas and back, side word line WLbs continues until time t7. On the other hand, the application of read pass voltage VREAD to unselected word lines WL continues until time t11 described later.

The sequencer 13 reads data from the lower page of selected cell unit CU from time t7 to time t11. To this end, the sequencer 13 executes BR by applying the BR voltage VB to the selected word line WLas from time t7 to time t11.

Further, the sequencer 13 keeps applying a CJ cutoff voltage VCL, a B cutoff voltage VBL, an A cutoff voltage VAL and an Er cutoff voltage VBBL to the back side word line WLbs during the BR from the selected cell unit CU, and strobe is performed while each of those voltages is being applied. Specific operations will be described. By way of example, it is assumed that the sequencer 13 applies the C cutoff voltage VCL, the B cutoff voltage VBL, the A cutoff voltage VAL and the Er cutoff voltage VBBL in this order to the back side word line WLbs during the BR for the selected cell unit CU. Based on this example, the sequencer 13 applies the C cutoff voltage VCL to the back side word line WLbs from time t7 to time t8. Voltage VCL is slightly lower than the CR voltage VC, is higher than at least the BR voltage VB for determining the B state, which is one level lower than the C state, and barely keeps the cutoff of the memory cell transistors MT in the C state. That is, voltage VCL has a maximum magnitude for turning off the memory cell transistors MT in, the C state.

A selected memory cell transistor MT is turned on when it is applied with a voltage equal to or higher than its own threshold voltage at the selected word line WL during the data read. As a result, a current path is formed through the NAND string NS including the selected memory cell transistor MT, and the potential of the sense node SEN in the sense amplifier circuit SAC coupled to the NAND string NS decreases. A state in which the potential of the sense node SEN is equal to or lower than a certain level is regarded as a state in which the sense node SEN has a potential corresponding to the "0" data.

On the other hand, a selected memory cell transistor MT maintains the cutoff state when it is applied with a voltage lower than its own threshold voltage at the selected word line WL during the data read. As a result, a current path is not formed through the NAND string NS including the selected memory cell transistor MT, and the potential of the sense node SEN in the sense amplifier circuit SAC coupled to the NAND string NS hardly lowers. A state in which the potential of the sense node SEN is higher than a certain level is regarded as a state in which the sense node SEN has a potential corresponding to the "1" data.

The sequencer 13 performs strobe from time t7 to time t8.

From time t8 to time t9, the sequencer 13 applies the B cutoff voltage VBL to the back side word line WLbs. The B cutoff voltage VBL is slightly lower than the BR voltage VB, is at least higher than the AR voltage VA for determining the A state, which is one level lower than the B state, and barely keeps the cutoff of the memory cell transistors MT in the B state. The sequencer 13 performs strobe from time t8 to time t9.

From time t9 to time t10, the sequencer 13 applies the A cutoff voltage VAL to the back side word line WLbs. The A cutoff voltage VAL is slightly lower than the AR voltage VA, is at least higher than the cutoff voltage VBB, and barely keeps the cutoff of the memory cell transistors MT in the A state. The sequencer 13 performs strobe from time t9 to time t10.

From time t10 to time t11, the sequencer 13 applies the Er cutoff voltage VBBL to the back side word line WLbs. The ER cutoff voltage VBBL is slightly lower than the cutoff voltage VBB and barely keeps the cutoff of the memory cell transistors MT in the Er state. The sequencer 13 performs strobe from time t10 to time t11.

At time t11, the sequencer 13 changes the voltages to the select gate lines SGDLt and SGSL, selected word, line WLas, back side word line WLbs and unselected word lines WL back to VSS. This completes the operation shown in FIG. 11.

<1.2.2. Voltages During Upper Page Read>

Figure 12:
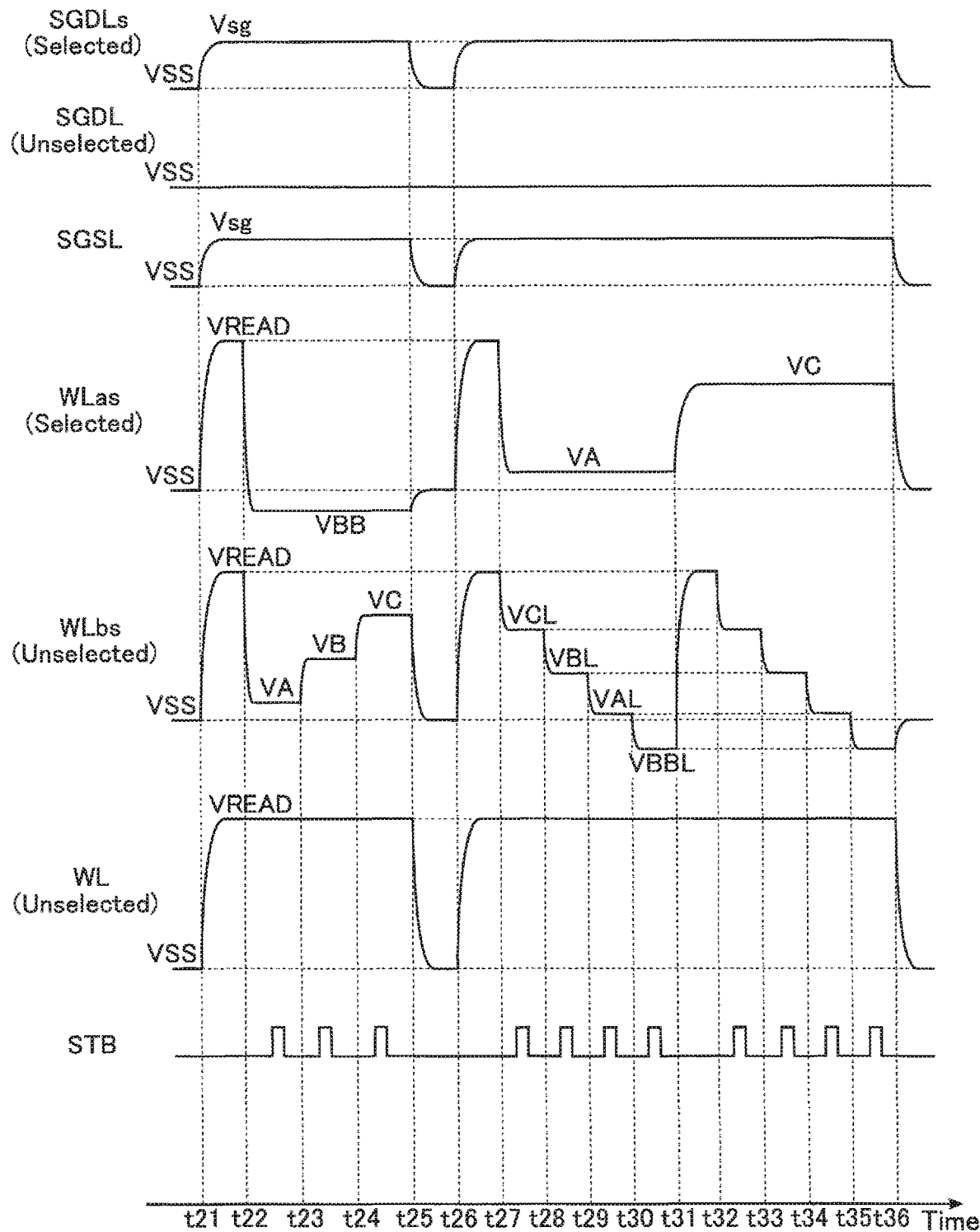
FIG. 12 shows how voltages are applied to some components with time during a certain operation of the semiconductor memory device of the first embodiment.

FIG. 12 shows how voltages are applied to some components with time during a certain operation of the semiconductor memory device 1 of the first embodiment. Specifically, like FIG. 11, FIG. 12 shows voltages that are applied during read of upper page data of selected cell unit CU of selected block BLK. Like FIG. 11, FIG. 12 shows an example in which data is read from the memory cell transistor MTa coupled to word line WLa and in which the memory cell transistor MTb coupled to word line WLb is a back side memory cell transistor.

The manner in which voltages change from time t21 to time t26 is the same as the manner in which voltages change from time t1 to time t6 shown in FIG. 11, respectively.

The sequencer 13 applies voltage Vsg to the select gate lines SGDLt and SGSL again from time, t26. The application of voltage Vsg continues until time t36.

Also, the sequencer 13 applies read pass voltage VREAD to the selected word line WLas, back side word line WLbs and unselected word lines WL from time t26. The application of read pass voltage VREAD to the selected word line WLas and back side word line WLbs continues until time t27. On the other hand, the application of read pass voltage VREAD to unselected word lines WL continues until time t36 described later.

The sequencer 13 reads data from the upper page of selected cell unit CU from time t27 to time t36. To this end, the sequencer 13 executes AR and CR by applying the AR voltage VA and the CR voltage VC to the selected word line WLas from time t27 to time t36.

Further, between the AR and the CR for the selected cell unit CU, the sequencer 13 keeps applying the C cutoff voltage VCL, the B cutoff voltage VBL, the A cutoff voltage VAL and the Er cutoff voltage VBBL to the back side word line WLbs, as in the BR for the lower page read, and strobe is performed while each of those voltages is being applied.

Specific operations will be described. By way of example, the sequencer 13 executes AR from time t27 to time t31 and executes CR from time t32 to time t36. The voltages applied to each interconnect at each time from time t27 to time t31 and the operations are the same as those from time t7 to time t11 for BR, except that the AR voltage VA is applied instead of the BR voltage VB. The voltages applied to each interconnect at each time from time t32 to time t36 are the same as those from, time t7 to time t11 for BR, except that the CR voltage VC is applied instead of the BR voltage VB.

At time t36, the sequencer 13 changes the voltages to the select gate lines SGDLt and SGSL, selected word line WLas, back side word line WLbs and unselected word line WL back to VSS. This completes the operation shown in FIG. 12, <1.2.3. Data Latch States During Lower Page Read>

FIG. 13 to FIG. 25 sequentially show how data, latch states are during a certain operation of the semiconductor memory device of the first embodiment. More specifically, FIGS. 13 to 25 show how data latches XDL, CDL, BDL, ADL, TDL and SDL and the sense node SEN are during the data read from the lower page of selected cell unit CU.

In each case of ε (ε is X, C, B, A, T or S), each of the boxes next to the notation "εDL" indicate data in one data latch circuit εDLC. Each of the boxes next to the notation "SEN" indicates data obtained by the strobe performed in one sense amplifier circuit SAC. A set of data arranged in the vertical direction is a set of data in one sense amplifier unit SAU.

The operations shown in FIGS. 13 to 25 are performed, for example, under the control of the sequencer 13. That is, the sequencer 13 is configured to execute the operations described below.

As shown in FIGS. 13 to 25, 16 combinations exist by the four states of selected memory cell transistor MTas and the four states of back side memory cell transistor MTbs.

The 16 combinations are shown in FIGS. 13 to 25. In the description below, a set of selected memory cell transistor MTas in the X state (X is Er, A, B or C) and back side memory cell transistor MTbs in the Y state (Y is Er, A, B or C) may be referred to as "(X, Y) memory cell transistor pair".

FIGS. 13 to 25 show how states are after time t6 shown in FIG. 11. At the time of the state shown in FIG. 13, AR, BR and CR for the back side cell unit CU are completed, and the lower page data and the upper page data are held in data latches BDL and CDL, respectively. That is, data latch, circuits BDLC and CDLC coupled to a back side memory cell transistor MTbs in the Er state both store "1" data. Likewise, data latch circuits BDLC and CDLC coupled to a back side memory cell transistor MTbs in the A state store "1" data, and "0" data, respectively. Data latch circuits BDLC and CDLC coupled to a back side memory cell transistor MTbs in the B state both store "0" data. Likewise, data latch circuits BDLC and CDLC coupled to a back side memory cell transistor MTbs in the C state store "0" data and "1" data, respectively.

<1.2.3.1. BR Executed with Voltage VCL Applied>

FIG. 13 shows how the state is before the strobe between time t7 and time t8 shown in FIG. 11. As shown in FIG. 13, the sense node SEN in the same sense amplifier unit SAU as each data latch, circuit SDLC is charged with the data which has the logic of the inverted logic of the data in that data latch circuit SDLC. In the description below, two latch circuits or sense nodes SEN in a certain sense amplifier unit SAU may be referred to as having a "corresponding" relationship.

In data read according to the first embodiment, all data latch circuits SDLC continue to hold "0" data. Therefore, each sense node SEN is charged to the potential corresponding to the "1" data.

FIG. 14 shows how the state is during the strobe between time t7 and time t8 shown in FIG. 11. Since the BR voltage VB is applied to the selected word line WLas, the selected, memory cell transistor MTas in the Er or A state is turned, on. Further, since the C cutoff voltage VCL is applied, the back side memory cell transistor MTbs in the Er, A, or B state can be turned on. Therefore, the potential of the sense node SEN corresponding to the memory cell transistor pair (Er, Er), (Er, A), (Er, B), (Er, C), (A, Er), (A, A), (A, B) or (A, C) lowers to a potential corresponding to the "0" data.

Since the C cutoff voltage VCL is applied, the back side memory cell transistor MTbs in the C state also maintains cutoff. Therefore, the body (the portion of the semiconductor pillar PL) of such a back side memory cell transistor MTbs is electrically floating. As described above, however, the C cutoff voltage VCL has a magnitude that barely cuts off the memory cell transistors MT in the C state, that is, a maximum cutoff voltage. Since the maximum voltage that enables cutoff is applied, the degree of electrical floating of the memory cell transistor MT in the C state is low. Therefore, the state of the selected memory cell transistor MTas is reflected in the potential of the corresponding sense node SEN, and the potential of the sense node SEN becomes the potential corresponding to the "0" data.

On the other hand, the selected memory cell transistor MTas in the B or C state is not turned on even by the BR voltage VB applied to the selected word line WLas. The back side memory cell transistors MTbs of these selected memory cell transistors MTas are turned on or maintain cutoff based on which state they are in. As a result, the potentials of the corresponding sense nodes SEN are classified into two groups. The back side memory cell transistor MTbs in the C state is not turned on even when the C cutoff voltage VCL is applied to the back side word line WLbs. Therefore, in the memory cell transistor pair (B, C) or (C, C), a current path is not formed in any of memory cell transistors MT, and the potential of the corresponding sense node SEN maintains the potential corresponding to the "1" data.

On the other hand, the back side memory cell transistor MTbs in the Er, A, or B state can be turned on by the C cutoff voltage VCL applied to the back side word line WLbs. Therefore, even when the selected memory cell transistor MTas is in the B or C state, a current path is formed via its back side memory cell transistor MTbs. As a result, in the memory cell transistor pair (B, Er), (B, A), (B, B), (C, Er), (C, A) or (C, B), the potential of the corresponding sense node SEN drops and may reach the potential corresponding to the "0" data, not the expected "1" data, regardless of the state of the selected memory cell transistor MTas. The sense nodes SEN or the data latch circuits that can hold, data different from the expected value are indicated by hatching.

FIG. 15 shows how the state is from the strobe between time t7 and time t8 shown in FIG. 11 to time t8. The sense amplifier 16 holds the inverted data of the data which is based on the potential of the sense node SEN in the corresponding data latch. TDL. That is, each sense amplifier circuit. SAC holds the inverted data of the data which is based on the potential of its own sense node SEN in the corresponding data latch circuit TDLC.

Further, the sequencer 13 performs logical operation CDL&(⁻BDL)&(⁻TDL) and holds the result of the operation in the data latch ADL. The operator "&" means a logical sum. Specifically, in each sense amplifier unit SAU, CDLC&(⁻BDLC)&(⁻TDLC) is performed on the corresponding data latch circuits CDLC, BDLC, and TDLC, and the result of the operation, is stored in the corresponding data latch circuit ADLC. As a result, "1" data is held in the data latch circuits ADLC corresponding to memory cell transistor pairs of (B, C) and (C, C), and "0" data is held in the remaining data latch circuits ADLC.

<1.2.3.2. BR Executed with Voltage VBL Applied>

FIG. 16 shows how the state is before the strobe between time t8 and time t9 shown in FIG. 11. The same operation as shown in FIG. 13 is performed, and as a result, each sense node SEN is charged to the potential corresponding to the "1" data.

FIG. 17 shows how the state is during the strobe between time t8 and time t9 shown in FIG. 11. The application of the BR voltage VB can turn on the selected memory cell transistor MTas in the Er or A state, and the application of the B cutoff voltage VBL can turn on the back side memory cell transistor MTbs in the Er or A state. Therefore, the potential of the sense node SEN corresponding to the memory cell transistor pair (Er, Er), (Er, A), (A, Er) or (A, A) lowers to a potential corresponding to the "0" data.

Although the application of the BR voltage VB can turn on the selected memory cell transistor MTas in the Er or A state, the back side memory cell transistor MTbs in the B state maintains cutoff despite the application of the B cutoff voltage VBL. However, according to the same principle as described with reference to FIG. 14, the degree of, electrical floating of the back side memory cell transistor MTbs in the B state is low. Therefore, the potential of the sense node SEN corresponding to the memory cell transistor pair (Er, B) or (A, B) also becomes a potential corresponding to the "0" data.

Since the BR voltage VB is applied, the selected memory cell transistor MTas in the Er or A state is turned on. However, even when the B cutoff voltage VBL is applied, the back side memory cell transistor MTbs in the C state maintains stronger cutoff than the back side memory cell transistor MTbs in the B state. Therefore, the body of such a back side memory cell transistor MTbs is electrically floating and this state is comparatively strong. For this reason, the selected memory cell transistor MTas is hard to turn on, and may not be turned on in some cases. Therefore, the potential of the sense node SEN corresponding to memory cell transistor pair (Er, C) or (A, C) can be the potential corresponding to the "1" data, not the expected "0" data.

On the other hand, the selected memory cell transistor MTas in the B or C state is not turned on even by the application of the BR voltage VB to the selected word line WLas. Further, the back side memory cell transistor MTbs in the B or C state is not turned on even when the B cutoff voltage VBL is applied. Therefore, the potential of the sense node SEN corresponding to the memory cell transistor pair (B, B), (B, C), (C, B) or (C, C) maintains the potential corresponding to the "1" data.

In the memory cell transistor pair (B, Er), (B, A), (C, Er) or (C, A), the back side memory cell transistor MTbs can be turned on by the application of the B cutoff voltage VBL to the back side word line WLbs. Therefore, the potential of the sense node SEN corresponding to the memory cell transistor pair (B, Er), (B, A), (C, Er) or (C, A) can be the potential corresponding to the "0" data, not the expected "1" data.

FIG. 18 shows how the state is from the strobe between time t8 and time t9 shown in FIG. 11 to time t9. The sequencer 13 holds the inverted data of the data which is based on the potential of the sense node SEN in the corresponding data latch TDL in the same manner as described with reference to FIG. 15.

Further, the sequencer 13 performs logical operation ((¯CDL)&(¯BDL)&(¯TDL))|ADL and holds the result of the operation in the data latch ADL. The operator "|" means a logical product. Specifically, in each sense amplifier unit SAU, ((¯CDLC)&(¯BDLC)&(¯TDLC))|ADLC is performed on the corresponding data latch circuits CDLC, BDLC, TDLC and ADLC, and the result of the operation is held in the corresponding data latch circuit ADLC. As a result, "1" data is held in the data latch circuits ADLC corresponding to the memory cell transistor pairs (B, B), (B, C), (C, B), and (C, C), and "0" data is held in the remaining data latch circuit ADLC.

<1.2.3.3. BR Executed with. Voltage VAL Applied>

FIG. 19 shows how the state is before the strobe between time t9 and time t10 shown in FIG. 11. The same operation as shown, in FIG. 13 is performed, and as a result, each sense node SEN is charged to the potential corresponding to the "1" data.

FIG. 20 shows how the state is during the strobe between time t9 and time t10 shown in FIG. 11. The application of the BR voltage VB can turn on the selected memory cell transistor MTas in the Er or A state, and the application of the A cutoff voltage VAL can turn on the back side memory cell transistor MTbs in the Er state. Therefore, the potential of the sense node SEN corresponding to the memory cell transistor pair (Er, Er) or (A, Er) becomes a potential corresponding to the "0" data.

Although the application of the BR voltage VB can turn on the selected memory cell transistor MTas in the Er or A state, the back, side memory cell transistor MTbs in the A state maintains cutoff despite the application of the A cutoff voltage VAL. However, according to the same principle as described with reference to FIG. 14, the degree of electrical floating of the back side memory cell transistor MTbs in the A state is low. Therefore, the potential of the sense node SEN corresponding to the memory cell transistor pair (Er, A) or (A, A) also becomes a potential corresponding to the "Q" data.

Since the BR voltage VB is applied, the selected memory cell transistor MTas in the Er or A state is turned on. However, even when the A cutoff voltage VAL is applied, the back side memory cell transistor MTbs in the B or C state maintains stronger cutoff than the back side memory cell transistor MTbs in the A state. Therefore, based on the same principle as described with reference to FIG. 17, the potential of the sense node SEN corresponding to memory cell transistor pair (Er, B), (Er, C), (A, B) or (A, C) does not lower sufficiently, and can be the potential corresponding to the "1" data, not the expected "0" data.

On the other hand, the selected memory cell transistor MTas in the B or C state is not turned on even by the application of the BR voltage VB to the selected word line WLas. Further, the back side memory cell transistor MTbs in the A, B or C state is not turned on even when the A cutoff voltage VAL is applied. Therefore, the potential of the sense node SEN corresponding to the memory cell transistor pair (B, A), (B, B), (B, C), (C, A), (C, B) or (C, C) maintains the potential corresponding to the "1" data.

In the memory cell transistor pair (B, Er) or (C, Er), the back side memory cell transistor MTbs can be turned on by the application of the A cutoff voltage VAL to the back side word line WLbs. Therefore, the potential of the sense node SEN corresponding to the memory cell transistor pair (B, Er) or (C, Er) can be the potential corresponding to the "0" data, not the expected "1" data.

FIG. 21 shows how the state is from the strobe between time t9 and time t10 shown in FIG. 11 to time t10. The sequencer 13 holds the inverted data of the data which is based on the potential of the sense node SEN in the corresponding data latch TDL in the same manner as described with reference to FIG. 15.

Further, the sequencer 13 performs logical operation ((¯CDL)&(¯BDL)&(¯TDL))|ADL in the same manner as described with reference to FIG. 15, and holds the result of the operation in the data latch ADL. As a result, "1" data is held in the data latch circuits ADLC corresponding to the memory cell transistor pairs (B, A), (B, B), (B, C), (C, A) (C, B) and (C, C), and "0" data is held in the remaining data latch circuit ADLC.

<1.2.3.4. BR Executed with Voltage VBBL Applied>

FIG. 22 shows how the state is before the strobe between time t10 and time t11 shown in FIG. 11. The same operation as shown in FIG. 13 is performed, and as a result, each sense node SEN is charged to the potential corresponding to the "1" data.

FIG. 23 shows how the state is during the strobe between time t10 and time t11 shown in FIG. 11. Although the application of the BR voltage VB can turn on the selected memory cell transistor MTas in the Er or A state, the back side memory cell transistor MTbs in the Er state maintains cutoff despite the application of the Er cutoff voltage VBBL. However, according to the same principle as described with reference to FIG. 14, the degree of electrical floating of the back side memory cell transistor MTbs in the Er state is low. Therefore, the potential of the sense node SEN corresponding to the memory cell transistor pair (Er, Er) or (A, Er) becomes a potential corresponding to the "0" data.

Since the BR voltage VB is applied, the selected memory cell transistor MTas in the Er or A state is turned on. However, even when the Er cutoff voltage VBBL is applied, the back side memory cell transistor MTbs in the A, B or C state maintains stronger cutoff than the back side memory cell transistor MTbs in the Er state. Therefore, based on the same principle as described with reference to FIG. 17, the potential of the sense node SEN corresponding to memory cell transistor pair (Er, A), (Er, B), (Er, C), (A, A), (A, B) or (A, C) does not lower sufficiently, and can be the potential corresponding to the "1" data, not the expected "0" data.

On the other hand, the selected memory cell transistor MTas in the B or C state is not turned on even by the application of the BR voltage VB to the selected word line WLas. Further, the back side memory cell transistor MTbs is not turned on even when the Er cutoff voltage VBBL is applied. Therefore, in the memory cell transistor pair (B, Er), (B, A), (B, B), (B, C), (C, Er), (C, A), (C, B) or (C, C), a current path is not formed in any of memory cell transistors MT, and the potential of the corresponding sense node SEN maintains the potential corresponding to the "1" data.

FIG. 24 shows how the state is from the strobe between time t10 and time t11 shown in FIG. 11 to time t11. The sense amplifier 16 holds the inverted data of the data which is based on the potential of the sense node SEN in the corresponding data latch TDL in the same manner as described with reference to FIG. 15.

Further, the sequencer 13 performs logical operation ((CDL)&(BDL)&($^-$TDL))|ADL in the same manner as described with reference to FIG. 15, and holds the result of the operation in the data latch ADL. As a result, "1" data is held in the data latch circuits ADLC corresponding to the memory cell transistor pairs (B, Er), (B, A), (B, B), (B, C), (C, Er), (C, A), (C, B) and (C, C), and "0" data is held in the remaining data latch circuit ADLC.

<1.2.3.5. Acquisition of Lower Page Data>

FIG. 25 shows how the state is after time t11 shown in FIG. 11. The sequencer 13 holds the data of data latch ADL in data latch XDL, as described with, reference to FIG. 15. The data held in data latch XDL is the lower page data of the selected cell unit CU, and is output to the memory controller 2 according to an instruction supplied subsequently from the memory controller 2, for example.

<1.2.4. Data Latch States During Upper Page Read>

FIG. 26 to FIG. 50 sequentially show how data latch states are during a certain operation of the semiconductor memory device of the first embodiment. More specifically, like FIGS. 13 to 25, FIGS. 26 to 50 show how data latches XDL, CDL, BDL, ADL, TDL and SDL and the sense node SEN are during the data read from the upper page of selected cell unit CU. FIGS. 26 to 50 show how states are after time t26 shown in FIG. 12. At the time, of the state shown in FIG. 26, AR, BR and CR for the back side cell unit CU are completed, and the lower page data and the upper page data are held in data latches BDL and CDL, respectively.

The operations shown in FIGS. 26 to 50 are performed, for example, under the control of the sequencer 13. That is, the sequencer 13 is configured to execute the operations described below.

Prior to the operation shown in FIG. 26, the operation shown in FIG. 13 is performed.

<1.2.4.1. AR Executed with Voltage VCL Applied>

FIG. 26 shows how the state is after the operation shown in FIG. 13 and during the strobe between time t27 and time t28 shown in FIG. 12. Since the AR voltage VA is applied to the selected word line WLas, the selected memory cell transistor MTas in the Er state is turned on. Further, since the C cutoff voltage VCL is applied, the back side memory cell transistor MTbs in the Er, A, or B state can be turned on. Therefore, the potential of the sense node SEN corresponding to the memory cell transistor pair (Er, Er), (Er, A) or (Er, B) lowers to a potential corresponding to the "0" data.

Although the application of the AR voltage VA can turn on the selected memory cell transistor MTas in the Er state, the back side memory cell transistor MTbs in the C state maintains cutoff despite the application of the C cutoff voltage VCL. However, according to the same principle as described with reference to FIG. 14, the degree of electrical floating of the back side memory cell transistor MTbs in the C state is low. Therefore, the potential of the sense node SEN corresponding to the memory cell transistor pair (Er, C) also becomes a potential corresponding to the "0" data.

On the other hand, the selected memory cell transistor MTas in the A, B or C state is not turned on even by the application of the AR voltage VA to the selected word line WLas. Further, the back side memory cell transistor MTbs in the C state is not turned on even when the C cutoff voltage VCL is applied. Therefore, the potential of the sense node SEN corresponding to the memory cell transistor pair (A, C), (B, C) or (C, C) maintains the potential corresponding to the "1" data.

In the memory cell transistor pair (A, Er), (A, A), (A, B), (B, Er), (B, A), (B, B), (C, Er), (C, A) or (C, B), the back side memory cell transistor MTbs can be turned on by the application of the B cutoff voltage VBL to the back side word line WLbs. Therefore, the potential of the sense node SEN corresponding to the memory cell transistor pair (A, Er), (A, A), (A; B), (B, Er), (B, A), (B, B), (C, Er), (C, A) or (C, B) can be the potential corresponding to the "0" data, not the expected "1" data.

FIG. 27 shows how the state is from the strobe between time t27 and time t28 shown in FIG. 12 to time t28. The sequencer 13 holds the inverted data of the data which is based on the potential of the sense node SEN in the corresponding data latch TDL in the same manner as described with reference to FIG. 15.

Further, the sequencer 13 performs logical operation CDL&($^-$BDL)&($^-$TDL) in the same manner as described with reference to FIG. 15, and holds the result of the operation in the data latch ADL. As a result, "1" data is held in the data latch circuits ADLC corresponding to memory cell transistor pairs (A, C), (B, C) and (C, C), and "0" data is held in the remaining data latch circuits ADLC.

<1.2.4.2. AR Executed with Voltage VBL Applied>

FIG. 28 shows how the state is before the strobe between time t28 and time t29 shown in FIG. 12. The same operation as shown, in FIG. 13 is performed, and as a result, each sense node SEN is charged to the potential corresponding to the "1" data.

FIG. 29 shows how the state is during the strobe between time t28 and time t29 shown in FIG. 12. The application of the AR voltage VA can turn on the selected memory cell transistor MTas in the Er state, and the application of the B cutoff voltage VBL can turn on the back side memory cell transistor MTbs in the Er or A state. Therefore, the potential of the sense node SEN corresponding to the memory cell transistor pair (Er, Er) or (Er, A) becomes a potential corresponding to the "0" data.

Although the application of the AR voltage VA can turn on the selected memory cell transistor MTas in the Er state, the back side memory cell transistor MTbs in the B state maintains cutoff despite the application of the B cutoff voltage VBL. However, according to the same principle as described with reference to FIG. 14, the degree of electrical floating of the back side memory cell transistor MTbs in the B state is low. Therefore, the potential of the sense node SEN corresponding to the memory cell transistor pair (Er, B) also becomes a potential corresponding to the "0" data.

Since the AR voltage VA is applied, the selected memory cell transistor MTas in the Er state is turned on. However, even when the B cutoff voltage VBL is applied, the back side memory cell transistor MTbs in the C state maintains stronger cutoff than the back side memory cell transistor MTbs in the B state. Therefore, based on the same principle as described with reference to FIG. 17, the potential of the sense node SEN corresponding to memory cell transistor pair (Er, C) can be the potential corresponding to the "1" data, not the expected "0" data.

On the other hand, the selected memory cell transistor MTas in the A, B or C state is not turned on even by the application of the AR voltage VA to the selected word line WLas. Further, the back side memory cell transistor MTbs in the B or C state is not turned on even when the B cutoff voltage VBL is applied. Therefore, the potential of the sense node SEN corresponding to the memory cell transistor pair (A, B), (A, C), (B, B), (B, C), (C, B) or (C, C) maintains the potential corresponding to the "1" data.

In the memory cell transistor pair (A, Er), (A, A), (B, Er), (B, A), (C, Er) or (C, A), the back side memory cell transistor MTbs can be turned on by the application of the B cutoff voltage VBL to the back side word line WLbs. Therefore, the potential of the sense node SEN corresponding to the memory cell transistor pair (A, Er), (A, A), (B, Er), (B, A), (C, Er) or (C, A) can be the potential corresponding to the "0" data, not the expected "1" data.

FIG. 30 shows how the state is from, the strobe between time t28 and time t29 shown in FIG. 12 to time t29. The sequencer 13 holds the inverted data of the data which is based on the potential of the sense node SEN in the corresponding data latch TDL in the same manner as described with reference to FIG. 15.

Further, the sequencer 13 performs logical operation (($^-$CDL)&($^-$BDL)&($^-$TDL))|ADL in the same manner as described with reference to FIG. 15, and holds the result of the operation in the data latch ADL. As a result, "1" data, is held in the data latch circuits ADLC corresponding to memory cell transistor pairs (A, B), (A, C), (B, B), (B, C), (C, B) and (C, C), and "0" data is held in the remaining data latch circuits ADLC.

<1.2.4.3. AR Executed with Voltage VAL Applied>

FIG. 31 shows how the state is before the strobe between time t29 and time t30 shown in FIG. 12. The same operation as shown in FIG. 13 is performed, and as a result, each sense node SEN is charged to the potential corresponding to the "1" data.

FIG. 32 shows how the state is during the strobe between time t29 and time t30 shown in FIG. 12. The application of the AR voltage VA can turn on the selected memory cell transistor MTas in the Er state, and the application of the A cutoff voltage VAL can turn on the back side memory cell transistor MTbs in the Er state. Therefore, the potential of the sense node SEN corresponding to the memory cell transistor pair (Er, Er) becomes a potential corresponding to the "0" data.

Although the application of the AR voltage VA can turn on the selected memory cell transistor MTas in the Er state, the back side memory cell transistor MTbs in the A state maintains cutoff despite the application of the A cutoff voltage VAL. However, according to the same principle as described with reference to FIG. 14, the degree of electrical floating of the back side memory cell transistor MTbs in the A state is low. Therefore, the potential of the sense node SEN corresponding to the memory cell transistor pair (Er, A) also becomes a potential corresponding to the "0" data.

Since the AR voltage VA is applied, the selected memory cell transistor MTas in the Er state is turned on. However, even when the A cutoff voltage VAL is applied, the back side memory cell transistor MTbs in the B or C state maintains stronger cutoff than the back side memory cell transistor MTbs in the A state. Therefore, based on the same principle as described with reference to FIG. 17, the potential of the sense node SEN corresponding to memory cell transistor pair (Er, B) or (Er, C) can be the potential corresponding to the "1" data, not the expected "0" data.

On the other hand, the selected memory cell transistor MTas in the A, B or C state is not turned on even by the application of the AR voltage VA to the selected word line WLas. Further, the back side memory cell transistor MTbs in the A, B or C state is not turned on even when the A cutoff voltage VAL is applied. Therefore, the potential of the sense node SEN corresponding to the memory cell transistor pair (A, A), (A, B), (A, C), (B, A), (B, B), (B, C), (C, A), (C, B) or (C. C) maintains the potential corresponding to the "1" data.

In the memory cell transistor pair (A, Er), (B, Er) or (C, Er), the back side memory cell transistor MTbs can be turned on by the application of the A cutoff voltage VAL to the back side word line WLbs. Therefore, the potential of the sense node SEN corresponding to the memory cell transistor pair (A, Er), (B, Er) or (C, Er) can be the potential corresponding to the "0" data, not the expected "1" data.

FIG. 33 shows how the state is from, the strobe between time t29 and time t30 shown in FIG. 12 to time t30. The sense amplifier 16 holds the inverted data of the data which is based on the potential of the sense node SEN in the corresponding data latch TDL in the same manner as described with reference to FIG. 15.

Further, the sequencer 13 performs logical operation (($^-$CDL)&(BDL)&($^-$TDL))|ADL in the same manner as described with reference to FIG. 15, and holds the result of the operation in the data latch ADL. As a result, "1" data is held in the data latch circuits ADLC corresponding to memory cell transistor pairs (A, A), (A, B), (A, C), (B, A), (B, B), (B, C), (C, A), (C, B) and (C, C), and "0" data is held in the remaining data latch circuits ADLC.

<1.2.4.4. AR Executed with Voltage VBBL Applied>

FIG. 34 shows how the state is before the strobe between time t30 and time t31 shown in FIG. 12. The same operation as shown in FIG. 13 is performed, and as a result, each sense node SEN is charged to the potential corresponding to the "1" data.

FIG. 35 shows how the state is during the strobe between time t30 and time t31 shown in FIG. 12. Although the application of the AR voltage VA turns on the selected memory cell transistor MTas in the Er state, the back side memory cell transistor MTbs in the Er state maintains cutoff despite the application of the Er cutoff voltage VBBL. However, according to the same principle as described with reference to FIG. 14, the degree of electrical floating of the back side memory cell transistor MTbs in the Er state is low. Therefore, the potential of the sense node SEN corresponding to the memory cell transistor pair (Er, Er) becomes a potential corresponding to the "0" (data.

Since the AR voltage VA is applied, the selected memory cell transistor MTas in the Er state is turned on. However, even when the Er cutoff voltage VBBL is applied, the back side memory cell transistor MTbs in the A, B or C state maintains stronger cutoff than the back side memory cell transistor MTbs in the Er state. Therefore, based on the same principle as described with reference to FIG. 17, the potential of the sense node SEN corresponding to memory cell transistor pair (Er, A), (Er, B) or (Er, C) can be the potential corresponding to the "1" data, not the expected "0" data.

On the other hand, the selected memory cell transistor MTas in the A, B or C state is not turned on even by the application of the AR voltage VA to the selected word line WLas. Further, the back side memory cell transistor MTbs is not turned on even when the Er cutoff, voltage VBBL is applied. Therefore, in the memory cell transistor pair (A, Er), (A, A), (A, B), (A, C), (B, Er), (B, A), (B, B), (B, C), (C, Er), (C, A), (C, B) or (C, C), a current path is not formed in any of memory cell transistors MT, and the potential of the corresponding sense node SEN maintains the potential corresponding to the "1" data.

FIG. 36 shows how the state is from the strobe between time t30 and time t31 shown in FIG. 12 to time t31. The sense amplifier 16 holds the inverted data of the data which is based on the potential of the sense node SEN in the corresponding data latch TDL in the same manner as described with reference to FIG. 15.

Further, the sequencer 13 performs logical operation ((CDL)&(BDL)&(⁻TDL))|ABL in the same manner as described with reference to FIG. 15, and holds the result of the operation in the data latch ABL. As a result, "1" data is held in the data latch circuits ADLC corresponding to memory cell transistor pairs (A, Er), (A, A), (A, B), (A, C), (B, Er), (B, A), (B, B), (B, C), (C, Er), (C, A), (C, B) and (C, C), and "0" data is held in the remaining data latch circuits ADLC.

<1.2.4.5. Acquisition of XDL Data>

FIG. 37 shows how the state is after time t31 shown in FIG. 12. The sequencer 13 holds, in data latch XDL, data in which the logic of each bit of data latch ADL is inverted. Specifically, the sequencer 13 holds, in the corresponding data latch circuit XDLC, data which has the logic of the inverted logic data held in each data latch circuit ADLC.

<1.2.4.6. CR Executed with Voltage VCL Applied>

FIG. 38 shows how the state is before time t32 shown in FIG. 12. As shown in FIG. 38, the sequencer 13 holds "0" data in each of data latch circuits ADLC and TDLC. Then, the same operation as shown in FIG. 13 is performed, and as a result, each sense node SEN is charged to the potential corresponding to the "1" data.

FIG. 39 shows how the state is during the strobe between time t32 and time t33 shown in FIG. 12. Since the CR voltage VC is applied to the selected word line WLas, the selected memory cell transistor MTas in the Er, A or B state is turned on. Further, since the C cutoff voltage VCL is applied, the back side memory cell transistor MTbs in the Er, A or B state can be turned on. Therefore, the potential of the sense node SEN corresponding to the memory cell transistor pair (Er, Er), (Er, A), (Er, B), (A, Er), (A, A), (A, B), (B, Er), (B, A) or (B, B) lowers to a potential corresponding to the "0" data.

Although the application of the CR voltage VC can turn on the selected memory cell transistor MTas in the Er, A or B state, the back side memory cell transistor MTbs in the C state maintains cutoff despite the application of the C cutoff voltage VCL. However, according to the same principle as described with reference to FIG. 14, the degree of electrical floating of the back side memory cell transistor MTbs in the C state is low. Therefore, the potential, of the sense node SEN corresponding to the memory cell transistor pair (Er, C), (A, C) or (B, C) also becomes a potential corresponding to the "0" data.

On the other hand, the selected memory cell transistor MTas in the C state is not turned on even by the application of the CR voltage VC to the selected word line WLas. Further, the back side memory cell transistor MTbs in the C state is not turned on even when the C cutoff voltage VCL is applied. Therefore, the potential of the sense node SEN corresponding to the memory cell transistor pair (C, C) maintains the potential corresponding to the "1" data.

In the memory cell transistor pair (C, Er), (C, A) or (C, B), the back side memory cell transistor MTbs can be turned on by the application of the B cutoff voltage VBL to the back side word line WLbs, Therefore, the potential of the sense node SEN corresponding to the memory cell transistor pair (C, Er), (C, A) or (C, B) can be the potential corresponding to the "0" data, not the expected "1" data.

FIG. 40 shows how the state is from the strobe between time t32 and time t33 shown in FIG. 12 to time t33. The sequencer 13 holds the inverted data of the data which is based on the potential of the sense node SEN in the corresponding data latch TDL in the same manner as described with reference to FIG. 15.

Further, the sequencer 13 performs logical operation CDL&(⁻BDL)&(⁻TDL) in the same manner as described with reference to FIG. 15, and holds the result of the operation in the data latch ADL. As a result, "1" data is held in the data latch circuits ADLC corresponding to memory cell transistor pair (C, C), and "0" data is held in the remaining data latch circuits ADLC.

<1.2.4.7. CR Executed with Voltage VBL Applied>

FIG. 41 shows how the state is before the strobe between time t33 and time t34 shown in FIG. 12. The same operation as shown in FIG. 13 is performed, and as a result, each sense node SEN is charged to the potential corresponding to the "1" data.

FIG. 42 shows how the state is during the strobe between time t33 and time t34 shown in FIG. 12. The application of the CR voltage VC can turn on the selected memory cell transistor MTas in the Er, A or B state, and the application of the B cutoff voltage VBL can turn on the back side memory cell transistor MTbs in the Er or A state. Therefore, the potential of the sense node SEN corresponding to the memory cell transistor pair (Er, Er), (Er, A), (A, Er), (A, A), (B, Er) or (B, A) becomes a potential corresponding to the "0" data.

Although the application of the CR voltage VC can turn on the selected memory cell transistor MTas in the Er, A or B state, the back side memory cell transistor MTbs in the B state maintains cutoff despite the application of the B cutoff voltage VBL. However, according to the same principle as described with reference to FIG. 14, the degree of electrical floating of the back side memory cell transistor MTbs in the B state is low. Therefore, the potential of the sense node SEN corresponding to the memory cell transistor pair (Er, B), (A, B) or (B, B) also becomes a potential corresponding to the "0" data.

Although the application of CR voltage VC can turn on the selected memory cell transistor MTas in the Er, A or B state, the back side memory cell transistor MTbs in the C state maintains cutoff despite the application of B cutoff voltage VBL. Therefore, based on the same principle as described with reference to FIG. 17, the potential of the sense node SEN corresponding to memory cell transistor pair (Er, C), (A, C) or (B, C) can be the potential corresponding to the "1" data, not the expected "0" data.

On the other hand, the selected memory cell transistor MTas in the C state is not turned on even by the application of the CR voltage VC to the selected word line WLas. Further, the back side memory cell transistor MTbs in the B or C state is not turned on even when the B cutoff voltage VBL is applied. Therefore, the potential of the sense node SEN corresponding to the memory cell transistor pair (C, B) or (C, C) maintains the potential corresponding to the "1" data.

In the memory cell transistor pair (C, Er) or (C, A), the back side memory cell transistor MTbs can be turned on by the application of the B cutoff voltage VBL to the back side word line WLbs. Therefore, the potential of the sense node SEN corresponding to the memory cell transistor pair (C, Er) or (C, A) can be the potential corresponding to the "0" data, not the expected "1" data.

FIG. 43 shows how the state is from the strobe between time t33 and time t34 shown in FIG. 12 to time t34. The sense amplifier 16 holds the inverted data of the data which is based on the potential of the sense node SEN in the corresponding data latch TDL in the same manner as described with reference to FIG. 15.

Further, the sequencer 13 performs logical operation ((¯CDL)&(¯BDL)&(¯TDL))|ADL in the same manner as described with reference to FIG. 15, and holds the result of the operation in the data latch ADL. As a result, "1" data is held in the data latch circuits ADLC corresponding to memory cell transistor pairs (C, B) and (C, C), and "0" data is held in the remaining data latch circuits ADLC.

<1.2.4.8, CR Executed with Voltage VAL Applied>

FIG. 44 shows how the state is before the strobe between time t34 and time t35 shown in FIG. 12. The same operation as shown in FIG. 13 is performed, and as a result, each sense node SEN is charged to the potential corresponding to the "1" data.

FIG. 45 shows how the state is during the strobe between time t34 and, time t35 shown in FIG. 12. The application of the CR voltage VC can turn on the selected memory cell transistor MTas in the Er, A or B state, and the application of the A cutoff voltage VAL can turn on the back side memory cell transistor MTbs in the Er state. Therefore, the potential of the sense node SEN corresponding to the memory cell transistor pair (Er, Er), (A, Er) or (B, Er) becomes a potential corresponding to the "0" data.

Although the application of the CR voltage VC can turn on the selected memory cell transistor MTas in the Er, A or B state, the back side memory cell transistor MTbs in the A state maintains cutoff despite the application of the A cutoff voltage VAL. However, according to the same principle as described with reference to FIG. 14, the degree of electrical floating of the back, side memory cell transistor MTbs in the A state is low. Therefore, the potential of the sense node SEN corresponding to the memory cell transistor pair (Er, A), (A, A) or (B, A) also becomes a potential corresponding to the "0" data.

Even though the A cutoff voltage VAL is applied, the back side memory cell transistor MTbs in the A, B or C state maintains cutoff. Therefore, based on the same principle as described with reference to FIG. 17, the potential of the sense node SEN corresponding to memory cell transistor pair (Er, B), (Er, C), (A, B), (A, C), (B, B) or (B, C) can be the potential corresponding to the "1" data, not the expected "0" data.

On the other hand, the selected memory cell transistor MTas in the C state is not turned on even by the application of the CR voltage VC to the selected word line WLas. Further, the back, side memory cell transistor MTbs in the A, B or C state is not turned on even when the A cutoff voltage VAL is applied. Therefore, the potential of the sense node SEN corresponding to the memory cell transistor pair (C, A), (C, B) or (C, C) maintains the potential corresponding to the "1" data.

In the memory cell transistor pair (C, Er), the back side memory cell transistor MTbs can be turned on by the application of the A cutoff voltage VAL to the back side word line WLbs. Therefore, the potential of the sense node SEN corresponding to the memory cell transistor pair (C, Er) can be the potential corresponding to the "0" data, not the expected "1" data.

FIG. 46 shows how the state is from the strobe between time t34 and time t35 shown in FIG. 12 to time t35. The sense amplifier 16 holds the inverted data of the data which is based oil the potential of the sense node SEN in the corresponding data latch TDL in the same manner as described with reference to FIG. 15.

Further, the sequencer 13 performs logical operation ((¯CDL)&(BDL)&(¯TDL))|ADL in the same manner as described with reference to FIG. 15, and holds the result of the operation in the data latch ADL. As a result, "1" data is held in the data latch circuits ADLC corresponding to memory cell transistor pairs (C, A), (C,B) and (C,C), and "0" data is held in the remaining data latch circuits ADLC.

<1.2.4.9. CR Executed with Voltage VBBL Applied>

FIG. 47 shows how the state is before the strobe between time t35 and time t36 shown in FIG. 12. The same operation as shown in FIG. 13 is performed, and as a result, each sense node SEN is charged to the potential corresponding to the "1" data.

FIG. 48 shows how the state is during the strobe between time t35 and time t36 shown in FIG. 12. Although the application of the CR voltage VC can turn on the selected memory cell transistor MTas in the Er state, the back side memory cell transistor MTbs in the Er state maintains cutoff despite the application of the Er cutoff voltage VBBL. However, according to the same principle as described with reference to FIG. 14, the degree of electrical floating of the back side memory cell transistor MTbs in the Er state is low. Therefore, the potential of the sense node SEN corresponding to the memory cell transistor pair (Er, Er), (A, Er) or (B, Er) becomes a potential corresponding to the "0" data.

Since the CR voltage VC is applied, the selected memory cell transistor MTas in the Er, A or B state is turned on. However, even when the Er cutoff voltage VBBL is applied, the back side memory cell transistor MTbs in the A, B or C state maintains stronger cutoff than the back side memory cell transistor MTbs in the Er state. Therefore, based on the same principle as described with reference to FIG. 17, the potential of the sense node SEN corresponding to memory cell transistor pair (Er, A), (Er, B), (Er, C), (A, A), (A, B), (A, C), (B, A), (B, B) or (B, C) can be the potential corresponding to the "1" data, not the expected "0" data.

On the other hand, the selected memory cell transistor MTas in the C state is not turned on even by the application of the CR voltage VC to the selected word line WLas. Further, the back side memory cell transistor MTbs is not turned on even when the Er cutoff voltage VBBL is applied. Therefore, in the memory cell transistor pair (C, Er), (C, A), (C, B), or (C, C), a current path is not formed in any of memory cell transistors MT, and the potential of the corresponding sense node SEN maintains the potential corresponding to the "1" data.

FIG. 49 shows how the state is from the strobe between time t35 and time t36 shown in FIG. 12 to time t36. The sense amplifier 16 holds the inverted data of the data which is based on the potential of the sense node SEN in the corresponding data latch TDL in the same manner as described with reference to FIG. 15.

Further, the sequencer 13 performs logical operation ((CDL)&(BDL)&(¯TDL))|ADL in the same manner as described with reference to FIG. 15, and holds the result of the operation in the data latch ADL. As a result, "1" data is held in the data latch circuits ADLC corresponding to memory cell transistor pairs (C, Er), (C, A), (C, B) and (C, C), and, "0" data is held in the remaining data latch circuits ADLC.

<1.2.4.10. Acquisition of Upper Page Data>

FIG. 50 shows how the state is after time t36 shown in FIG. 12. The sequencer 13 performs logical operation ADL|XDL in the same manner as described with reference to FIG. 15, and holds the result of the operation in the data latch XDL. The data held in data latch XDL is the upper page data of the selected cell unit CU, and is output to the memory controller 2 according to an instruction supplied subsequently from the memory controller 2, for example.

1.3. Advantages (Effects)

According to the semiconductor memory device 1 of the first embodiment, data can be read with high accuracy, as described below.

In the semiconductor memory device 1 having the structure shown in FIGS. 5 and 6, each selected memory cell transistor MT (for example, memory cell transistor MTas) and its back, side memory cell transistor (for example, memory cell transistor MTbs) are coupled in parallel, as described above. Based on this, as an example for reference, the cutoff voltage VBB may be applied to the back, side word line WLbs during read from the selected memory cell transistor MTas. Thus, the back side memory cell transistor MTbs maintains cutoff regardless of its state. This can prevent the state of the selected memory cell transistor MTas from being incorrectly determined due to the unintentional formation of a current path through the back side memory cell transistor MTbs. However, due to the application of such a cutoff voltage VBB, the state of the selected memory cell transistor MTas may not be correctly determined, as described below.

As described with reference to FIG. 10, the threshold voltage of selected memory cell transistor MT (for example, memory cell transistor MTas) may be different before and after data is written in the corresponding back side memory cell transistor MT (for example, back side memory cell transistor MTbs). Therefore, in the data read from the selected memory cell transistor MTas performed after the data write to the back side memory cell transistor MTbs, the state of the selected memory cell transistor MTas may be determined to be different from the target state-expected when the data is written. This may lead to incorrect read of data. This phenomenon is conspicuous where the back side memory cell transistor MTb is electrically floating.

According to the first embodiment, the C cutoff voltage VCL, the B cutoff voltage VBL and the A cutoff voltage VAL are sequentially applied to the back side word, line WLbs after the read pass voltage VREAD is applied while AR, BR and CR are being executed for the selected memory cell transistor MTas. Strobe is performed while each of the A cutoff voltage VAL, the B cutoff voltage VBL and the C cutoff voltage VCL is being applied.

Therefore, the back side memory cell transistor MTbs in the C state is cut off by the application of the C cutoff voltage VCL after the state in which the channel is coupled to the cell source line CELSRC via the unselected memory cell transistor MT by the application of the read pass voltage VREAD. Since the C cutoff voltage VCL is slightly lower than the CR voltage VC, the back side memory cell transistor MTbs in the C state is not strongly cut off. As a result, the degree of electrical floating of the body of the back side memory cell transistor MTbs in the C state is suppressed. Strobe is performed in this suppressed electrically floating state. Therefore, variation in the threshold voltage due to electrical floating is suppressed while data read is being performed from the selected memory cell transistor MTas which is on the back side of the back side memory cell transistor MTbs in the C state. As a result, the state of the selected memory cell transistor MTas which is on the back side of the back side memory cell transistor MTbs in the C state can be determined more accurately than in the case of the reference example.

The suppression of the electrical floating occurs not only when the back side memory cell transistor MTbs is in the C state but also when it is in any state. That is, the back side memory cell transistor MTbs in the B state is applied with the C cutoff voltage VCL and is subsequently cut off by the application of the B cutoff voltage VBL. Therefore, the degree of electrical floating of the back side memory cell transistor MTbs in the B state is suppressed. The back side memory cell transistor MTbs in the A state is applied with the B cutoff voltage VBL and is subsequently cut off by the application of the A cutoff voltage VAL. Therefore, the degree of electrical floating of the back side memory cell transistor MTbs in the A state is suppressed. The back side memory cell transistor MTbs in the Er state is applied with the A cutoff voltage VAL and is subsequently cut off by the application of the Er cutoff voltage VBBL. Therefore, the degree of electrical floating of the back side memory cell transistor MTbs in the Er state is suppressed. Therefore, by the application of all of the C cutoff voltage VCL, the B cutoff voltage VBL, the A cutoff voltage VAL and the Er cutoff voltage VBBL, data can be read from the selected memory cell transistor MTas with high accuracy even when the back side memory cell transistor MTbs is in any of the Er, A, B and C states.

On the other hand, since the C cutoff voltage VCL, the B cutoff voltage VBL and the A cutoff voltage VAL are applied, the data obtained by strobe may have a value different from the expected value due to the influence of the back side memory cell transistor MTbs. In contrast, in the first embodiment, lower page read and upper page read are performed for the back side cell unit CU before data is read from the selected cell unit CU, and the results of these reads are held in the respective data latches (e.g., BDL and CDL). Then, the data obtained by the strobes during the application of the C cutoff voltage VCL, the B cutoff voltage VBL and the A cutoff voltage VAL and the data read from the back side memory cell transistor MTbs are subjected to a logical operation. As should be clear from FIGS. 25 and 50, the lower page data and the upper page data that are the same as the expected value can be obtained by an appropriate logical operation.

That is, as shown in FIGS. 14, 17, 20 and 23, the data obtained by the strobes (data of the sense node SEN) may be different from the expected value. However, since the logical operation is performed for the data of the data latches CDL, BDL, TDL and ADL, data equal to the expected value determined in accordance with the state of the selected memory cell transistor MTas can be obtained in the data latch XDL shown in FIG. 25.

Second Embodiment

The second embodiment is similar to the first embodiment but is different from the first embodiment, in terms of the order in which read voltages are applied. In the description below, the differences from the first embodiment will be mainly described. The description given in connection with the first embodiment applies to the points that will not be described.

The configuration of the semiconductor memory device 1 of the second embodiment is the same as that of the first embodiment (FIGS. 1 to 9). The sequencer 13 of the second embodiment is configured to perform the operations described below.

2.1. Voltages During Lower Page Read

Figure 51:
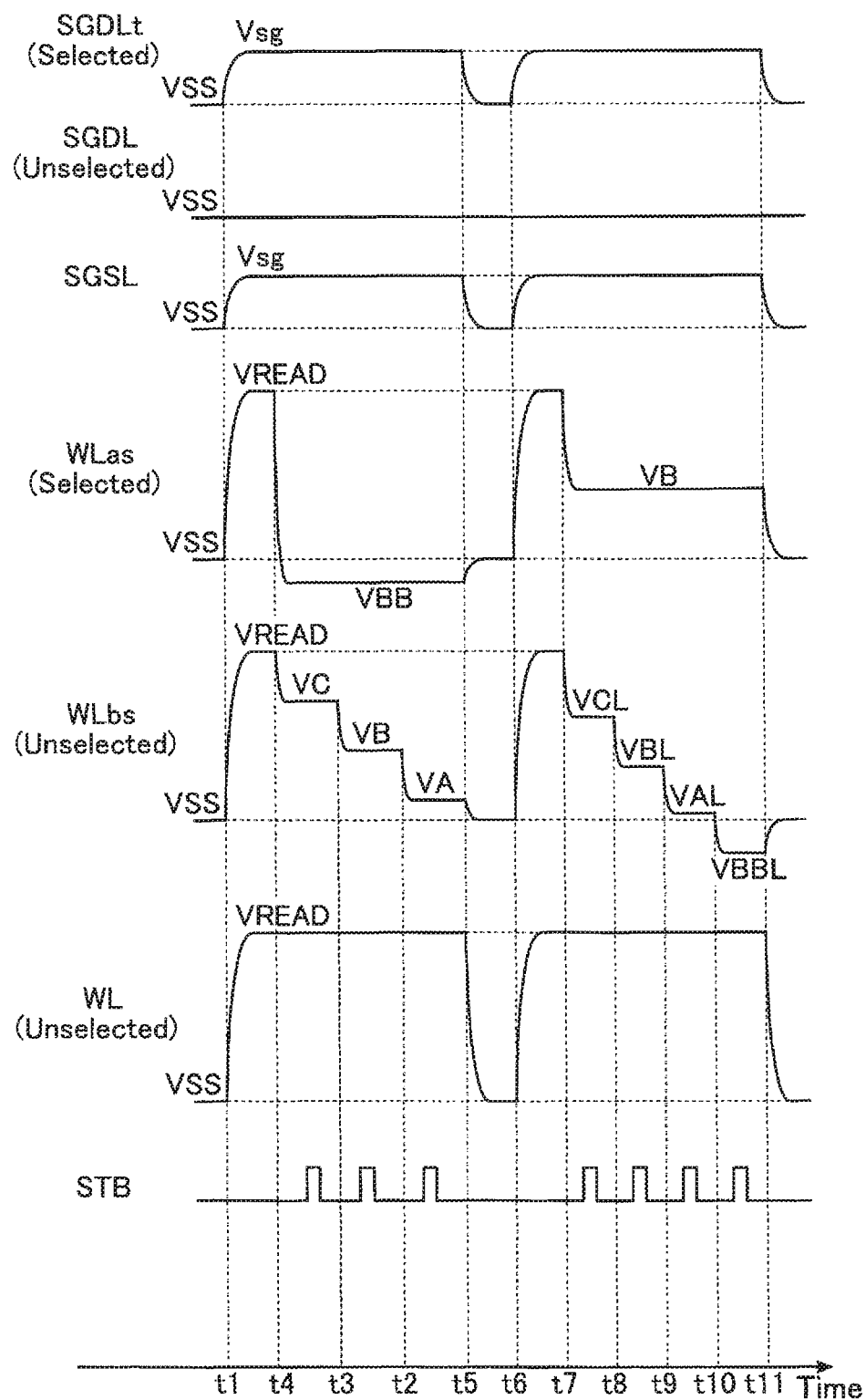
FIG. 51 shows how voltages are applied to some components with time during a certain operation of a semiconductor memory device of the second, embodiment.

FIG. 51 shows how voltages are applied to some components with time during a certain operation of the semiconductor memory device 1 of the second embodiment. Specifically, FIG. 51, similar to FIG. 11 of the first embodiment, shows voltages that are applied during read of lower page data of selected cell unit CU of selected block BLK.

As shown in FIG. 51, times t1, t4, t3, t2 and t5 come in this order.

In the description below, the application of the read voltage in the order of the CR voltage VC, the BR voltage VB and the AR voltage VA as described with reference to FIG. 51 may be referred to as the application of the read voltages in descending order.

On the other hand, the application of the read voltage in the order of the AR voltage VA, the BR voltage VB, and the CR voltage VC as described with reference to FIG. 11 may be referred to as the application of the read voltages in ascending order.

2.2. Voltages During Upper Page Read

Figure 52:
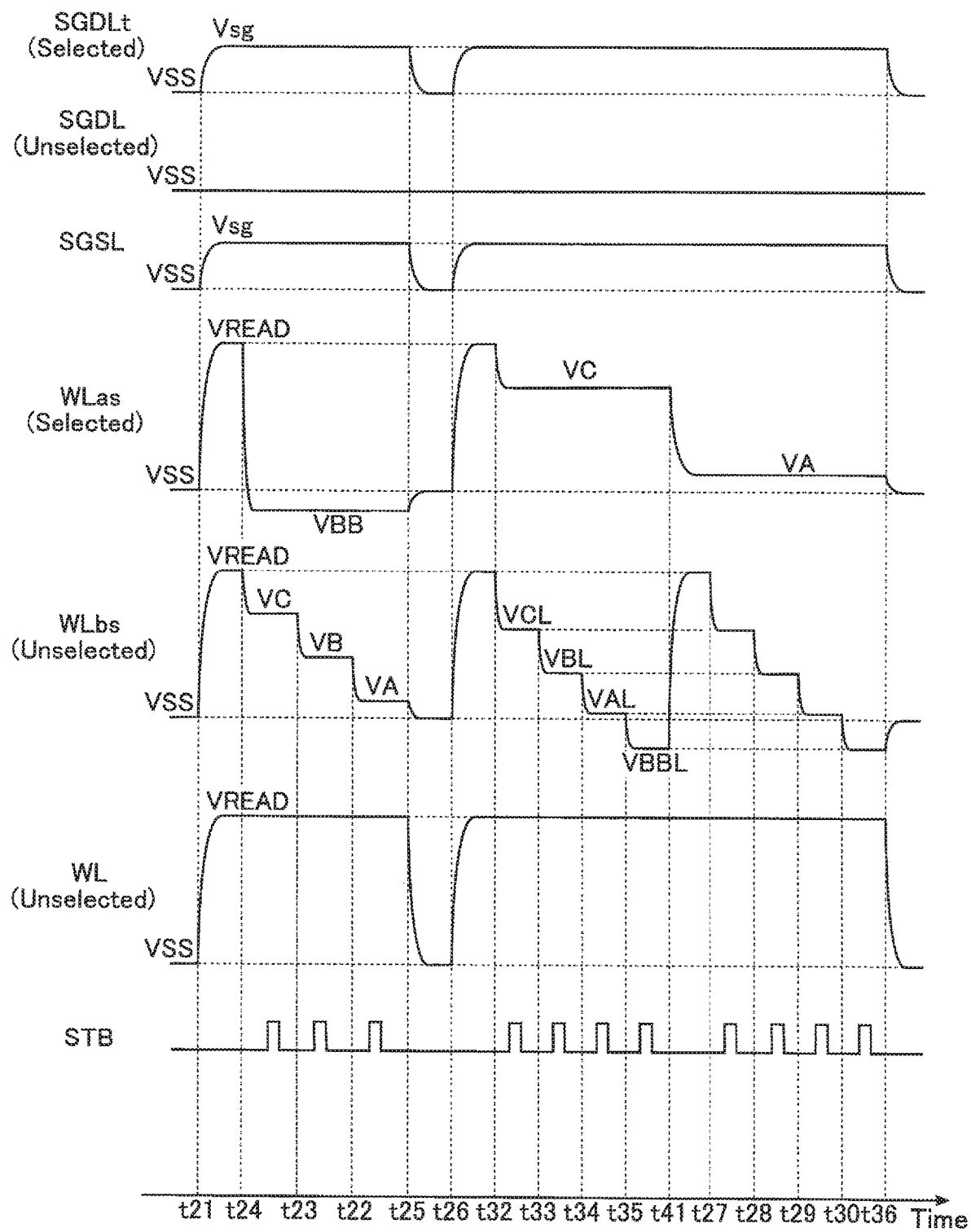
FIG. 52 shows how voltages are applied to some components with time during a certain operation of the semiconductor memory device of the second embodiment.

FIG. 52 shows how voltages are applied to some components with time during a certain operation of the semiconductor memory device 1 of the second embodiment. Specifically, FIG. 52, similar to FIG. 12 of the first embodiment, shows voltages that are applied during read of upper page data of selected cell unit CU of selected block BLK.

In the upper page read, as in the lower page read, read voltages are applied, to the back side word line WLbs in descending order. In addition, read voltages are applied to the selected word line WLas in descending order. Specifics of this will be described.

As shown in FIG. 52, time t21 is followed, by time t24, time t24 is followed by time t22, and time t22 is followed by time t25.

Time t26 is followed by time t32, and after time t32, times t33, t34 and t35 come in this order. Time t35 is followed by time t41. At time t41, the AR voltage VA is applied to the selected word line WLas, and the read pass voltage VREAD is applied to the back side word line WLbs. Time t41 is followed by time t27, and after the time t27, times t28, t29, t30 and t36 come in this order.

In the upper page read, only one of the selected word line WLas and the back side word line WLbs may be the target to which read voltages are applied in descending order.

2.3. Advantages

According to the second embodiment, while AR, BR and CR are being executed for the selected memory cell transistor MTas, the C cutoff voltage VCL, the B cutoff voltage VBL and the A cutoff voltage VAL are sequentially applied to the back side word line WLbs after the read pass voltage VREAD is applied, as in the first embodiment. Further, as in the first embodiment, the data obtained by the strobes by the application of the C cutoff voltage VCL, the B cutoff voltage VBL and the A cutoff voltage VAL and the data read from the back side memory cell transistors MTbs in advance are subjected to a logical operation. Therefore, the same advantages as those of the first embodiment are obtained.

In addition, according to the second embodiment, the read voltages are applied in descending order to read the lower page data and upper page data of the back side cell unit CU, and/or the read voltages are applied in descending order to read the upper page data of the selected cell unit CU. Since the read voltages are applied in descending order, the difference between read pass voltage VREAD and the initial read voltage is small. Therefore, the time for charging and discharging the selected word line WLas and/or the back side word line WLbs is short. Accordingly, high-speed data read is enabled.

Third Embodiment

The third embodiment is different from the first embodiment in terms of the number of cut off voltages used. In the description below, the differences from the first embodiment will be mainly described. The description given in connection with the first embodiment applies to the points that will not be described.

The configuration of the semiconductor memory device 1 of the third embodiment is the same as that of the first embodiment (FIGS. 1 to 9). The sequencer 13 of the third embodiment is configured to perform the operations described below.

3.1. Voltages During Lower Page Read

Figure 53:
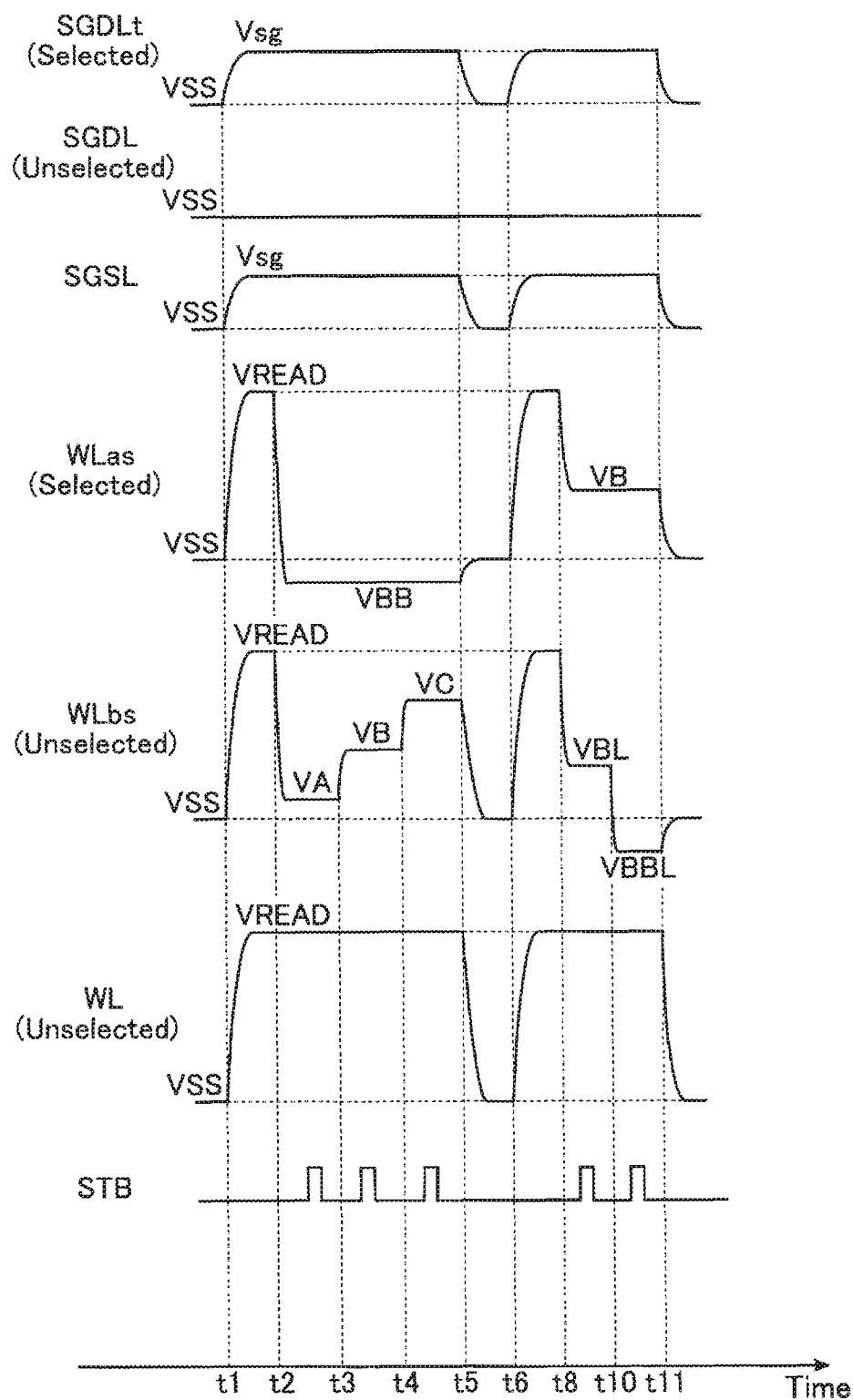
FIG. 53 shows how voltages are applied to some components with time during a certain operation of a semiconductor memory device of the third embodiment.

FIG. 53 shows how voltages are applied to some components with time during a certain operation of the semiconductor memory device 1 of the third embodiment. Specifically, FIG. 53 shows voltages that are applied during read of lower page data of selected cell unit CU of selected block BLK, and illustrates an embodiment in which some of the time intervals shown in FIG. 11 of the first embodiment are omitted.

As shown in FIG. 53, times t7 and t9 shown in FIG. 11 do not come. Times t6, t8 and t10 come in this order.

The states of the data in data, latches SDL, TDL, ADL, BDL and ADL and data latch XDL are the same as the corresponding states at each time of the first embodiment.

3.2. Voltages During Upper Page Read

Figure 54:
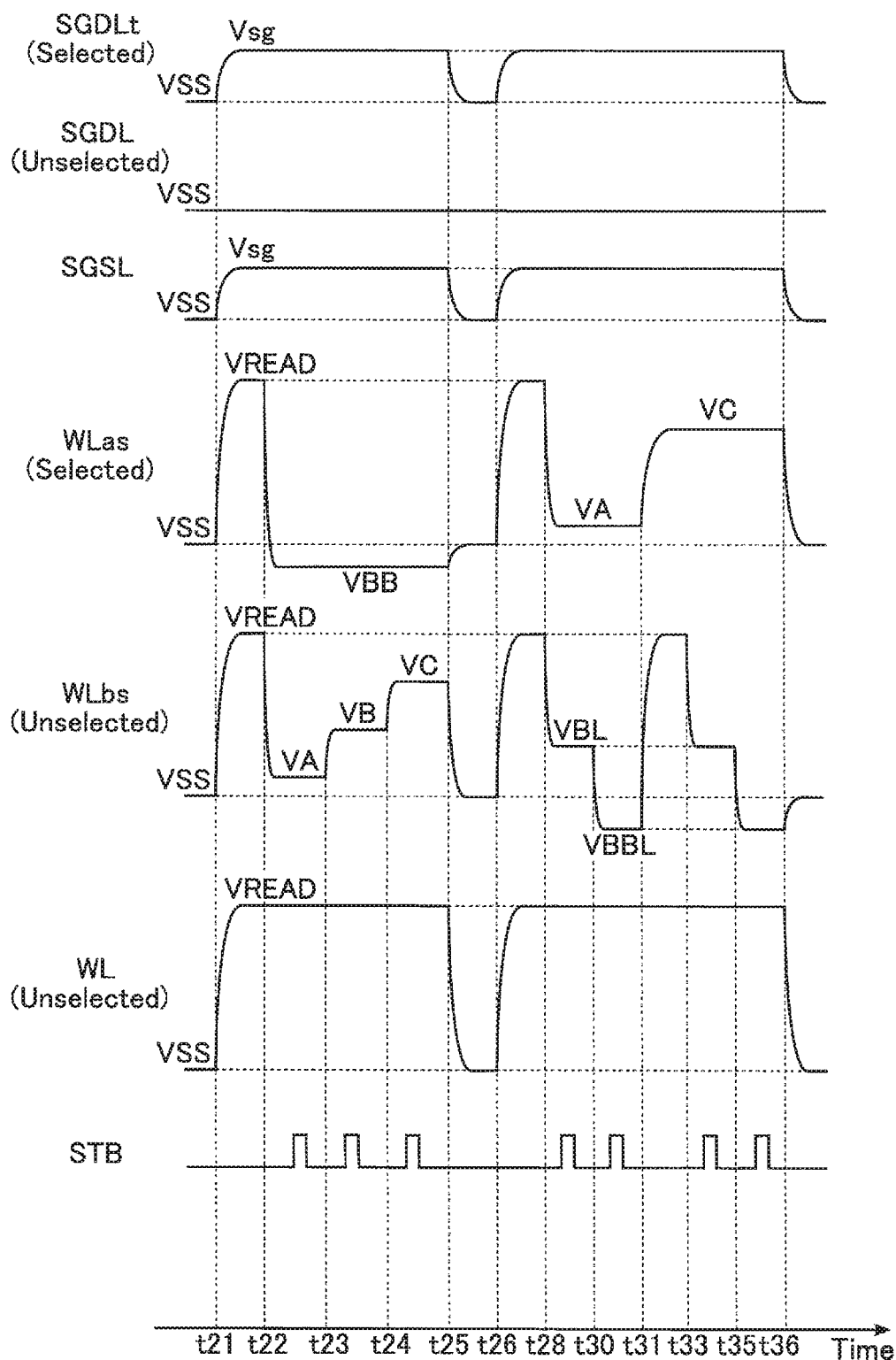
FIG. 54 shows how voltages are applied to some components with time during a, certain operation of the semiconductor memory device of the third embodiment.

FIG. 54 shows how voltages are applied to some components with time during a certain operation of the semiconductor memory device 1 of the third embodiment. Specifically, FIG. 54 shows voltages that are applied during read of upper page data of selected cell unit CU of selected block BLK, and corresponds to a version of FIG. 12 of the first embodiment with some of the time intervals omitted.

As shown in FIG. 54, times t27, t29, t32 and t34 shown in FIG. 12 do not come. Times t26, t28, t30, t31, t33 and t35 come in this order.

The states of the data in data latches SDL, TDL, ADL, BDL and ADL and data latch XDL are the same as the corresponding states at each time of the first embodiment.

3.3. Advantages

According to the third embodiment, the C cutoff voltage VCL, the B cutoff voltage VBL, the A cutoff voltage VAL and the Er cutoff voltage VBBL are applied to the back side word line WLbs while AR, BR and CR are being executed for the selected memory cell transistor MTas, as in the first embodiment. Therefore, where the back, side memory cell transistor MTbs is in the B or Ex state, the same advantages as those of the first embodiment can be obtained.

Further, according to the third embodiment, the data read from the lower page and upper page of the selected cell unit CU can be completed in a shorter time than the first embodiment.

3.4. First Modification

The description given with reference to FIGS. 53 and 54 was about an example in which the B cutoff voltage VBL and the Er cutoff voltage VBBL are applied to the back side memory cell transistor MTbs while AR, BR and CR are being executed. The third embodiment is not limited to this example, and one or more of the CJ cutoff voltage VCL, the B cutoff voltage VBL, the A cutoff voltage VAL and the Er cutoff voltage VBBL are applied to the back side word line WLbs while AR, BR and CR are being executed. In this case, the electrical floating of the back side memory cell transistor MThs in a state corresponding to the applied one of the C cutoff voltage VCL, B cutoff voltage VBL, A cutoff voltage VAL and Er cutoff voltage VBBL can be suppressed. That is, where the C cutoff voltage VCL, the B cutoff voltage VBL, the A cutoff voltage VAL, or the Er cutoff voltage VBBL is applied, the electrical floating of the back side memory cell transistor MTbs in the C, B, A, or Er state can be suppressed, respectively.

Of the C cutoff voltage VCL, the B cutoff voltage VBL, the A cutoff voltage VAL and the Er cutoff voltage VBBL, the voltage that is applied a smaller number of times enables the data read from the lower page and upper page of the selected cell unit CU to be completed in a shorter time.

3.5. Second Modifications

Figure 55:
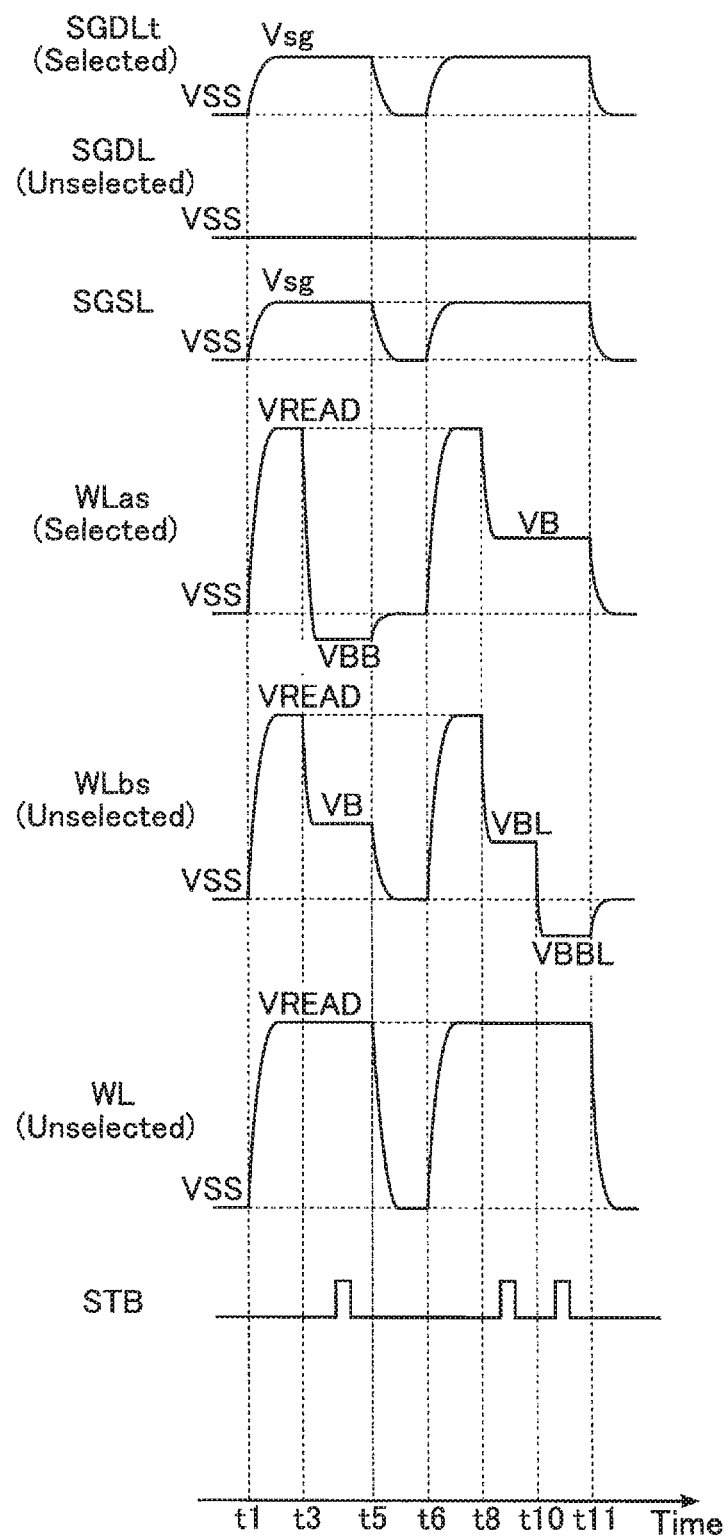
FIG. 55 shows how voltages are applied to some components with time during a certain operation of a semiconductor memory device of a modification of the third embodiment.
Figure 56:
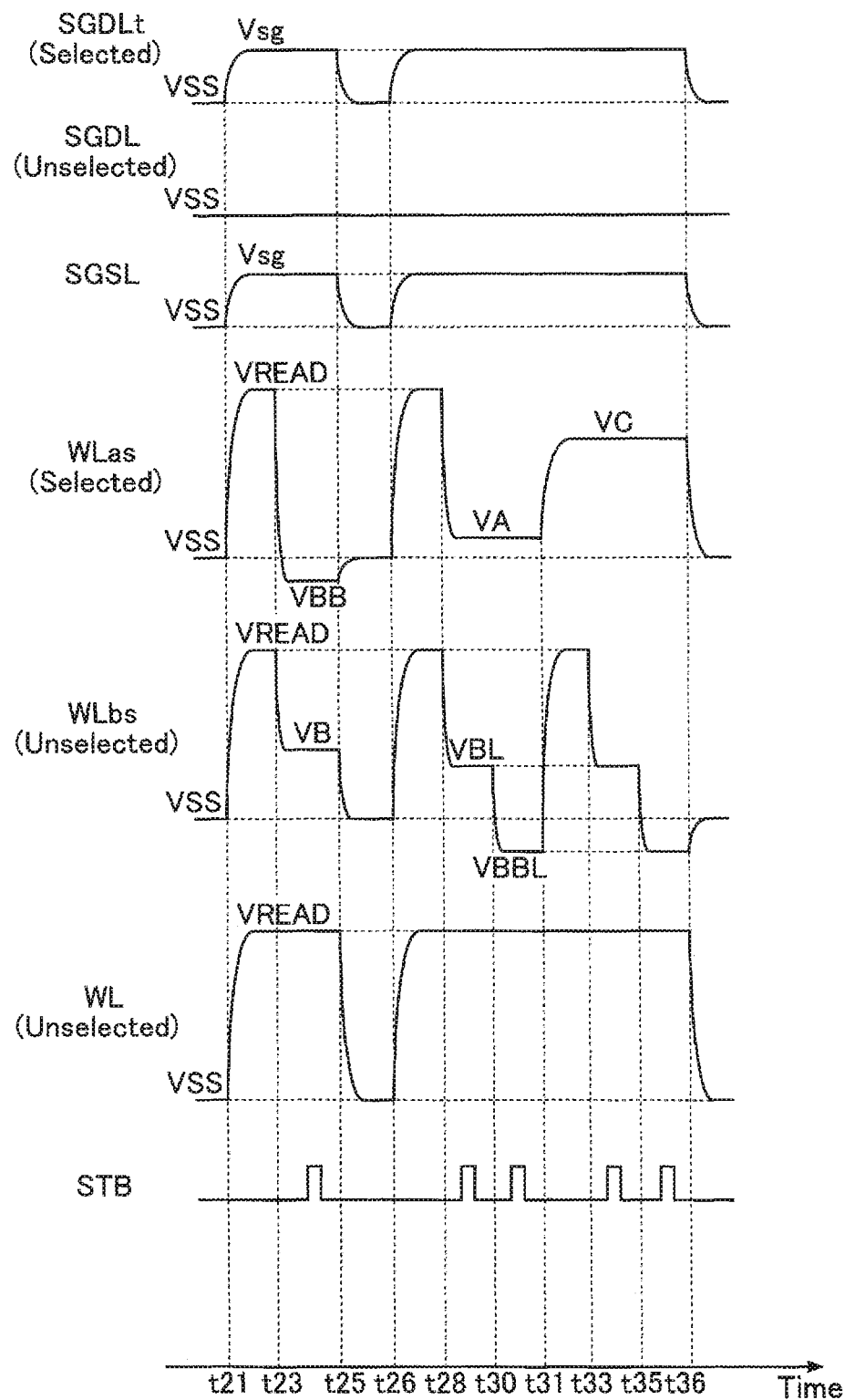
FIG. 56 shows how voltages are applied to some components with time during a certain operation of the semiconductor memory device of the modification of the third embodiment.

The number of reads performed for the back side cell unit CU may be further reduced. FIG. 55 and FIG. 56 show how voltages are applied to some components with time during a certain operation of the semiconductor memory device 1 of the second modification of the third embodiment. Specifically, FIG. 55 shows voltages that are applied during read of lower page data of selected cell unit CU of selected block BLK, and corresponds to a version of FIG. 53 of the third embodiment with some of the time intervals omitted. FIG. 56 shows voltages that are applied during read of upper page data of selected cell unit CU of selected block BLK, and corresponds to a version of FIG. 54 of the third embodiment some of the time intervals omitted f rom.

As shown in FIG. 55, times t2 and t4 shown in FIG. 53 do not come. Times t1, t3 and t5 come in this order.

As shown in FIG. 56, times t22 and t24 shown in FIG. 12 do not come. Times t21, t23, t25 and t26 come in this order.

According to the second modification, only BR is executed for the back side cell unit CU. Therefore, the upper page data from the back side cell unit CU is not obtained at the time of starting the lower page read and the upper page read for the selected cell unit CU. That is, the state of the data latch at the time of starting the lower page read and the upper page read for the selected cell unit CU is a state in which "0" data is held in each bit of the data latch BDL shown in FIG. 13 of the first embodiment.

According to the second modification, the data read from the lower page and the upper page of the selected cell unit CU can be completed in a further shorter time than the first modification.

Fourth Embodiment

The fourth embodiment is an embodiment in which the second embodiment and the third embodiment are combined. In the description below, the differences from the second embodiment will be mainly described. The description given in connection with the second embodiment applies to the points that will not be described.

The configuration of the semiconductor memory device 1 of the fourth embodiment is the same as that of the first embodiment (FIGS. 1 to 9). The sequencer 13 of the fourth embodiment is configured to perform the operations described below.

4.1. Voltages During Lower Page Read

Figure 57:
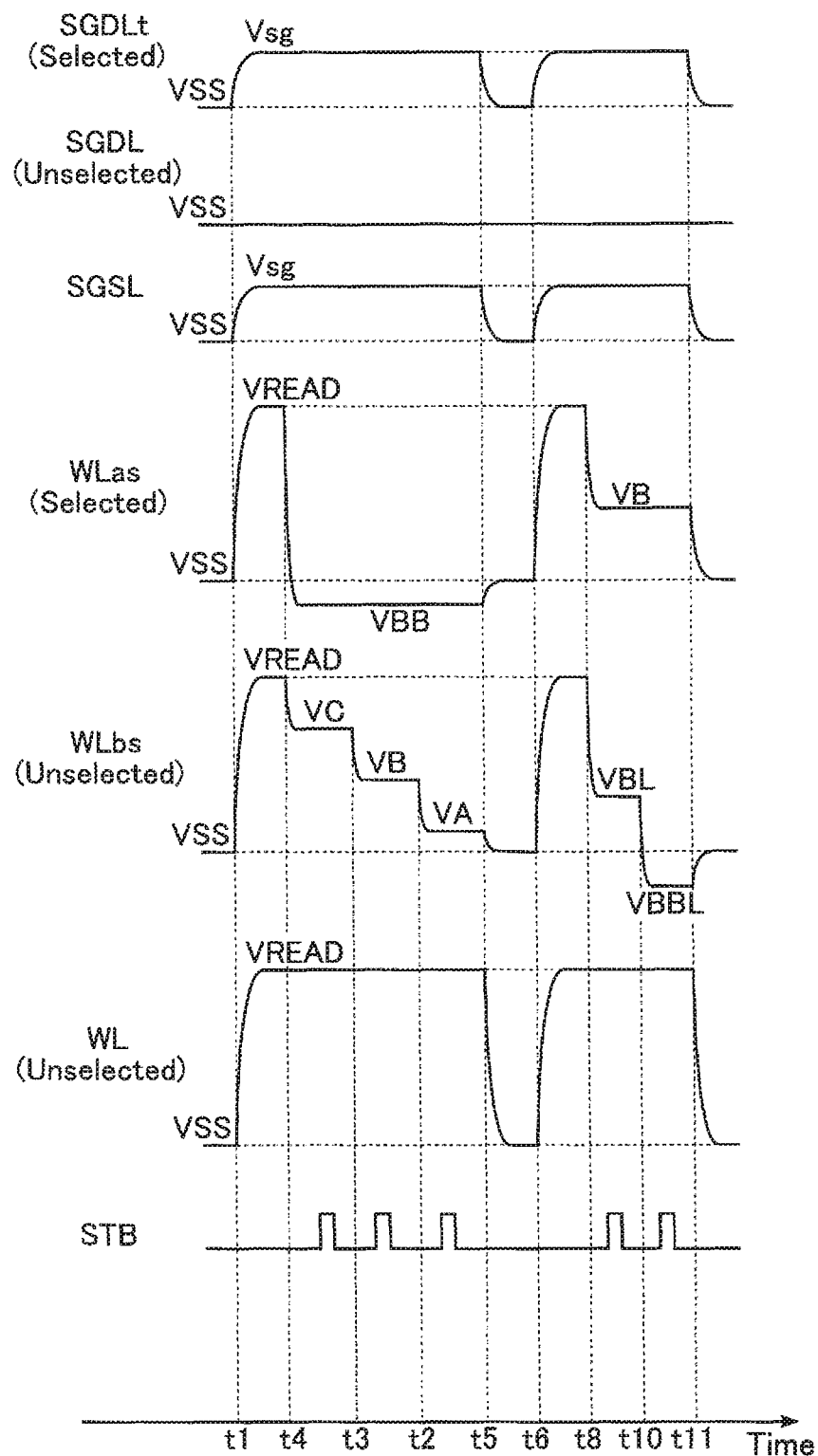
FIG. 57 shows how voltages are applied to some components with time during a certain operation of a semiconductor memory device of the fourth embodiment.

FIG. 57 shows how voltages are applied to some components with time during a certain operation of the semiconductor memory device 1 of the fourth embodiment. Specifically, FIG. 57 shows voltages that are applied during read of lower page data of selected cell unit CU of selected block BLK, and corresponds to a version of FIG. 51 of the second embodiment with some of the time intervals omitted.

As shown in FIG. 57, times t7 and t9 shown in FIG. 51 do not come. Times t6, t10 and t11 come in this order.

4.2. Voltages During Upper Page Read

Figure 58:
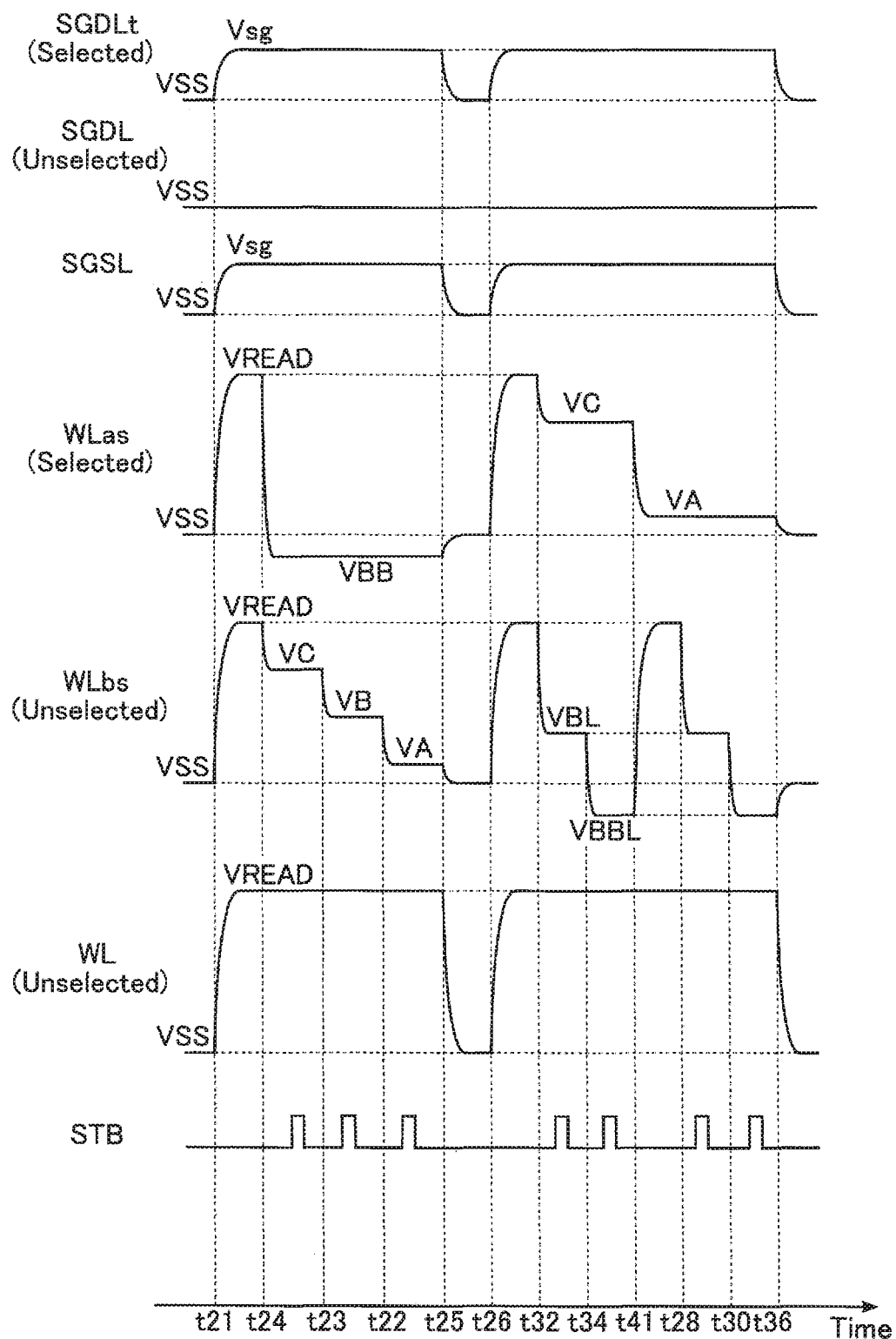
FIG. 58 shows how voltages are applied to some components with time during a certain operation of the semiconductor memory device of the fourth embodiment.

FIG. 58 shows how voltages are applied to some components with time during a certain operation of the semiconductor memory device 1 of the fourth embodiment. Specifically, FIG. 58 shows voltages that are applied during read of upper page data of selected cell unit CU of selected block BLK, and corresponds to a version of FIG. 52 of the second embodiment with some of the time intervals omitted.

As shown in FIG. 58, times t31, t33, t27 and t29 shown in FIG. 52 do not come. Times t26, t32, t34, t41, t28, t30 and t36 come in this order.

4.3. Advantages

According to the fourth embodiment, the C cutoff voltage VCL, the B cutoff voltage VBL, the A cutoff voltage VAL and the Er cutoff voltage VBBL are applied to the back side word line WLbs while AR, BR and CR are being executed for the selected memory cell transistor MTas, as in the first embodiment. Therefore, the same advantages as those of the first embodiment can be obtained.

In addition, according to the fourth embodiment, the read voltages are applied in descending order to read the lower page data and upper page data of the back side cell unit CU, and/or the read voltages are applied in descending order to read the upper page data of the selected cell unit CU, as in the second embodiment. Therefore, the same advantages as those of the second embodiment are obtained.

4.4. Modification

As the fourth embodiment, the second modification and the first modification and/or second modification of the third embodiment can be combined together.

Where 2 bits are stored in one cell transistor MT, as in the present example, the lower page read includes only-one read, that is, BR. Therefore, where the fourth embodiment is a combination with the second modification of the third embodiment, the voltage waveforms are the same as those of the second modification (FIG. 55) of the third embodiment.

Figure 59:
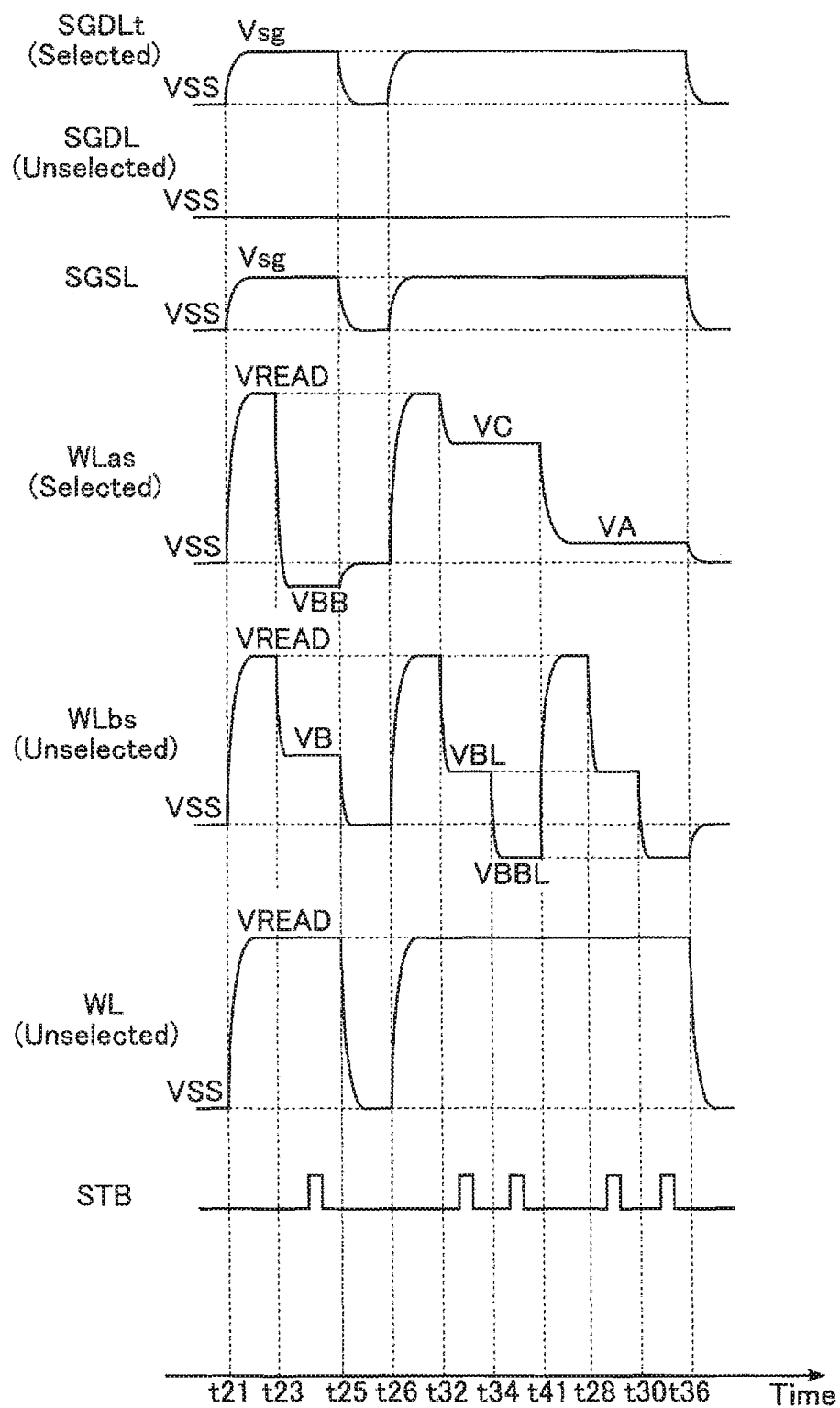
FIG. 59 shows how voltages are applied to some components with time during a certain operation of a semiconductor memory device of a modification of the fourth embodiment.

FIG. 59 shows how voltages are applied to some components with time during a certain operation of a semiconductor memory device of a modification of the fourth embodiment, and illustrates the case where the fourth embodiment is combined with the second modification of the third embodiment. Specifically, FIG. 59 shows voltages that are applied during read of upper data of selected cell unit CU of selected block BLK.

As shown in FIG. 59, times t24, t22, t31, t32, t33, t27 and t29 shown in FIG. 52 do not come. Times t21, t23, t25, t26, t32, t34, t41, t28, t30 and t36 come in this order.

According to the modification, the same advantages as those of the first and/or second modification of the third embodiment can be obtained.

Fifth Embodiment

The fifth embodiment is similar to the first embodiment. According to the fifth embodiment, the voltage to the selected word line WL is changed during one read. In the description below, the differences from the first embodiment will be mainly described. The description given in connection with the first embodiment applies to the points that will not be described.

The configuration of the semiconductor memory device 1 of the fifth embodiment is the same as that of the first embodiment (FIGS. 1 to 9). The sequencer 13 of the fifth embodiment is configured to perform the operations described below.

5.1. Voltages During Lower Page Read

Figure 60:
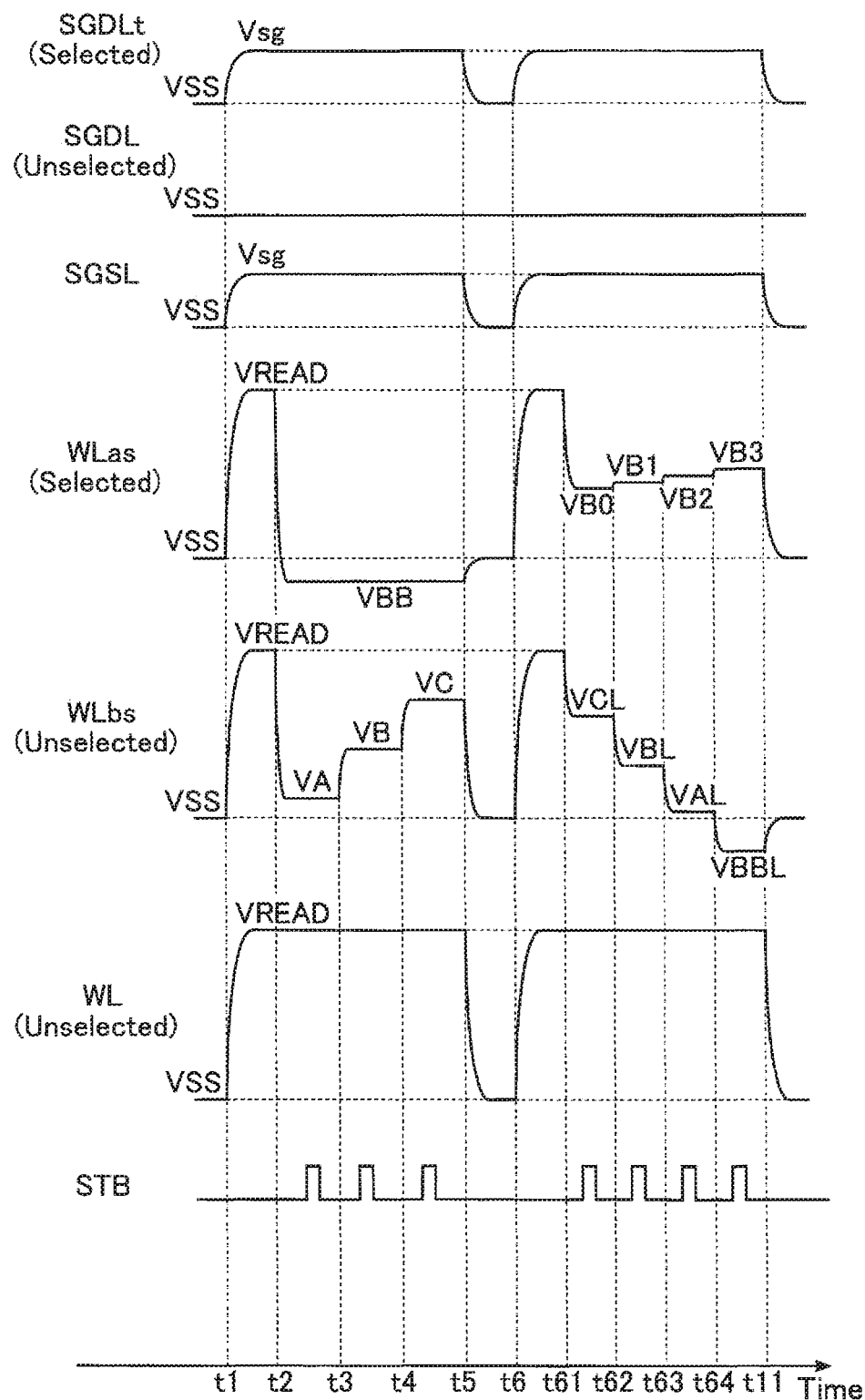
FIG. 60 shows how voltages are applied to some components with time during a certain operation of a semiconductor memory device of the fifth embodiment.

FIG. 60 shows how voltages are applied to some components with time during a certain operation of the semiconductor memory device 1 of the fifth embodiment. Specifically, FIG. 60, similar to FIG. 11 of the first embodiment, shows voltages that are applied during read of lower page data of selected cell unit CU of selected block BLK.

According to the fifth, embodiment, BR voltages VB0, VB1, VB2 and VB3 are sequentially applied to the selected word line WLas during BR, BR voltages VB0, VB1, VB2 and VB3 have relationships VB0<VB1<VB2<VB3. For example, one of BR voltages VB0, VB1, VB2 and VB3 is equal to BR voltage VB.

As shown in FIG. 60, times t61, t62, t63 and t64 come instead of times t7, t8, t9 and t10 shown in FIG. 11 of the first embodiment, respectively.

At time t61, the sequencer 13 applies BR voltage VB0 to the selected word line WLas. The application of BR voltage VB0 continues until time t62. The voltages that are applied to the other interconnects at time t61 are the same as those applied at time t7.

At time t62, the sequencer 13 applies BR voltage VB1 to the selected word line WLas. The application of BR voltage VB1 continues until time t63. The voltages that are applied to the other interconnects at time t62 are the same as those applied at time t8.

At time t63, the sequencer 13 applies BR voltage VB2 to the selected word line WLas. The application of BR voltage VB2 continues until time t64. The voltages that are applied to the other interconnects at time t63 are the same as those applied at time t9.

At time t64, the sequencer 13 applies BR voltage VB3 to the selected word line WLas. The application of BR voltage VB3 continues until time t11. The voltages that are applied to the other interconnects at time t64 are the same as those applied at time t10.

Thus, while the C cutoff voltage VCL, the B cutoff voltage VBL, the A cutoff voltage VAL and the Er cutoff voltage VBBL are being applied during BR, BR voltages VB0, VB1, VB2 and VB3 are applied to the selected word line WLas, respectively.

5.2. Voltages During Upper Page Read

Figure 61:
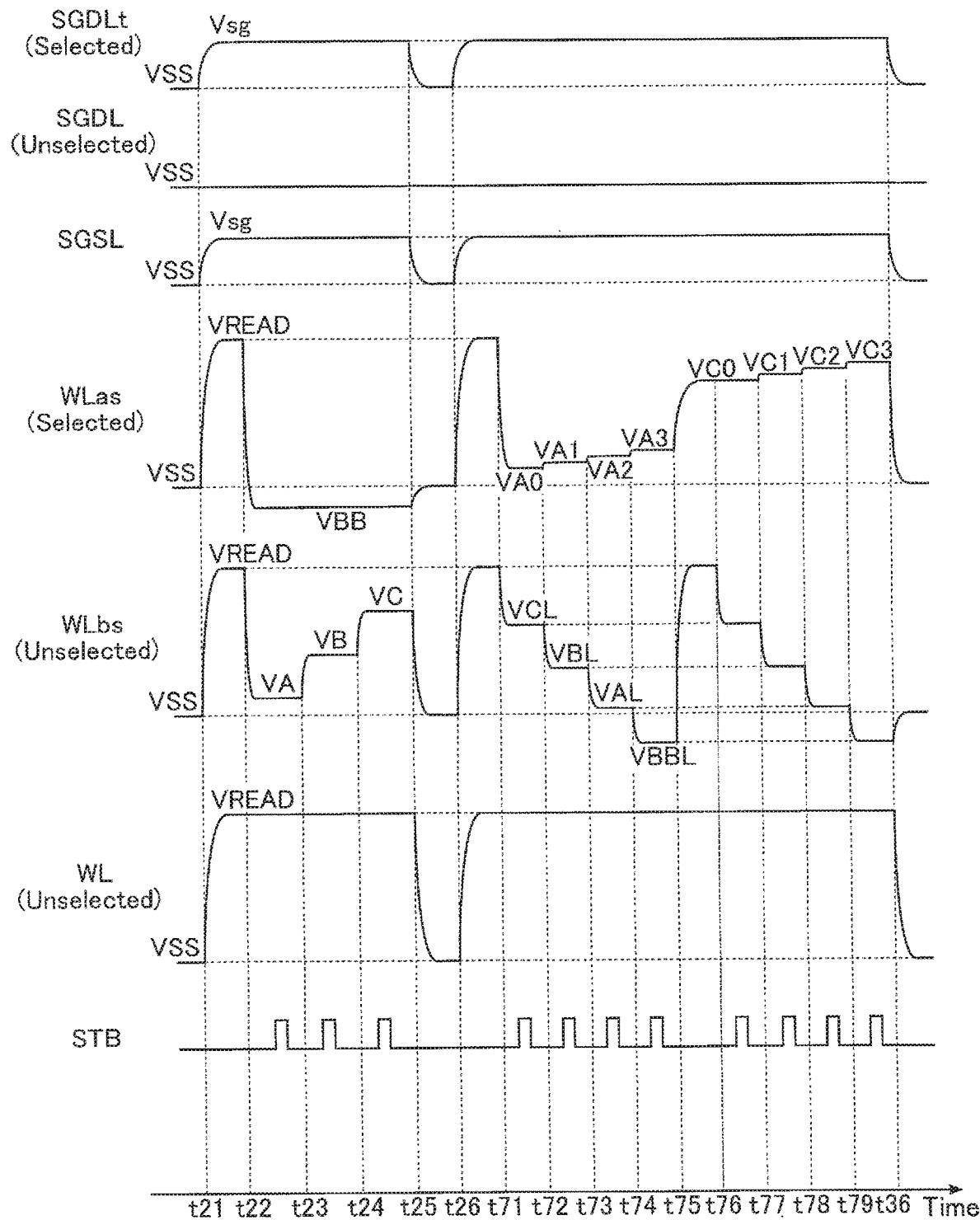
FIG. 61 shows how voltages are applied to some components with time during a certain operation of the semiconductor memory device of the fifth embodiment.

FIG. 61 shows how voltages are applied to some components with, time during a certain operation of the semiconductor memory device 1 of the fifth embodiment. Specifically, FIG. 61, similar to FIG. 12 of the first embodiment, shows voltages that are applied during read of lower page data of selected cell unit CU of selected block BLK.

According to the fifth embodiment, AR voltages VA0, VA1, VA2 and VA3 are sequentially applied to the selected word line WLas during AR. AR voltages VA0, VAX, VA2 and VA3 have relationships VA0<VA1<VA2<VA3. For example, one of AR voltages VA0, VA1, VA2 and VA3 is equal to AR voltage VA.

Likewise, CR voltages VC0, VC1, VC2 and VC3 are sequentially applied to the selected word line WLas during CR. CR voltages VC0, VC1, VC2 and VC3 have relationships VC0<VC1<VC2<VC3. For example, one of CR voltages VC0, VC1, VC2 and VC3 is equal to CR voltage VC.

As shown in FIG. 61, times t71, t72, t73, t74, t75, t76, t77, t78 and t79 come instead, of times t27, t28, t29, t30, t31, t32, t33, t34 and t35 shown in FIG. 12 of the first embodiment, respectively.

At time t71, the sequencer 13 applies AR voltage VA0 to the selected word line WLas. The application of AR voltage VA0 continues until time t72. The voltages that are applied to the other interconnects at time t71 are the same as those applied at time t27.

At time t72, the sequencer 13 applies AR voltage VA1 to the selected word line WLas. The application of AR voltage VA1 continues until time t73. The voltages that are applied to the other interconnects at time t72 are the same as those applied at time t28.

At time t73, the sequencer 13 applies AR voltage VA2 to the selected word line WLas. The application of AR voltage VA2 continues until time t74. The voltages that are applied to the other interconnects at time t73 are the same as those applied at time t29.

At time t74, the sequencer 13 applies AR voltage VA3 to the selected word line WLas. The application of AR voltage VA3 continues until time t75. The voltages that are applied to the other interconnects at time t74 are the same as those applied at time t30.

At time t75, the sequencer 13 applies CR voltage VC0 to the selected word line WLas. The application of CR voltage VC0 continues until time t77. The voltages that are applied to the other interconnects at time t75 are the same as those applied at time t31.

At time 176, the sequencer 13 applies the C cutoff voltage VCL to the back side word line WLbs. The application of C cutoff voltage VCL continues until time t77.

At time t77, the sequencer 13 applies CR voltage VC1 to the selected, word, line WLas. The application of CR voltage VC1 continues until time t78. The voltages that are applied to the other interconnects at time t77 are the same as those applied at time t33.

At time t78, the sequencer 13 applies CR voltage VC2 to the selected word line WLas. The application of CR voltage VC2 continues until time t79. The voltages that are applied to the other interconnects at time t78 are the same as those applied at time t34.

At time 179, the sequencer 13 applies CR voltage VC3 to the selected word line WLas. The application of CR voltage VC3 continues until time t36. The voltages that are applied to the other interconnects at time t79 are the same as those applied at time t35.

Thus, while the C cutoff voltage VCL, the B cutoff voltage VBL, the A cutoff voltage VAL and the Er cutoff voltage VBBL are being applied during AR, AR voltages VA0, VA1, VA2 and VA3 are applied to the selected word line WLas, respectively. Likewise, while the C cutoff voltage VCL, the B cutoff voltage VBL, the A cutoff voltage VAL and the Er cutoff voltage VBBL are being applied during CR, CR voltages VC0, VC1, VC2 and VC3 are applied to the selected word line WLas, respectively.

5.3. Advantages

According to the fifth embodiment, the C cutoff voltage VCL, the B cutoff voltage VBL, the A cutoff voltage VAL and the Er cutoff voltage VBBL are applied to the back side word line WLbs while AR, BR and CR are being executed for the selected memory cell transistor MTas, as in the first embodiment. Therefore, the same advantages as those of the first embodiment can be obtained.

In addition, according to the fifth embodiment, the following advantages can be obtained. Where the C cutoff voltage VCL, the B cutoff voltage VBL, the A cutoff voltage VAL and the Er cutoff voltage VBBL are applied to the back side memory cell transistor MTbs, as in the first embodiment, the selected memory cell transistor MTas may be turned on by the application of voltage lower than the threshold voltage of that selected memory cell transistor Tas to selected word line WLas. For example, the selected memory cell transistor MTas may be unintentionally turned on when voltage Vth1-ΔV is applied to the selected word line WLas even though the selected memory cell transistor MTas has threshold voltage Vth1. In other words, the apparent threshold voltage of the selected memory cell transistor MTas is lower than the actual threshold voltage. How much the apparent threshold voltage of the selected memory cell transistor MTas appears low depends on how high the threshold voltage of the back side memory cell transistor MTbs is. In other words, the higher the threshold voltage of the back side memory cell transistor MTbs, the larger the difference between the actual threshold, voltage of the selected memory cell transistor MTas and the apparent threshold voltage thereof.

According to the fifth embodiment, where X represents case A, B or C, XR voltages VX0, VX1, VX2, and VX3 are applied while the C cutoff voltage VCL, the B cutoff voltage VBL, the A cutoff voltage VAL and the Er cutoff voltage VBBL are being applied, respectively. As described in connection with the first embodiment, the influence of floating is suppressed when the back side memory cell transistor MT of the selected memory cell transistor MTas is in the C state by the strobe performed with the C cutoff voltage VCL applied. As a result, the data of the selected memory cell transistor MTas can be correctly read. During this period, the XR voltage VX0 is applied to the selected word line WLas. Where the XR voltage VX0 is made lower than the XR voltage VX, the selected memory cell transistor MTas having memory cell transistor MT in the C state on its back side is prevented from being turned on by a voltage lower than the threshold voltage during XR executed with the C cutoff voltage VCL applied. In this manner, the state of the selected memory cell transistor MTas can be correctly determined.

Such an advantage can be obtained by applying the XR voltages VX1 VX2 and VX3 also when the back side memory cell transistor MTbs is in the B, A or Er state, respectively.

5.4. Modifications

During XR, one or more of XR voltages VXD, VX1, VX2 and VX3 may be used. In this case, a standard XR voltage VX can be used instead of an unused voltage of the XR voltages VX0, VX1, VX2 and VX3.

In one or more of AR, BR, and CR, one or more of the corresponding XR voltages VX0, VX1, VX2 and VX3 may be used.

The fifth embodiment can also be applied to the second, third, and/or fourth embodiments.

Sixth Embodiment

The sixth embodiment is similar to the first embodiment but is different from the first embodiment in terms of the order in which read of the selected memory cell transistor MTas and read of the back side memory cell transistor MTbs are performed. In the description below, the differences from the first embodiment will be mainly described. The description given in connection with the first embodiment applies to the points that will not be described.

The configuration of the semiconductor memory device 1 of the sixth embodiment is the same as that of the first embodiment (FIGS. 1 to 9). The sequencer 13 of the sixth embodiment is configured to perform the operations described below.

6.1. Voltages During Lower Page Read

Figure 62:
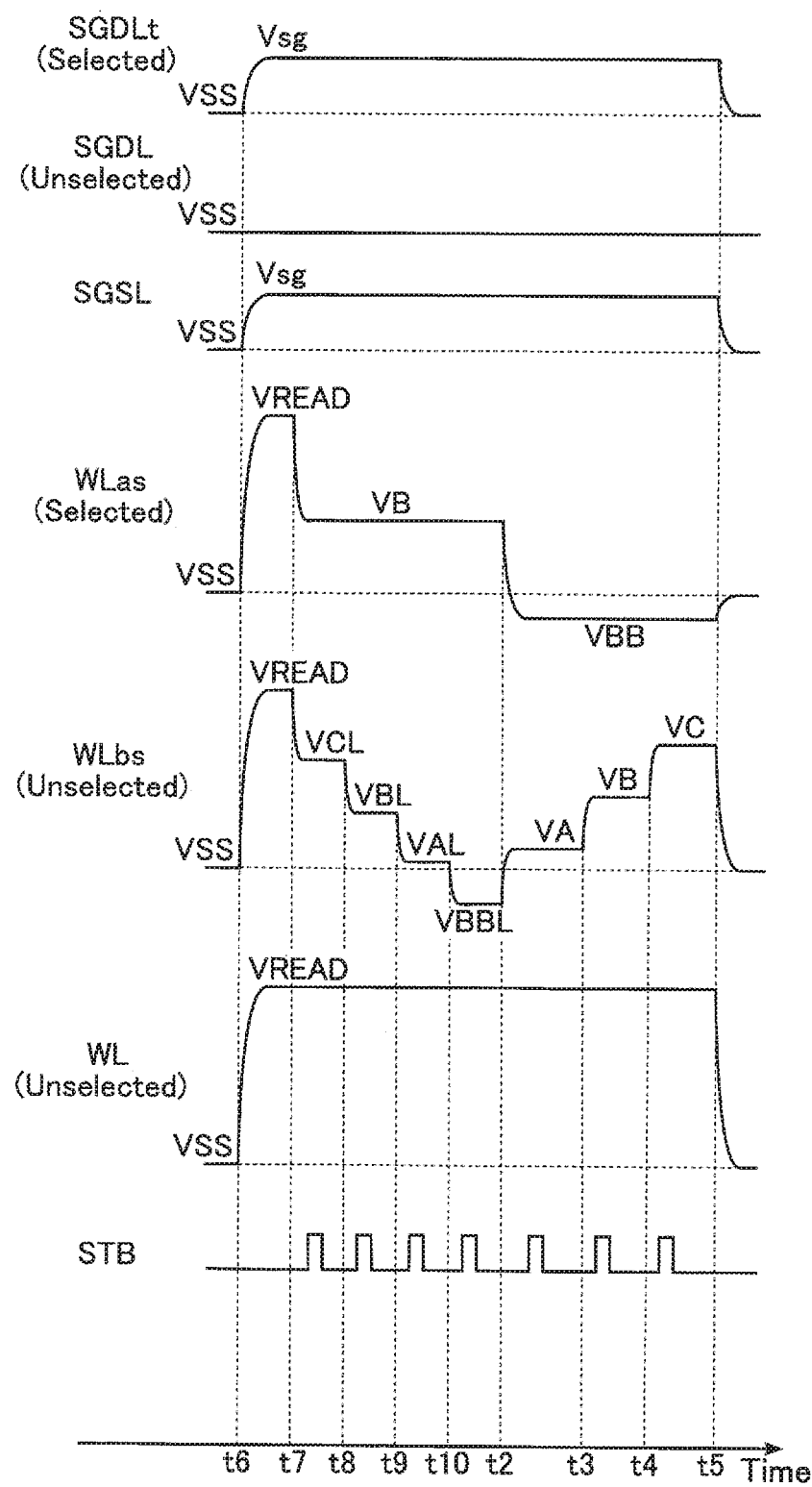
FIG. 62 shows how voltages are applied to some components with time during a certain operation of a semiconductor memory device of the sixth embodiment.

FIG. 62 shows how voltages are applied to some components with time during a certain operation of the semiconductor memory device 1 of the sixth embodiment. Specifically, FIG. 62 shows voltages that are applied during read, of lower page data of selected cell unit CU of selected block BLK.

In the sixth embodiment, data is first read from the selected memory cell transistor MTas, and then data is read from the back side memory cell transistor MTbs.

As shown in FIG. 62, times t6, t7, t8, t9, t10, t2, t3, t4, and t5 come in this order. That is, data is read from the lower page of the selected cell unit CU by the operation from time t6 to time t2, and then data is read from the back side cell unit CU by the operation from time t2 to time t5.

In the sixth embodiment, data read is performed in the order of the selected cell unit CU and the back side cell unit CU, so that the data in data latches XDL, CDL, BDL, ADL and TDL changes in a different manner from that of the first embodiment. That is, the lower page data of the selected cell unit CU is held in advance in one of the data latches XDL, CDL, BDL, ADL and TDL. Thereafter, AR, BR or CR data is executed for the back side cell unit CU, and data is acquired thereby. As in the first embodiment, a logical operation is performed on the lower page data of the selected cell unit CU and the data obtained by AR, BR or CR performed for the back side cell unit CU. However, the logical operation performed in the sixth embodiment is different from the logical operation performed in the first embodiment because the type of data, to be subjected to the logical operation is different from that of the first embodiment. The logical operation performed in the sixth embodiment can be determined by any method that produces target data in light of the description given in connection with the first embodiment.

6.2. Voltages During Upper Page Read

Figure 63:
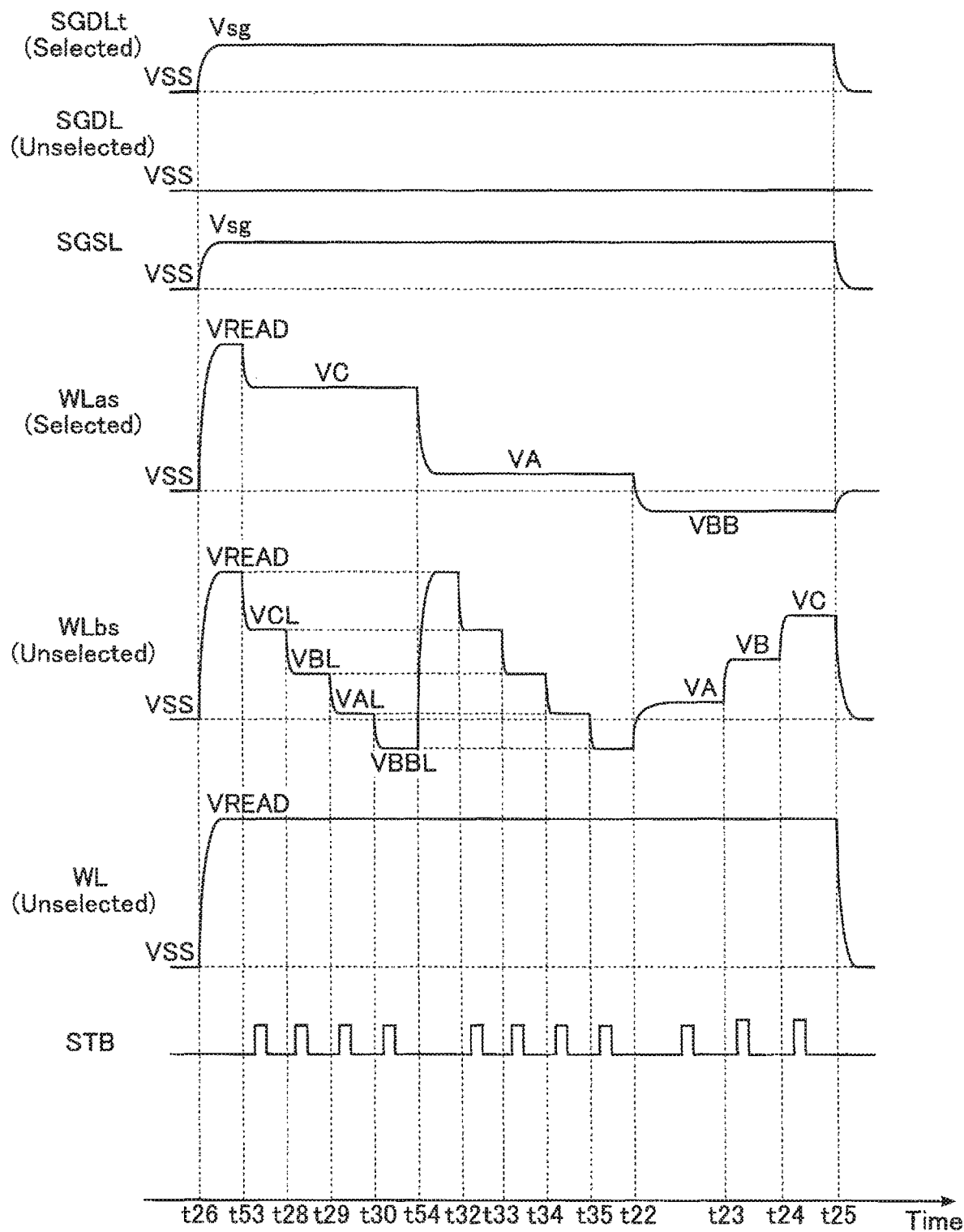
FIG. 63 shows how voltages are applied to some components with time during a certain operation of the semiconductor memory device of the sixth embodiment.

FIG. 63 shows how voltages are applied to some components with time during a certain operation of the semiconductor memory device 1 of the sixth embodiment. Specifically, FIG. 63 shows voltages that are applied during read of upper page of selected cell unit CU of selected block BLK.

As shown in FIG. 63, times t26, t32, t33, t34, t35, t41, t27, t28, t29, t30, t22, t23, t24 and t25 come in this order. That is, data is read from the upper page of the selected cell unit CU by the application of read voltages in descending order in the operation from time t26 to time t22, and then data is read from, the back side cell unit CU in the operation from time t22 to time t25.

In the upper page read as well as in the lower page read, the data. In data latches XDL, CDL, BDL, ADL and TDL changes in a different manner from that of the first embodiment. The details of the logical operation are also different from those of the first embodiment. The logical operation can be determined by any method that produces target data in light of the description given in connection with the first embodiment.

6.3. Advantages

According to the sixth embodiment, the C; cutoff voltage VCL, the B cutoff voltage VBL, the A cutoff voltage VAL and the Er cutoff voltage VBBL are applied to the back side word line WLbs while AR, BR and CR are being executed for the selected memory cell transistor MTas, as in the first embodiment. Therefore, the same advantages as those of the first embodiment can be obtained.

In addition, according to the sixth embodiment, the read voltages are applied in descending order to read the lower page data and upper page data of the back side cell unit CU, and/or the read voltages are applied in descending order to read the upper page data of the selected cell unit CELT, as in the second embodiment. Therefore, the same advantages as those of the second embodiment can be obtained.

In addition, according to the sixth embodiment, the data read for the selected cell unit CU is first performed, and then the data read for the back side cell unit CU is performed. Therefore, among the various voltages that are applied to the selected word line WLas during the data, read from the back side cell unit CU, the cutoff voltage VBB is applied last. Thus, the cutoff voltage VBB is applied a long time after the initial voltage is applied to the selected, word line WLas (at time t6 or time t26). This contributes to the stabilization of the channel potential of each selected memory cell transistor MTas. Therefore, electrical floating of each selected memory cell transistor MTas can be suppressed during the application of the Er cutoff voltage VBBL, that is, during the data read, from the back side cell unit CU. Accordingly, data can be read from each back side memory cell transistor MTbs with high reliability.

On the other hand, with respect, to the data read from the selected cell unit CU, the C cutoff voltage VCL, the B cutoff voltage VBL, the A cutoff voltage VAL and the Er cutoff voltage VBBL are applied to the back side word line WLbs, as in the first embodiment, so that, the influence of electrical floating of the back side memory cell transistor MTbs is suppressed. Furthermore, since the read voltages are applied to the selected word line WLas in descending order, as in the second embodiment, the difference between each read voltage and the voltage applied immediately before that is small. Therefore, the influence which the electrical floating of the back side memory cell transistor MTbs may have on the selected memory cell transistor MTas can be suppressed during the data read from the selected memory cell transistor MTas. Thus, the accuracy of data read from the selected memory cell transistor MTas is prevented from lowering. This advantage is particularly useful in the upper page read from the selected cell unit CU.

6.4. Modifications

The fifth embodiment may be combined with the sixth embodiment.

<6.4.1. Voltages During Lower Page Read>

Figure 64:
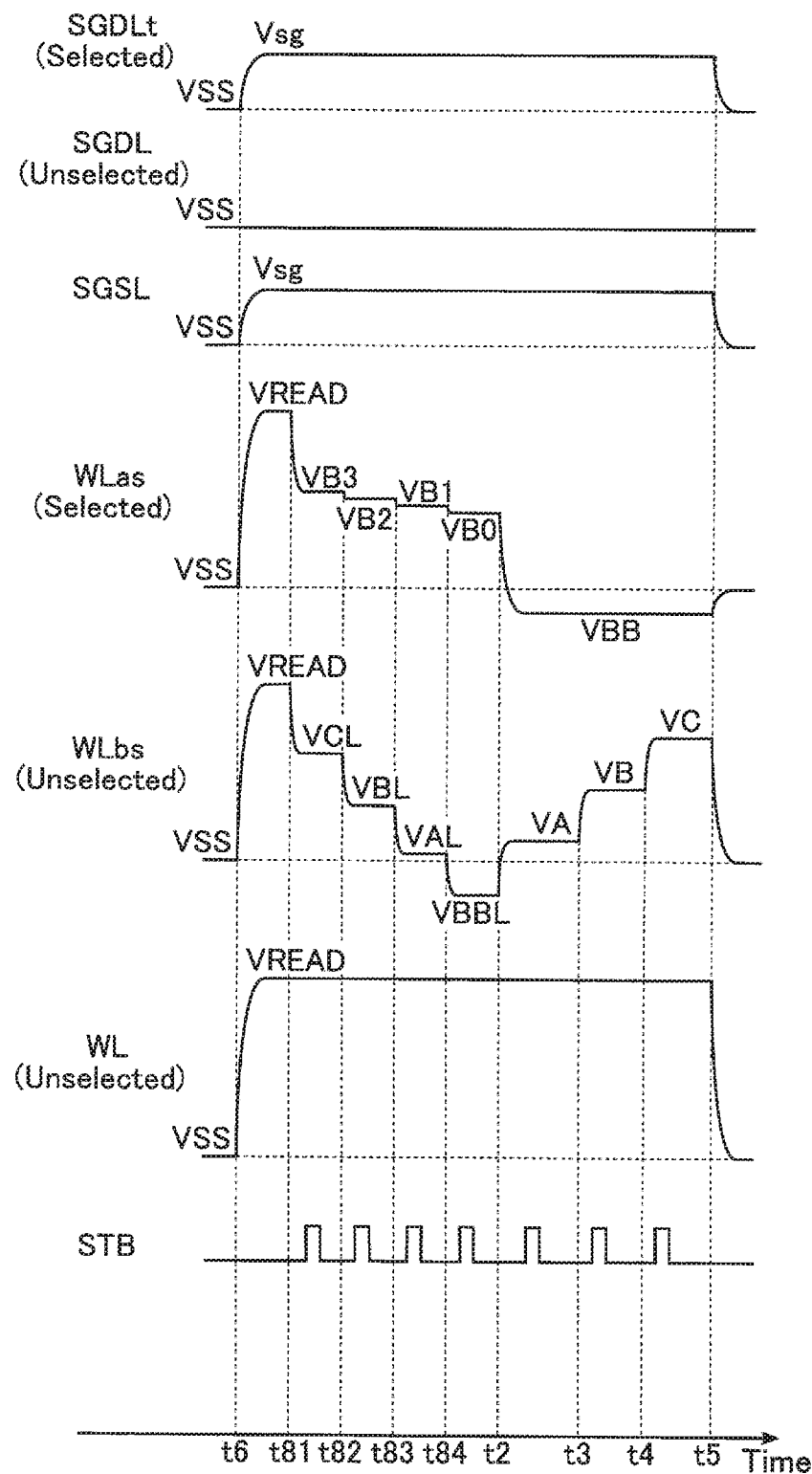
FIG. 64 shows how voltages are applied to some components with time during a certain operation of a semiconductor memory device of a modification of the sixth embodiment.

FIG. 64 shows how voltages are applied to some components with time during a certain operation of the semiconductor memory device 1 of the modification of the sixth embodiment. Specifically, FIG. 64 shows voltages that are applied during read of lower page data of selected cell unit CU of selected block. BLK.

As shown in FIG. 64, times t6, t81, t82, t83, t84, t2, t3, t4 and t5 come in this order. From time t6 to time t81, the lower page data of the back side memory cell transistor MTbs is read.

The select gate lines SGDLt and SGSL are kept applied with voltage Vsg from time t6 to time t5. The unselected select gate lines SGDL are kept applied with voltage VSS during the operation shown in FIG. 64. Of the word lines WL, those excluding the selected word line WLas and the back side word line WLbs are kept applied with read pass voltage VREAD from time t6 to time t5.

During the period including times t81, t82, t83 and t84, BR voltages VB3, VB2, VB1 and VB0 are applied in descending order, unlike the order of the fifth embodiment. Details are as follows.

From time t81 to time t82, the sequencer 13 applies the BR voltage VB3 to the selected word line WLas and applies the C cutoff voltage VCL to the back side word line WLbs. Strobe is performed between time t81 and time t82.

From time t82 to time t83, the sequencer 13 applies the BR voltage VB2 to the selected word, line WLas and applies the B cutoff voltage VBL to the back side word line WLbs. Strobe is performed between time t82 and time t83.

From time t83 to time t84, the sequencer 13 applies the BR voltage VB1 to the selected word line WLas and applies the A cutoff voltage VAL to the back side word line, WLbs. Strobe is performed between time t83 and time t84.

From time t84 to time t2, the sequencer 13 applies the BR voltage VB0 to the selected word line WLas and applies the Er cutoff voltage VBBL to the back side word line WLbs. Strobe is performed between time t84 and time t2.

<6.4.2. Voltages During Upper Page Read>

Figure 65:
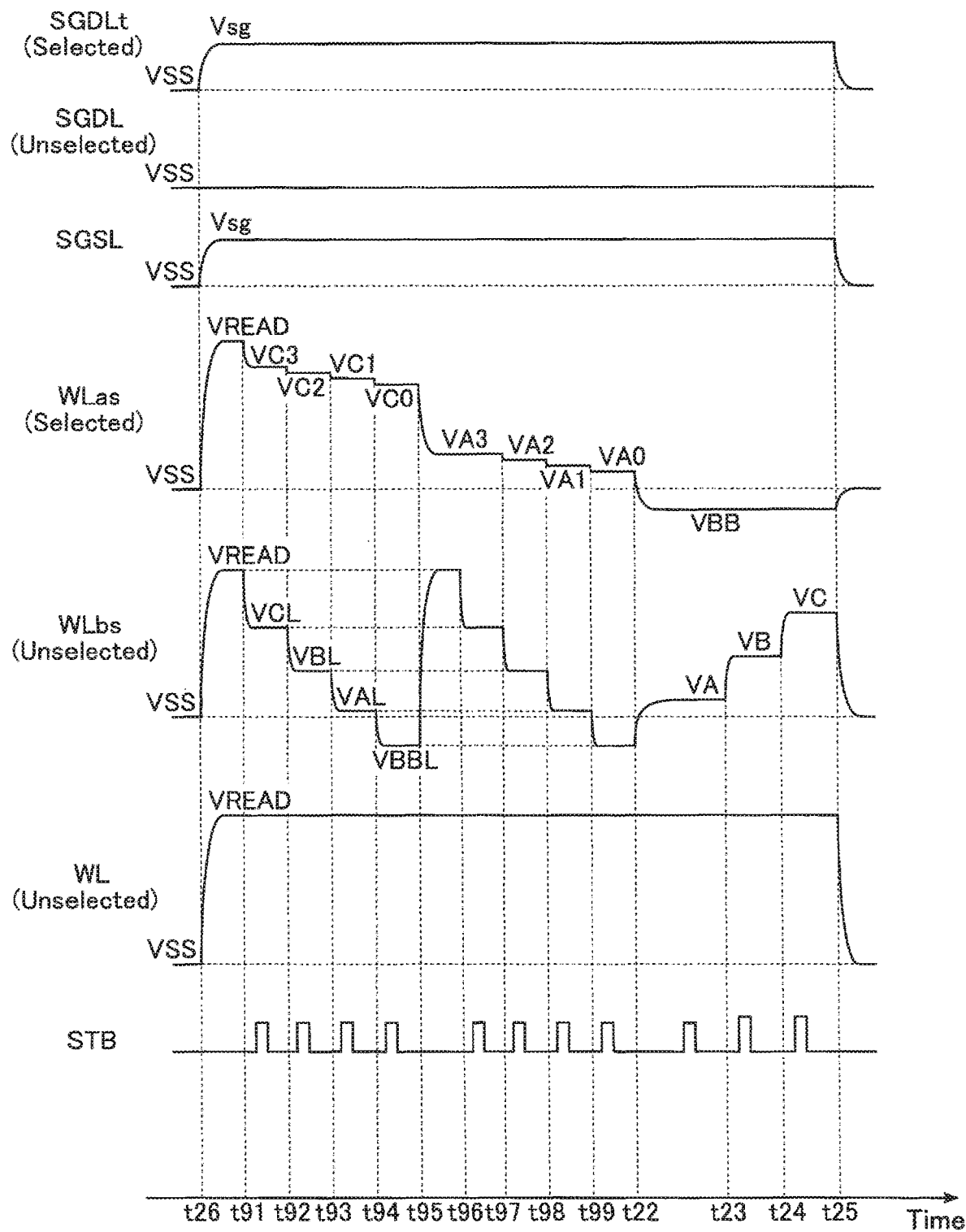
FIG. 65 shows how voltages are applied to some components with time during a certain operation of the semiconductor memory device of the modification of the sixth embodiment.

FIG. 65 shows how voltages are applied to some components with time during a certain operation of the semiconductor memory device 1 of the modification of the sixth embodiment. Specifically, FIG. 65 shows voltages that are applied during read of upper page data, of selected cell unit CU of selected block BLK.

As shown in FIG. 65, times t26, t91, t92, t93, t94, t95, t96, t97, t98, t99, t22, t23, t24 and t25 come in this order. From time t26 to time t99, the upper page data of the back side memory cell transistor MTbs is read. Times t26 to t95 are for CR, and times t95 to t22 are for AR.

The select gate lines SGDLt and SGSL are kept applied with voltage Vsg from time t26 to time t25. The unselected select gate lines SGDL are kept applied with voltage VSS during the operation shown in FIG. 65. Of the word lines WL, those excluding the selected word line WLas and the back side word line WLbs are kept applied with read pass voltage VREAD from time t26 to time t25.

From time t91 to time t95, CR voltages VC3, VC2, VC1 and VC0 are applied in descending order, unlike the order of the fifth embodiment. Details are as follows.

From time t91 to time t92, the sequencer 13 applies CR voltage VC3 to the selected word line WLas and applies the C cutoff voltage VCL to the back side word line WLbs. Strobe is performed between time t91 and time t92.

From time t92 to time t93, the sequencer 13 applies CR voltage VC2 to the selected word line WLas and applies the B cutoff voltage VBL to the back side word line WLbs. Strobe is performed between time t92 and time t93.

From time t93 to time t94, the sequencer 13 applies CR voltage VC1 to the selected word line WLas and applies the A cutoff voltage VAL to the back side word line WLbs. Strobe is performed between time t93 and time t94.

From time t94 to time t95, the sequencer 13 applies CR voltage VC0 to the selected word line WLas and applies the Er cutoff voltage VBBL to the back side word line WLbs. Strobe is performed between time t34 and time t95.

From time t95 to time t22, AR voltages VA3, VA2, VA1 and VA0 are applied in descending order, unlike the order of the fifth embodiment. Details are as follows.

From time t95 to time t96, the sequencer 13 applies AR voltage VA3 to the selected word line WLas and applies the read pass voltage VREAD to the back side word line WLbs.

From time t96 to time t97, the sequencer 13 applies AR voltage VA3 to the selected word line WLas continuously from time t96 and applies the C cutoff voltage VCL to the back side word line WLbs. Strobe is performed between time t96 and time t97.

From time t97 to time t98, the sequencer 13 applies AR voltage VA2 to the selected word line WLas and applies the B cutoff voltage VBL to the back side word line WLbs. Strobe is performed between time t97 and time t98.

From time t98 to time t99, the sequencer 13 applies AR voltage VA1 to the selected word line WLas and applies the A cutoff voltage VAL to the back side word line WLbs. Strobe is performed between time t98 and time t99.

From time t99 to time t22, the sequencer 13 applies AR voltage VA0 to the selected word line WLas and applies the Er cutoff voltage VBBL to the back side word line WLbs. Strobe is performed between time t99 and time t22.

Seventh Embodiment

The seventh embodiment differs from the first embodiment in terms of the structure of the memory cell array 10. In the description below, the differences from the first embodiment will be mainly described. The description given in connection with the first embodiment applies to the points that will not be described.

The configuration of the semiconductor memory device 1 of the seventh embodiment is the same as that of the first embodiment (FIGS. 1 to 9) except for the structure of the memory cell array 10.

Figure 66:
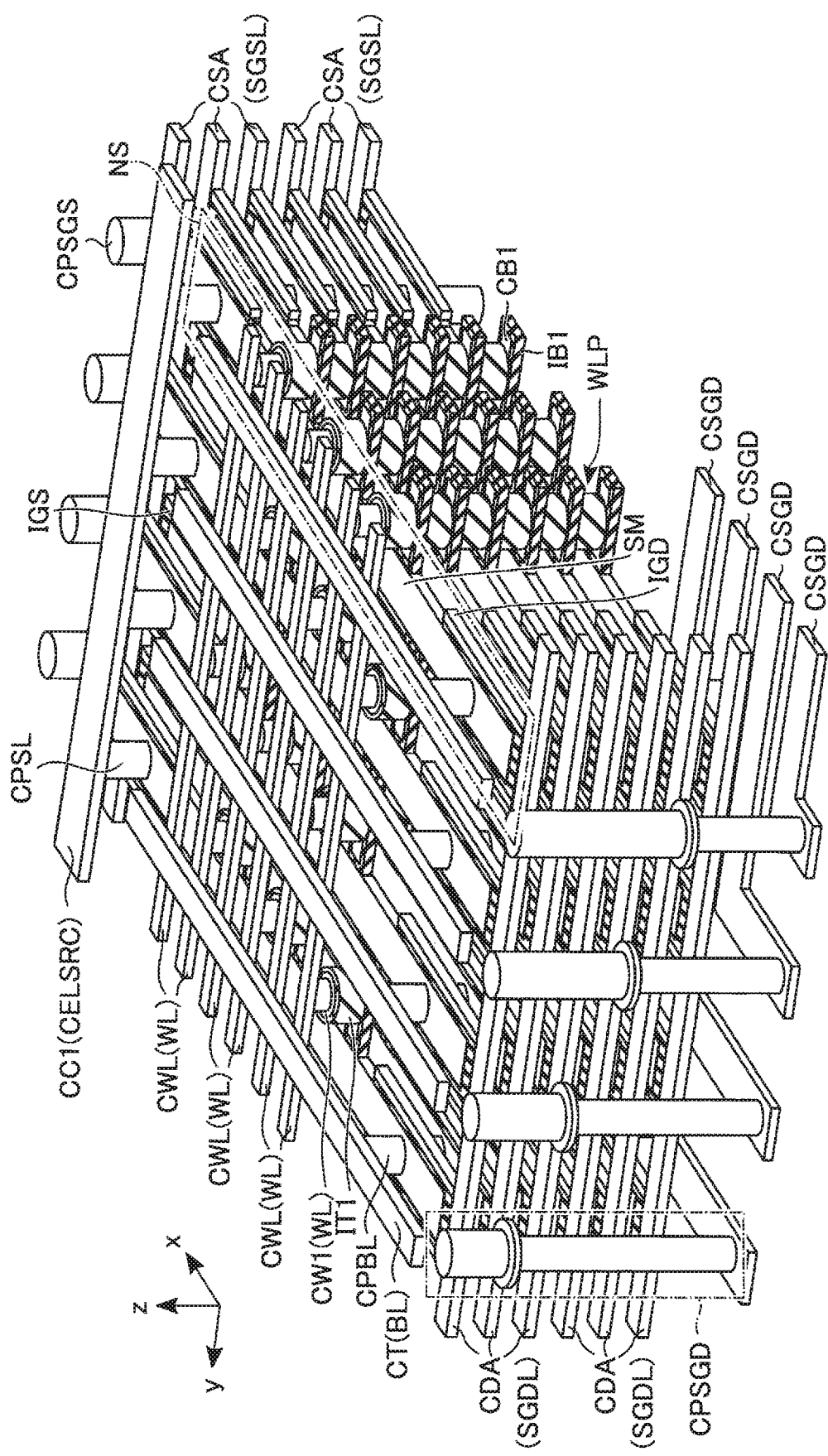
FIG. 66 is a perspective view of a structure of part of a semiconductor memory device of the seventh embodiment.

FIG. 66 is a perspective view of the structure of part of the semiconductor memory device 1 of the seventh embodiment. The structure shown in FIG. 66 is located above a substrate sub (not shown). The semiconductor memory device 1 includes a plurality of semiconductors SM, a plurality of word line pillars WLP, a plurality of conductors CW1, a plurality of conductors CDA, a plurality of conductors CSA, a plurality of contact plugs CPSGD, a plurality of contact plugs CPSGS, a plurality of conductors GSGD, a plurality of conductors GSGS (not shown), a plurality of contact plugs CPBL, a plurality of conductors CT, a plurality of contact plugs CPSL and a conductor CC1.

The semiconductors SM are along the z-axis above the substrate sub, extend along the x-axis, are located in respective layers apart from each other along the z-axis, and are aligned along the y-axis. Each, semiconductor SM functions as a channel region in which the channels of memory cell transistor MT and select gate transistors BT and ST are formed.

Each word line pillar WLP is located between two semiconductors SM aligned along the y-axis. The word line pillars WLP are aligned along the x axis between the two in each pair of semiconductors SM aligned along the y axis. Each word line pillar WLP extends along the z direction. Each word line pillar WLP includes a conductor CW1 and a tunnel insulator IT1. In each word line pillar WLP, the conductor CW1 extends along the z-axis, and the tunnel insulator IT1 covers the side surface of the conductor CW1. Each word line pillar WLP functions as one word line WL.

Above the word line pillars WLP aligned along the y-axis, a conductor CWL is provided along the word line pillars WLP. The conductors CWL are coupled to the upper surfaces of conductors CW1 of the respective word line pillars WLP via contact plugs. In each layer of semiconductor SM, a charge storage layer CB1 and a block insulator IB1 are provided on the side surface of each word line pillar WLP. The charge storage layer CB1 may be an insulator or a conductor.

Each word line pillar WLP functions as one memory cell transistor MT at the portion facing each semiconductor SM. Therefore, in the layer of each semiconductor SM, the plurality of memory cell transistors MT aligned along the x-axis are coupled in series via one semiconductor SM.

Each contact plug CPBL is provided on one side of the set of word line pillars WLP, for example, on the side with a smaller coordinate on the x-axis. Each contact plug CPBL penetrates all semiconductors SM arranged along the z-axis and is in contact with these semiconductors SM. The top surface of each contact plug CPBL is coupled to the bottom surface of conductor CT. The conductors CT extend along the x axis and are aligned along the y axis. Each conductor CT functions as one bit line BL.

Each contact plug CPSL is provided on the other side of the set of word line pillars WLP, for example, on the side with a larger coordinate on the x axis. Each contact plug CPSL penetrates all semiconductors SM arranged along the z-axis and is in contact with these semiconductors SM. The top surface of each contact plug CPSL is coupled to the bottom surface of the conductor CC1. Conductor CC1 extends along the y axis and functions as source line CELSRC.

One end of each semiconductor SM and the side surfaces of the portions penetrated by contact plug CPBL are covered with an insulator IGD. One conductor CDA is provided in each layer of semiconductor SM. Conductors CDA extend along the y-axis and are aligned along the z-axis. Each conductor CDA faces semiconductor SM in the same layer as conductor CDA via an insulator IGD. The conductor CDA further faces, via insulator IGD, two faces of semiconductors SM included in the same layer as the conductor CDA and arranged along the y axis. Each conductor CDA functions as one select gate line SGDL. The portion where each conductor CDA faces semiconductor SM functions as one select gate transistor DT.

Each conductor CDA is electrically coupled to the side surface of one contact plug CPSGD. Each contact plug CPSGD extends along the z-axis. Each contact plug CPSGD is coupled to one conductor CSGD on the bottom surface thereof.

The other end of each semiconductor SM and the side surfaces of the portions penetrated by contact plug CPSL are covered with an insulator IGS. One conductor CSA is provided in each layer of semiconductor SM. Conductors CSA extend along the y-axis and are aligned along the z-axis. Each conductor CSA faces semiconductor SM included in the same layer as conductor CSA via an insulator IGS. The conductor CSA further faces, via insulator IGS, two faces of semiconductors SM included in the same layer as the conductor CSA and arranged along the y axis. Each conductor CSA functions as one select gate line SGSL. The portion where each conductor CSA faces semiconductor SM functions as one select gate transistor ST.

Each conductor CSA is electrically coupled to the side surface of one contact plug CPSGS. Each contact plug CPSGS extends along the z-axis. Each contact plug CPSGS is coupled to one conductor CSGS (not shown) on the bottom surface thereof.

Based on the above structure, one NAND string NS is formed along the direction in which each semiconductor SM extends.

The regions other than those where the components shown in FIG. 66 are provided are provided with an insulator.

Figure 67:
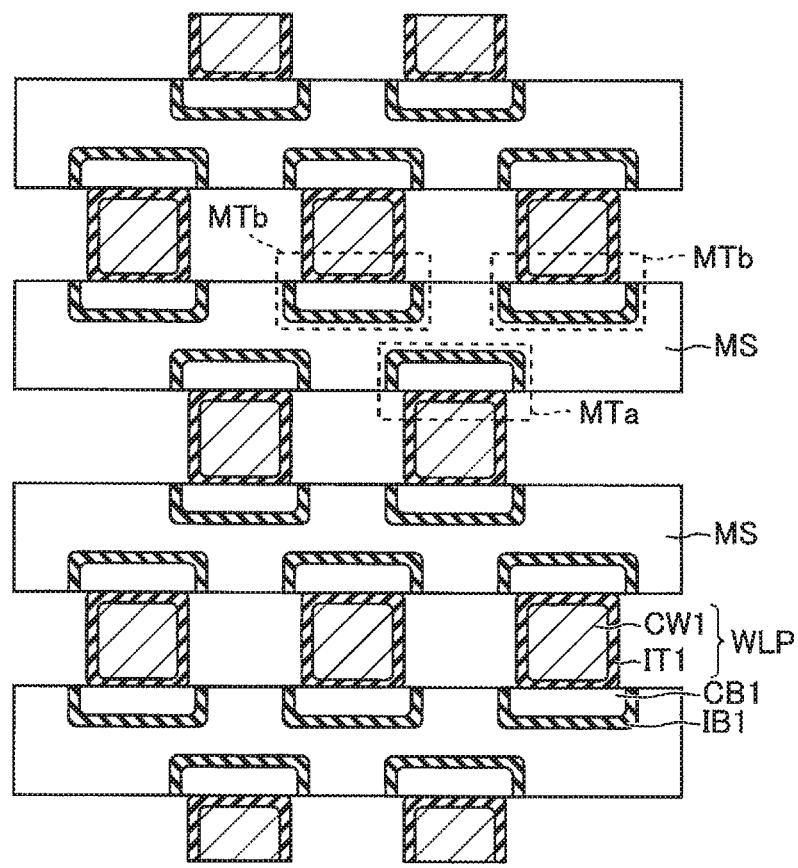
FIG. 67 shows how a structure of part of a semiconductor layer of the semiconductor memory device of the seventh embodiment is in the xy plane.

FIG. 67 shows how part of a layer including semiconductors MS is in the xy plane in the structure shown in FIG. 66. As shown in FIG. 67, in the structure of the seventh embodiment as well, one of two memory cell transistors MTa and MTb facing each other via part, of one semiconductor MS is the back side memory cell transistor MT of the other of the two. Based on this, the operation described in connection with the first embodiment can be applied to the data read that is performed from one of the memory cell transistors MTa and MTb facing each other via part of one semiconductor MS.

In the example shown in FIG. 67, none of the memory cell transistors MTa on one side of each semiconductor MS are aligned with the memory cell transistors MTb on the other side of the semiconductor SM along the y-axis. Based on this, each memory cell transistor MT has two back side memory cell transistors MT. FIG. 67 shows that a certain memory cell transistor MTa has two back side memory cell transistors MTb. Based on this, the operation described in connection with the first embodiment can be applied to both the two back side memory cell transistors MTb where data is read from one of the memory cell transistors MT (for example, memory cell transistor MTa). Furthermore, the operation described in connection with the first embodiment can be applied to one of the two back side memory cell transistors MTb where data is read from one of the memory cell transistors MTa.

The second to sixth embodiments axe applicable to the seventh embodiment.

Also, the first to sixth embodiments can be applied to the semiconductor memory device 1 having the structure of the seventh embodiment. According to the seventh embodiment, the same advantages as those obtained by the application of the first to sixth embodiments can be obtained.

8. Modification

The description given so far relates to an example in which one memory cell transistor MT stores 2-bit data. The embodiments are not limited to this example, and can be applied to a case in which one memory cell transistor MT stores data of 3 bits or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a semiconductor including a first portion and a second-portion;
   a first word line facing the first portion of the semiconductor;
   a second word line facing the second portion of the semiconductor, sandwiching the semiconductor with the first word line, and being separate from the first word line;
   a first cell transistor located in the first portion of the semiconductor and coupled to the first word line; and
   a second cell transistor located in the second portion of the semiconductor and coupled to the second word line, wherein
   in a first operation, a first read is executed in which data based on a threshold voltage of the second cell transistor is acquired while a first voltage is being applied to the first word, line and a second voltage higher than the first voltage is being applied to the second word line, and
   in a second operation, a second read is executed in which data based on a threshold voltage of the first cell transistor is acquired while a third voltage higher than the first voltage and lower than the second voltage is being applied to the second word line.

2. The device of claim 1, wherein
   in the first operation, a third read is executed in which data based on the threshold voltage of the second cell transistor is acquired while the first voltage is being applied to the first word line and a fourth voltage higher than the first voltage and different from the second voltage is being applied to the second word line, and
   in the second operation, a fourth read is executed in which data based on the threshold voltage of the first cell transistor is acquired while a fifth voltage higher than the first voltage and lower than the fourth voltage is being applied to the second word line.

3. The device of claim 2, wherein
   the second voltage is lower than the fourth voltage and the fifth voltage,
   in the first operation, a fifth read is executed in which data, based on the threshold voltage of the second cell transistor is acquired while the first voltage is being applied to the first word line and a sixth voltage higher than the fourth voltage is being applied to the second word line, and in the second operation, a sixth read is executed in which data based on the threshold voltage of the first cell transistor is acquired while a seventh voltage higher than the fourth voltage and lower than the sixth voltage is being applied to the second word line.

4. The device of claim 3, wherein
one of the second voltage, the fourth voltage and the sixth voltage is applied to the first word line in the second read, the fourth read, and the sixth read.

5. The device of claim 3, wherein
in the second operation, the fourth read is executed after the sixth read, and the second read is executed after the fourth read.

6. The device of claim 3, wherein
in the first operation, the third read is executed after the first read, and the fifth read is executed after the third read.

7. The device of claim 3, wherein
in the first operation, the third read is executed after the fifth read, and the first read is executed after the third read.

8. The device of claim 3, wherein
the seventh voltage is applied to the first word line during the second read,
an eighth voltage different from the seventh voltage is applied to the first word line during the fourth read, and
a ninth voltage different, from the seventh voltage and the eighth voltage is applied to the first word line during the sixth read.

9. The device of claim 3, wherein
in the second operation, a seventh read is executed in which data based on the threshold voltage of the first cell transistor is acquired, while an eighth voltage lower than the first voltage is being applied to the second word line.

10. The device of claim 9, wherein
the first voltage is a negative voltage.

11. The device of claim 1, wherein
the second operation is executed subsequently to the first operation.

12. The device of claim 1, wherein
the first operation is executed subsequently to the second operation.

13. The device of claim 1, wherein
the semiconductor further includes a third portion,
the device further comprises:
a third word line facing the third portion of the semiconductor, sandwiching the semiconductor with the first word line, and being separate from the first word line and the second word line; and
a third cell transistor located in the third portion of the semiconductor and coupled to the third word line,
in the second operation, data based on the threshold voltage of the first cell transistor is acquired while the third voltage is being applied to the first word line and the third word line.

14. A semiconductor memory device comprising:
a semiconductor including a first portion and a second portion;
a first word line facing the first portion of the semiconductor;

a second word line facing the second portion of the semiconductor, sandwiching the semiconductor with the first word line, and being separate from the first word line;
a first cell transistor located in the first portion of the semiconductor and coupled to the first word line;
a second cell transistor located in the second portion of the semiconductor and coupled to the second word line;
a bit line electrically coupled to the first cell transistor and the second cell transistor; and
a sense amplifier including a first node electrically coupled to the bit line, and acquiring data based on a potential on the first node when receiving a first signal of a first logical level,
wherein
in a first operation, the sense amplifier receives the first signal of the first logical level while a first voltage is being applied to the first word line and a second voltage higher than the first voltage is being applied to the second word line, and
in a second operation, the sense amplifier receives the first signal of the first logical level while a third voltage higher than the first voltage and lower than the second voltage is being applied to the second word line.

15. The device of claim 14, wherein
in the first operation, the sense amplifier receives the first signal of the first logical level while the first voltage is being applied to the first word line and a fourth voltage higher than the first voltage and different from the second voltage is being applied to the second word line, and
in the second operation, the sense amplifier receives the first signal of the first logical level while a fifth voltage higher than the first voltage and lower than the fourth voltage is being applied to the second word line.

16. The device of claim 15, wherein
the second voltage is lower than the fourth voltage and the fifth voltage,
in the first operation, the sense amplifier receives the first signal of the first logical level while the first voltage is being applied to the first word line and a sixth voltage higher than the fourth voltage is being applied to the second word line, and
in the second operation, the sense amplifier receives the first signal of the first logical level while a seventh voltage higher than the fourth voltage and lower than the sixth voltage is being applied to the second word line.

17. The device of claim 16, wherein
the application of the third voltage, the application of the fifth voltage, and the application of the seventh voltage are executed while one of the second voltage, the fourth voltage and the sixth voltage is being applied to the first word line.

18. The device of claim 16, wherein
the application of the fifth voltage is executed after the application of the seventh voltage, and
the application of the third voltage is executed after the application of the fifth voltage.

19. The device of claim 16, wherein
the application of the fourth voltage is executed after the application of the second voltage, and
the application of the sixth voltage is executed after the application of the fourth voltage.

20. The device of claim 16, wherein
the application of the fourth voltage is executed after the application of the sixth voltage, and the application, of the second voltage is executed after the application of the fourth voltage.

\* \* \* \* \*